(12) United States Patent
Shinbori et al.

(10) Patent No.: US 8,129,780 B2
(45) Date of Patent: Mar. 6, 2012

(54) SEMICONDUCTOR DEVICE HAVING A TRENCH TYPE HIGH-POWER MISFET

(75) Inventors: Atsushi Shinbori, Tokyo (JP); Yoshito Nakazawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 502 days.

(21) Appl. No.: 12/277,480

(22) Filed: Nov. 25, 2008

(65) Prior Publication Data

US 2009/0189219 A1 Jul. 30, 2009

(30) Foreign Application Priority Data

Jan. 30, 2008 (JP) .................................. 2008-019156

(51) Int. Cl.
*H01L 29/66* (2006.01)
(52) U.S. Cl. .................. 257/334; 257/311; 257/E21.41; 257/E29.262
(58) Field of Classification Search .................. 257/311, 257/E21.41, E29.262, 334
See application file for complete search history.

(56) References Cited

U.S. PATENT DOCUMENTS

| 5,097,302 A | 3/1992 | Fujihira et al. |
| 2005/0230745 A1* | 10/2005 | Fatemizadeh et al. ........ 257/330 |
| 2006/0261391 A1* | 11/2006 | Nakazawa et al. ............ 257/296 |

FOREIGN PATENT DOCUMENTS

| JP | 3-270274 | 12/1991 |
| JP | 11-345965 | 12/1999 |
| JP | 2006-93459 | 4/2006 |

* cited by examiner

*Primary Examiner* — Wael Fahmy
*Assistant Examiner* — John C Ingham
(74) *Attorney, Agent, or Firm* — Mattingly & Malur, PC

(57) ABSTRACT

The present invention provides a technique capable of attaining an improvement in current detection accuracy in a trench gate type power MISFET equipped with a current detection circuit. Inactive cells are disposed so as to surround the periphery of a sense cell. That is, the inactive cell is provided between the sense cell and an active cell. All of the sense cell, active cell and inactive cells are respectively formed of a trench gate type power MISFET equipped with a dummy gate electrode. At this time, the depth of each trench extends through a channel forming region and is formed up to the deep inside (the neighborhood of a boundary with a semiconductor substrate) of an n-type epitaxial layer. Further, a p-type semiconductor region is provided at a lower portion of each trench. The p-type semiconductor region is formed so as to contact the semiconductor substrate.

10 Claims, 42 Drawing Sheets

SEMICONDUCTOR DEVICE HAVING A TRENCH TYPE HIGH-POWER MISFET

CROSS-REFERENCE TO RELATED APPLICATIONS

The disclosure of Japanese Patent Application No. 2008-19156 filed on Jan. 30, 2008 including the specification, drawings and abstract is incorporated herein by reference in its entirety.

BACKGROUND OF THE INVENTION

The present invention relates to a semiconductor device and its manufacturing technology, and particularly to a technique effective if applied to a semiconductor device having a power MISFET (Metal Insulator Semiconductor Field Effect Transistor).

A technique for causing a sense cell to divert a load current flowing through a power MISFET and detecting the load current flowing through the power MISFET by utilizing a voltage drop developed across a sense resistor coupled to the sense cell has been described in Japanese Unexamined Patent Publication No. He 3(1991)-270274 (patent document 1). Described specifically, since an insulating film of a portion interposed between a gate insulating film of a power MISFET (main unit element) and a gate insulating film of a sense cell (sense or detection unit element) is formed thick, the density of each electrical charge accumulated in the surface of a semiconductor substrate located below the thick insulating film can be reduced as compared with the case in which an insulating film of the same thickness as the mutual gate insulating films is formed without forming the thick insulating film. As a result, the value of an accumulation layer resistor becomes large. Accordingly, the conduction between source layers at the power MISFET and the sense cell adjacent to each other can be ignored in an ON state of the power MISFET, and leak current can be reduced. That is, the leak current flowing via the accumulation layer resistor can be reduced. With the reduction in the leak current, the majority of current obtained by diverting the load current flows in a sense resistor pre-coupled between a source electrode of the power MISFET and a source region (sense electrode) of the sense cell as a sensed current. Namely, the accumulation layer resistor considered to be coupled in parallel to the sense resistor is increased, thereby making it possible to reduce the current flowing through the accumulation layer resistor and cause the majority of current to flow through the sense resistor. Thus, the sensed current becomes current proportional to the ratio between the number of cells in the power MISFET and the number of sense cells, and an error in the detection of the load current can be reduced.

A technique for reducing the dependence of an on-resistance ratio (current mirror ratio) on a gate voltage and a channel temperature thereby to enhance current detection accuracy in a semiconductor device equipped with a current detection or sense terminal has been described in Japanese Unexamined Patent Publication No. Hei 11(1999)-345965 (patent document 2). Described specifically, a first semiconductor element and a second semiconductor element that share a drain terminal are formed within the same semiconductor substrate. The source of the first semiconductor element is used as a source terminal and the source of the second semiconductor element is used as a mirror terminal for current detection. At this time, a source diffusion layer formed in a cell for the second semiconductor element is formed only at a portion where it is mutually opposed to a source diffusion layer of an adjoining cell. Alternatively, each cell unformed with some or all of the source diffusion layer is formed in a location other than the outermost peripheral cell of the first semiconductor element. Or a resistor comprised of a semiconductor is coupled between the source of the second semiconductor element and the mirror terminal. With the provision of such a configuration, on-resistance component configurations of the first and second semiconductor elements approach each other, and the dependence of the on-resistance ratio (current mirror ratio) on the gate voltage and the channel temperature can be reduced.

A technique for providing a trench gate type semiconductor device that is equipped with a high-precision current sense function and has achieved an increase in breakdown voltage, has been described in Japanese Unexamined Patent Publication No. 2006-93459 (patent document 3). Described specifically, the semiconductor device is equipped with a main cell and a sense cell. The main cell and the sense cell are separated from each other by each separation area. The main cell and the sense cell that configure the semiconductor device take such a structure that the breakdown voltage is supported by a PN junction based on a P floating region and an N⁻ drift region formed in a lower portion of each gate trench with a gate electrode embedded therein in addition to a PN junction based on an N⁻ drift region and a P⁻ body region formed in a semiconductor substrate. A breakdown voltage holding structure equivalent to the main cell and the sense cell has been adopted even in the separation area. Described specifically, a gate trench with a gate electrode built therein is formed even in its corresponding separation area, and a P floating region is formed in a lower portion of the gate trench. Thus, the separation area is also brought to the structure equivalent to the main and sense cells, thereby making it possible to suppress a reduction in the breakdown voltage. Further, providing each gate trench and the P floating region formed in the lower portion of the gate trench in the separation area makes it possible to suppress current flowing into the sense cell. Thus, according to this technique, a trench gate type semiconductor device can be realized which is equipped with a high-precision current sense function and has achieved an increase in breakdown voltage.

SUMMARY OF THE INVENTION

A transistor for high-power application, which can treat a power of a few watts or more is called "power MISFET (Field Effect Transistor). Ones having various structures have been examined. Of these, there are known ones referred to as so-called vertical and horizontal types as power MISFETs. Further, they are classified into structures like a trench (groove) gate type and a planar gate type according to the structure of a gate portion. A structure in which, for example, MISFETs of micro patterns are coupled in parallel in large numbers (in the form of several tens of thousands) has been adopted in such a power MISFET to obtain large power.

A planar type power MISFET has generally been used for the power MISFET. The planar type power MISFET is one that takes a structure in which a gate electrode is formed over a main surface of a semiconductor substrate. Since it is however difficult to reduce a cell size in the planar type power MISFET, there was a limit to a reduction in on resistance. Thus, examinations for adopting a trench type power MISFET in place of the planar type power MISFET thereby to shrink each cell and reducing on resistance as compared with the planar type power MISFET have been conducted.

The trench gate type power MISFET has a structure in which a gate electrode is embedded in each trench dug in a main surface of a semiconductor substrate via a gate insulating film. A source region is provided at a surface layer portion of the main surface of the semiconductor substrate, whereas a drain region is provided at a back surface of the semiconductor substrate, which is located on the side opposite to its main surface. A channel is formed in a semiconductor region opposite to the side surface of the gate electrode lying between the source region and the drain region and provided within each trench. Thus, current flows between the source region and the drain region via the channel interposed therebetween. That is, the current flows in the vertical direction (the direction of thickness of the semiconductor substrate) in the trench gate type power MISFET.

Since the gate electrode is formed in each trench, the area of the gate electrode occupied in the semiconductor substrate (plane surface) can be reduced in the trench gate type power MISFET configured in this way, as compared with the planar type power MISFET in which the gate electrode is formed over the main plane surface of the semiconductor substrate. That is, the trench gate type power MISFET brings about an advantage in that since it has the structure easy to make cell's densification, the on resistance can be reduced as compared with the planar type power MISFET by bringing each cell into densification.

Thus, although the trench gate type power MISFET having the advantage that the on resistance can be reduced has been greatly used as the power MISFET, both the trench gate type power MISFET and the planar type power MISFET remain unchanged as the power MISFET which treats large current. That is, there is no difference about the fact that it is necessary to pay close attention to the semiconductor device using the power MISFET because the large current is handled. When, for example, an overcurrent of a rated value or more flows in the semiconductor device using the power MISFET, there is a fear that a load circuit (element) coupled to the power MISFET and the power MISFET (element) per se are destroyed. Therefore, the semiconductor device using the power MISFET is provided with the function for preventing the destruction of each element due to the overcurrent.

As a concrete example of a current detection or sense function, there is known one in which part of a load current flowing through a power MISFET (main cell) is diverted and detected by a sense cell (having a structure similar to the main cell), and the sensed current is detected as a voltage drop developed across a sense resistor coupled to the sense cell. A circuit example for implementing this current sense function will be explained with reference to the drawing.

FIG. 1 is a circuit diagram showing a power MISFET equipped with a typical current sense or detection circuit. In FIG. 1, a load L is coupled to a power supply PS and a power MISFETPM for driving the load L is coupled to the load L. The power MISFETPM comprises a sense cell $Q_{SE}$ (MISFET) and a main cell $Q_0$ (MISFET) which are given as m:n in the number-of-cells (unit structure) ratio and coupled in parallel. That is, although one sense cell $Q_{SE}$ and one main cell $Q_0$ are shown so as to be coupled in parallel in FIG. 1, a plurality of cells are actually coupled in parallel as the sense cell $Q_{SE}$ and the main cell $Q_0$, and the number thereof is given as sense cells $Q_{SE}$/main cells $Q_0$=m/n. A drain region of the sense cell $Q_{SE}$ and a drain region of the main cell $Q_0$ are electrically coupled and coupled to a common drain terminal D. Likewise, a gate electrode of the sense cell $Q_{SE}$ and a gate electrode of the main cell $Q_0$ are electrically coupled and coupled to a common gate terminal G. Further, a source region of the main cell $Q_0$ is coupled to a source terminal S, and a source region of the sense cell $Q_{SE}$ is coupled to a sense terminal SENSE. The source terminal S and the sense terminal SENSE are electrically coupled to each other via a sense resistor $R_{SE}$.

The operation of the power MISFET equipped with the current detection or sense circuit configured in this way will next be explained. When a sufficient positive voltage is applied to the gate terminal G of the power MISFETPM, the main and sense cells $Q_0$ and $Q_{SE}$ are turned ON. Namely, a current $I_0$ flows between the drain terminal D and the source terminal S (sense cell $Q_{SE}$), and a current $I_{SE}$ flows between the drain terminal D and the sense terminal SENSE (sense cell $Q_{SE}$). Since, at this time, the ratio between the current $I_0$ flowing through each of the main cells $Q_0$ and the current $I_{SE}$ flowing through each of the sense cells $Q_{SE}$ is expected to be equal to the ratio (n:m) between the number of the main cells $Q_0$ and the number of the sense cell $Q_{SE}$, $I_{SE}=m/n \cdot I_0$.

When the sense resistor $R_{SE}$ is selected to a sufficient small value here, a sense voltage $V_{SE}$ becomes $V_{SE}=R_{SE} \cdot I_{SE}=R_{SE} \cdot m/n \cdot I_0$ according to the Ohm law. Thus, the current that flows through the main sense cell $Q_0$ becomes $I_0=nV_{SE}/mR_{SE}$. If the sense voltage $V_{SE}$ applied across the sense resistor $R_{SE}$ is measured from this point of view, then the current $I_0$ that flows through the main cell $Q_0$ can be recognized or found out because other coefficients are already known.

Consequently, when the current $I_0$ that flows through the main cell $Q_0$ exceeds the rated value, the power MISFET is controlled so as to be forcedly turned OFF, thereby making it possible to prevent each element from being destroyed due to the overcurrent. Since the current $I_0$ that flows through the main cell $Q_0$ is proportional to the sense voltage $V_{SE}$ as described above, for example, the sense voltage $V_{SE}$ is monitored. When the sense voltage $V_{SE}$ is made larger than a predetermined voltage value, it can be determined that the current $I_0$ that flows through the main cell $Q_0$ exceeds the rated value. That is, the threshold value is set to the sense voltage $V_{SE}$, and a control circuit turns OFF the power MISFETPM forcedly when the sense voltage $V_{SE}$ exceeds the set threshold value, whereby the destruction of each element due to the overcurrent can be prevented.

A precondition for such a current detection or sense circuit resides in that the ratio between the current $I_0$ that flows through each of the main cells $Q_0$ and the current $I_{SE}$ that flows through each of the sense cells $Q_{SE}$ is equal to the ratio (n:m) between the number of the main cells $Q_0$ and the number of the sense cells $Q_{SE}$. If this relation is established, then the current $I_0$ that flows through the main cell $Q_0$ can be detected with high precision. It cannot however be said that this precondition is established strictly in practice. An error occurs between the current $I_0$ estimated by the current sense circuit and the current that flows through the main cell $Q_0$ actually.

For example, the current that flows through the sense cell $Q_{SE}$ is all outputted form the sense terminal SENSE and does not flow into the source terminal S via the sense resistor $R_{SE}$. That is, when the current flowing through the sense cell $Q_{SE}$ is considered to be all outputted from the sense terminal SENSE, the above precondition can be reckoned as being established and the current $I_0$ flowing through the main cell $Q_0$ can be detected with high precision. When, however, actually, the main cell $Q_0$ and the sense cell $Q_{SE}$ are respectively comprised of a trench gate type power MISFET and each trench with the gate electrode embedded therein is further shallow, a leak current flows in a horizontal direction (lateral direction, i.e., direction that intersects with the direction of thickness of the semiconductor substrate) between the main and sense cells $Q_0$ and $Q_{SE}$ adjacent to each other while passing under each trench. That is, a leak current Ir that flows between the main and sense cells $Q_O$ and $Q_{SE}$ exists inside the power MISFET as shown in FIG. 1 without flowing through the sense resistor $R_{SE}$ provided outside the power MISFET.

When such a leak current Ir exists, only partial current flowing through the sense cell $Q_{SE}$ flows through the sense resistor $R_{SE}$. Therefore, the sense voltage $V_{SE}$ does not actually reach a voltage value corresponding to the current $I_0$ flowing through the main cell $Q_0$. The sense voltage $V_{SE}$ becomes lower than the voltage value corresponding to the current $I_0$. As a result, even though the current $I_0$ flowing through the main cell $Q_0$ is actually in a state of exceeding the rated value, there's the potential of current estimated from the voltage value of the sense voltage $V_{SE}$ being not beyond the rated value. Since the forced turning OFF of the power MISFET by the control circuit is not carried out in this case, there is a possibility that the load circuit coupled to the power MISFET or the power MISFET per se will be destroyed. From the above respect, the current detection circuit needs to detect the current $I_0$ flowing through the main cell $Q_0$ with high precision.

An object of the present invention is to provide a technique capable of achieving an improvement in current detection accuracy in a trench gate type power MISFET equipped with a current sense or detection circuit.

The above and other objects and novel features of the present invention will become apparent from the description of the present specification and the accompanying drawings.

Summaries of representative ones of the inventions disclosed in the present application will be explained in brief as follows:

A semiconductor device according to a typical embodiment comprises (a) an active cell which causes a load current to flow therethrough, (b) a sense cell which detects a magnitude of the load current flowing through the active cell, and (c) an inactive cell which separates the active cell and the sense cell from each other. At this time, each of the active cell, the sense cell and the inactive cell includes (d1) a first semiconductor region of a first conduction type formed over a first surface of a semiconductor substrate corresponding to the first conduction type, and (d2) a second semiconductor region of a second conduction type corresponding to a conduction type opposite to the first conduction type, which is formed over the first semiconductor region. Further, each of them includes (d3) a trench which penetrates the second semiconductor region to reach the first semiconductor region and is formed so as not to reach the semiconductor substrate, (d4) a first insulating film formed in parts of a bottom face of the trench and a side surface thereof, and (d5) a dummy gate electrode formed inside the trench via the first insulating film. Each of them includes (d6) a second insulating film formed so as to cover an upper portion of the dummy gate electrode, (d7) a gate electrode provided over the second insulating film and formed inside the trench, and (d8) a gate insulating film formed between the side surface of the trench and the gate electrode. Further, each of them includes (d9) a drain region comprising the semiconductor substrate corresponding to the first conduction type. Here, (d10) each of the active cell and the sense cell further has a source region formed in alignment with the trench and comprising a semiconductor region of the first conduction type formed over the second semiconductor region, whereas the inactive cell does not include the source region.

According to the typical embodiment configured in this way, the inactive cell is provided between the active cell and the sense cell. Each of the trenches is formed in the inactive cell, and the dummy gate electrode and the gate electrode are formed inside the trench. Thus, since the depth of the trench is made deep as compared with the case in which the gate electrode is formed inside each trench, leak current in a horizontal direction (lateral direction) flowing from the sense cell to the active cell while passing under the lower side of each trench can be reduced. It is thus possible to improve current detection accuracy of a current sense or detection circuit.

A method for manufacturing a semiconductor device according to a typical embodiment is provided wherein an active cell which causes a load current to flow therethrough, a sense cell which detects a magnitude of the load current flowing through the active cell, and an inactive cell which separates the active cell and the sense cell from each other, are formed in a semiconductor substrate. The method comprising the steps of (a) forming a first semiconductor region of a first conduction type over a first surface of the semiconductor substrate corresponding to the first conduction type, (b) forming a trench having a depth unextended to the semiconductor substrate in the first semiconductor region, and (c) forming a third semiconductor region of a second conduction type corresponding to a conduction type opposite to the first conduction type in a lower portion of the trench. Further, the method includes the steps of (d) forming a first insulating film over a bottom face of the trench and a side surface thereof, (e) forming a dummy gate electrode inside the trench via the first insulating film, and (f) eliminating part of the first insulating film formed over the side surface of the trench. The method includes the steps of (g) forming a second insulating film over the dummy gate electrode and eliminating part of the first insulating film thereby to form a gate insulating film in the side surface of the trench exposed, and (h) forming a gate electrode over the dummy gate electrode via the second insulating film interposed therebetween and inside the trench. Further, the method comprises the step of (i) introducing an impurity of the second conduction type within the first semiconductor region thereby to form a second semiconductor region. Here, after the (i) step, a source region comprising a semiconductor region of the first conduction type is formed in a region lying within the second semiconductor region and aligned with the trench in each of an active cell forming area for forming the active cell and a sense cell forming area for forming the sense cell, and the source region is not formed in an inactive cell forming area for forming the inactive cell.

An advantageous effect obtained by a typical one of the inventions disclosed in the present application will be explained in brief as follows:

A trench gate type power MISFET equipped with a current detection circuit is capable of achieving an improvement in current detection accuracy.

The present invention can widely be used in the manufacturing industry that manufactures a semiconductor device.

DETAILED DESCRIPTION OF THE PREFFERED EMBODIMENTS

Figure 1:
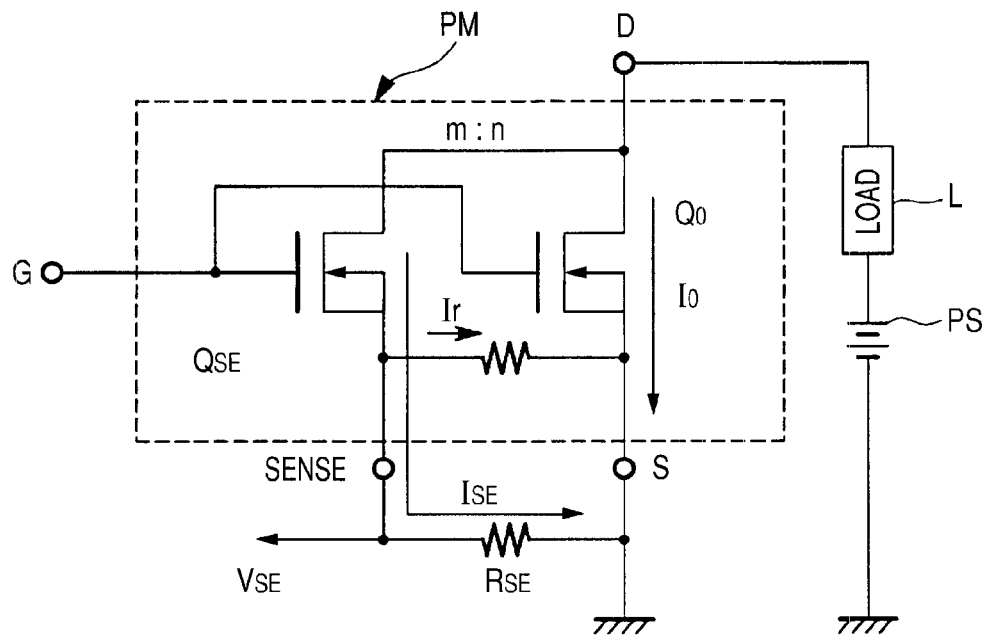
FIG. 1 is a circuit diagram showing a power MISFET having a typical current detection circuit.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

The same reference numerals are respectively attached to the same components or members in all the drawings for describing the embodiments in principle, and their repetitive explanations will be omitted. Incidentally, some hatching might be provided to make it easy to view the drawings even in the case of plan views.

First Embodiment

When overcurrent of a rated value or more flows in a semiconductor device using a power MISFET, there is a fear that a load circuit (element) coupled to the power MISFET or the power MISFET itself (element) is destroyed. Therefore, the semiconductor device using the power MISFET is provided with a function for preventing the breakdown of each element due to the overcurrent. An example of a circuit for preventing the breakdown of each element due to the overcurrent will be explained.

Figure 2:
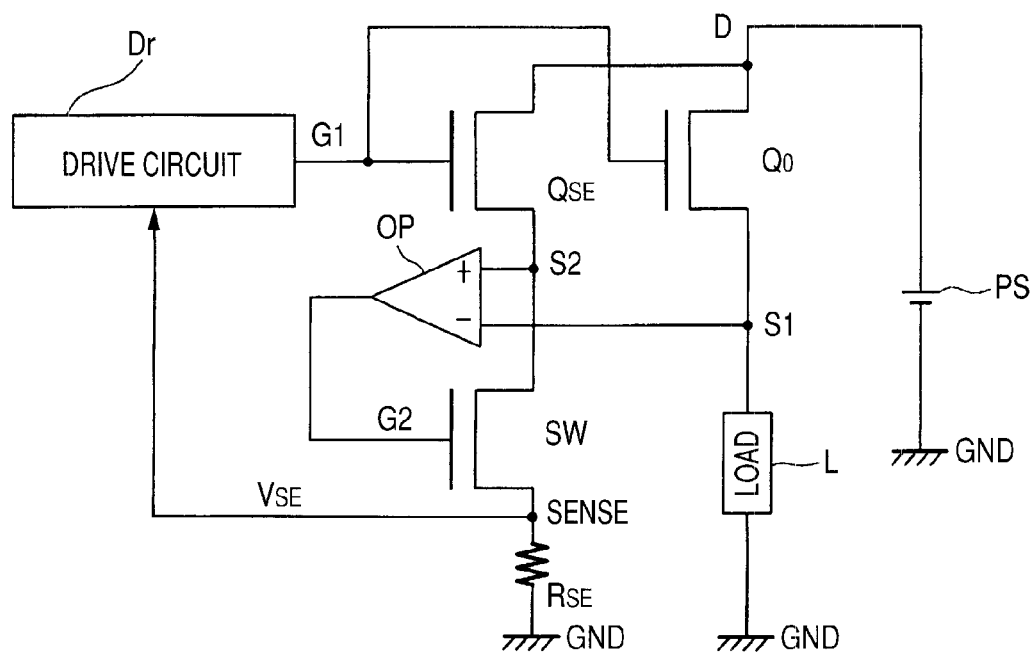
FIG. 2 is a circuit diagram illustrating a circuit for driving a load using a power MISFET equipped with a current detection circuit.

FIG. 2 is a circuit diagram showing a circuit for driving a load using a power MISFET having a current sensing or detection circuit. In FIG. 2, a drain terminal D of a main cell (power MISFET) $Q_0$ is coupled to a power supply PS. A load L is coupled between a source terminal S1 of the main cell $Q_0$ and GND. The drain terminal D of the main cell $Q_0$ is used in common with a drain terminal D of a sense cell (power MISFET) $Q_{SE}$. Further, a gate terminal G1 of the main cell $Q_0$ and a gate terminal G1 of the sense cell $Q_{SE}$ are shared with each other. The gate terminals G1 are coupled to a drive circuit Dr and serve so as to control ON/OFF of the main cell $Q_0$ and the sense cell $Q_{SE}$ by controlling a voltage applied to their gate electrodes by means of the drive circuit Dr. A switch SW comprised of an MISFET is coupled between a source terminal S2 of the sense cell $Q_{SE}$ and a sense terminal SENSE, and a sense resistor $R_{SE}$ is provided between the sense terminal SENSE and GND. Further, there is provided an operational amplifier OP in which the source terminal S2 of the sense cell $Q_{SE}$ is used as a non-inversion input and the source terminal S1 of the main cell $Q_0$ is used as an inversion input. The output of the operational amplifier OP is coupled to a gate terminal G2 of the switch SW.

The operation of the present circuit will next be explained. A description will be made of the operation thereof at which the load L is in a short-free normal state. A predetermined voltage is applied to the gate terminal G1 by the drive circuit Dr. In doing so, the main cell $Q_0$ is turned ON so that current flows from the power supply PS to the load L via the main cell $Q_0$. The load L can be driven in this way. While the main cell $Q_0$ is turned ON by application of the predetermined voltage to the gate terminal G1 by the drive circuit Dr, the sense cell $Q_{SE}$ is also turned ON because the gate electrode of the sense cell $Q_{SE}$ is also connected to the gate terminal G1. Thus, the source terminal S2 of the sense cell $Q_{SE}$ is made conductive to the drain terminal D of the sense cell $Q_{SE}$ and thereby brought to a power supply or source potential (on resistance of the sense cell $Q_{SE}$ is ignored). On the other hand, since the main cell $Q_0$ is also turned ON, the source terminal S1 of the main cell $Q_0$ is also made conductive to the drain terminal D and thereby brought to the power supply potential (on resistance of the main cell $Q_0$ is ignored). Therefore, the power supply potential is inputted to both the non-inversion input and the inversion input of the operational amplifier OP. Although the difference between the non-inversion input and the inversion input is amplified by the operational amplifier OP and outputted therefrom, the output from the operational amplifier OP becomes small because there is no difference between the non-inversion input and the inversion input. Thus, such a voltage as to turn ON the switch SW is not applied to the gate terminal G2 o the switch SW, which is coupled to the output of the operational amplifier OP. That is, the switch SW remained OFF. Since no current flows through the sense resistor $R_{SE}$ from this point, a sense voltage $V_{SE}$ outputted from the sense terminal SENSE becomes a GND potential. The sense voltage $V_{SE}$ is inputted to the drive circuit Dr. Since the sense voltage $V_{SE}$ inputted to the drive circuit is of the GND potential and smaller than a predetermined value (threshold value) in the drive circuit, the drive circuit controls the main cell $Q_0$ in such a manner that the main cell $Q_0$ is held in an ON state. It is possible to cause current to continue to flow through the load L in this way and thereby drive the load L.

A description will subsequently be made of where the load L is short-circuited. When the main cell $Q_0$ is brought to an ON state in a state in which the load L is being short-circuited, large current flows through the main cell $Q_0$ and the load L, so that the main cell $Q_0$ and the load L are destroyed. Therefore, the circuit shown in FIG. 2 is operated so as to turn OFF the main cell $Q_0$ where the load L is short-circuited. This operation will be explained. When load L is short-circuited in a state in which the main cell $Q_0$ is turned ON, the source terminal S1 of the main cell $Q_0$ reaches from the power supply potential to the GND potential. On the other hand, since the sense cell $Q_{SE}$ is not coupled to the load L while the sense cell $Q_{SE}$ is also turned ON, the source terminal S2 of the sense cell $Q_{SE}$ is brought to the power supply potential corresponding to the same potential as the drain terminal D thereof. Thus, the power supply potential is inputted to the non-inversion input of the operational amplifier OP and the GND potential is inputted to the inversion input. Thus, since a large voltage corresponding to the difference between the power supply potential and the GND potential is inputted between the non-inversion and inversion inputs of the operational amplifier OP, the voltage enough to turn ON the switch SW is outputted from the operational amplifier OP. When the switch SW is turned ON in this way, the sense terminal SENSE and the source terminalS2 of the sense cell QSE are brought into conduction, so that the potential of the sense terminal SENSE reaches the power supply potential. Therefore, the sense current flows through the sense resistor $R_{SE}$ provided between the sense terminal SENSE and GND. At this time, the sense voltage $V_{SE}$ outputted from the sense terminal SENSE becomes the power supply potential. This sense voltage $V_{SE}$ is inputted to the drive circuit Dr. Since the inputted sense voltage $V_{SE}$ is of the power supply potential and larger than the predetermined value (threshold value), the drive circuit controls the main cell $Q_0$ such that the main cell $Q_0$ is brought to an OFF state. Since the main cell $Q_0$ can be turned OFF where the load L is short-circuited in this way, the breakdown of the main cell $Q_0$ and the load L can be prevented.

Now considering the on resistances of the sense cell $Q_{SE}$ and the switch SW, the sense voltage $V_{SE}$ outputted from the sense terminal SNESE is smaller than the power supply potential and defined by the product of the sense resistor $R_{SE}$ and the current flowing through the sense resistor $R_{SE}$. If, at this time, the current flowing through the sense cell $Q_{SE}$ flows through the sense resistor $R_{SE}$ all, then the sense voltage $V_{SE}$ outputted from the sense terminal SENSE also becomes a proper one. That is, the ratio between the current flowing through the main cell $Q_0$ and the current flowing through the sense cell $Q_{SE}$ is expected to be equal to the ratio in number between the main cell $Q_0$ and the sense cell $Q_{SE}$. Therefore, if the current flowing through the sense cell $Q_{SE}$ flows through the sense resistor $R_{SE}$ all, then the current flowing through the main bell $Q_0$ can be detected with satisfactory accuracy by measuring the sense voltage $V_{SE}$ corresponding to a voltage drop developed across the sense resistor $R_{SE}$. Namely, if the current flowing through the sense cell $Q_{SE}$ flows through the sense resistor $R_{SE}$ all, then the current flowing through the sense cell $Q_{SE}$ can be calculated by the sense voltage $V_{SE}$ and the sense resistor $R_{SE}$. Further, if the current flowing through the sense cell $Q_{SE}$ is known, it is then possible to estimate the current flowing through the main cell $Q_0$ with satisfactory accuracy from the ratio in number between the main cell $Q_0$ and the sense cell $Q_{SE}$.

While the ON/OFF of the main cell $Q_0$ is controlled by comparison of the inputted sense voltage $V_{SE}$ with the threshold value in the drive circuit Dr, the threshold value is derived assuming that the current flowing through the sense cell $Q_{SE}$ flows through the sense resistor $R_{SE}$ all. Namely, the threshold voltage is based on the premise that when a current of a rated value or so flows through the main cell $Q_0$, current corresponding to the number of cells flows even in the sense cell $Q_{SE}$ and the current flowing through the sense cell $Q_{SE}$ flows through the sense resistor $R_{SE}$ all.

Actually, however, all the current flowing through the sense cell $Q_{SE}$ does not flow through the sense resistor $R_{SE}$, and part of the current flowing through the sense cell $Q_{SE}$ leaks as a leak current. When the load L is short-circuited in FIG. 2, for example, the source terminal S1 of the main cell $Q_0$ reaches a potential close to the GND potential. On the other hand, the source terminal S2 of the sense cell $Q_{SE}$ becomes a potential close to the power supply potential. The current flowing through the sense cell $Q_{SE}$ is considered to flow into GND through the sense resistor $R_{SE}$. Since, however, the large difference in potential occurs between the source terminal S1 of the main cell $Q_0$ and the source terminal S2 of the sense cell $Q_{SE}$ as described above, part of the current flowing through the sense cell $Q_{SE}$ flows between both terminals as the leak current. This is because the main cell $Q_0$ and the sense cell $Q_{SE}$ are formed in the same semiconductor chip as the same structure, and the main cell $Q_0$ and the sense cell $Q_{SE}$ are disposed close to each other. That is, the sense cell $Q_{SE}$ is formed using part of the main cell $Q_0$. Due to such reasons, the leak current becomes easy to flow between the source terminal S1 of the main cell $Q_0$ and the source terminal S2 of the sense cell $Q_{SE}$.

Thus, when part of the current flowing through the sense cell $Q_{SE}$ leaks as the leak current, the current flowing through the sense resistor $R_{SE}$ becomes smaller than an ideal value and the sense voltage $V_{SE}$ is detected low. When, for example, the load L is short-circuited and a current of a rated value or more flows through the main cell $Q_0$, the current proportional to the number of cells flows even in the sense cell $Q_{SE}$. When, however, all the current flowing through the sense cell $Q_{SE}$ flows through the sense resistor $R_{SE}$, the sense voltage $V_{SE}$ becomes a value greater than or equal to the threshold value. On the other hand, when part of the current flowing through the sense cell $Q_{SE}$ flows into a region other than the sense resistor $R_{SE}$ as the leak current, there is a possibility that the sense voltage $V_{SE}$ will become small and less than or equal to the threshold value. Namely, there is a possibility that even when the current of the rated value or more flows through the main cell $Q_0$, the sense voltage $V_{SE}$ will become the threshold value or less. When the current of the rated value or more flows through the main cell $Q_0$, it is necessary to turn OFF the main cell $Q_0$ by the drive circuit Dr. Since, however, the sense voltage $V_{SE}$ inputted to the drive circuit Dr reaches the threshold value or less, the main cell $Q_0$ is not turned OFF. In doing so, large current flows through the main cell $Q_0$ and the load L, so that they are brought to destruction. It is understood from this point that it is necessary to suppress the leak current developed between the sense cell $Q_{SE}$ and the main cell $Q_0$ in terms of an improvement in current detection accuracy in the power MISFET having the current detection circuit.

A description will hereinafter be made of a device structure of a power MISFET capable of suppressing leak current produced between the sense cell $Q_{SE}$ and the main cell $Q_0$.

Figure 3:
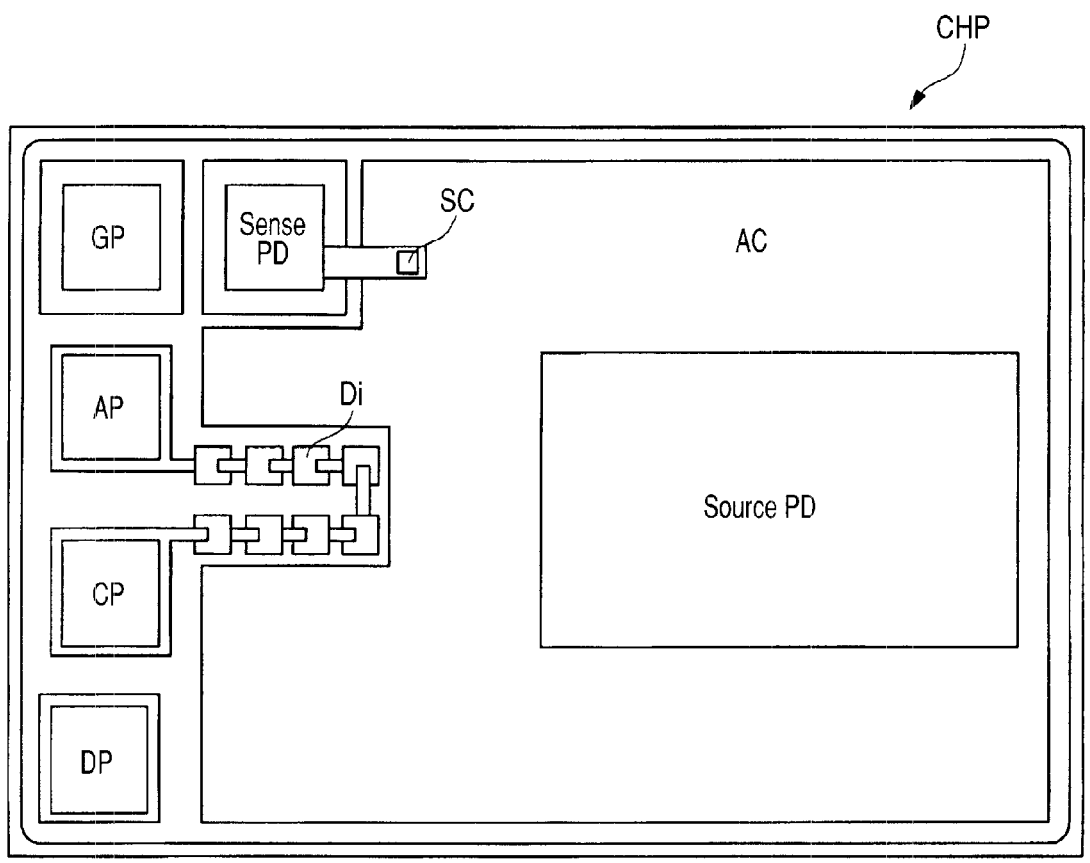
FIG. 3 is a plan view depicting a semiconductor chip formed with a power MISFET according to a first embodiment of the present invention.

FIG. 3 is a plan view showing a semiconductor chip CHP formed with the power MISFET according to the first embodiment. The surface of the semiconductor chip CHP is shown in FIG. 3. As shown in FIG. 3, for example, several tens of thousands of active cells AC are formed in an area that occupies the majority of the semiconductor chip CHP. Each of the active cells AC is a main cell and comprises a power MISFET. A gate pad GP is formed from the upper left of the semiconductor chip CHP, and a sense pad SensePD is formed to the right of the gate pad GP. An anode pad AP for each diode Di is formed on the lower side of the gate pad GP. A cathode pad CP for the diode Di is formed on the lower side of the anode pad AP. Further, a drain pad DP is formed on the lower side of the cathode pad CP. A source pad SourcePD is formed over the forming area of the active cell AC.

A wiring extends from the sense pad SensePD to the forming area side of each active cell AC. A sense cell SC is formed at the end of the wiring. The sense cell SC comprises a power MISFET having a structure similar to the active cell AC. A plurality of diodes Di coupled in series are formed between the anode pad AP and the cathode pad CP. The diodes Di are formed so as to enter into the forming area of the active cells AC. This is because each of the diodes Di is provided to detect or sense the temperature of each active cell AC. A source region of the power MISFET that configures each active cell AC is coupled to the source pad SourcePD, and a drain region of the power MISFET that configures each active cell AC is coupled to the drain pad DP. A gate electrode of the power MISFET that configures each active cell AC is coupled to the gate pad GP. On the other hand, a source region of the power MISFET that configures the sense cell SC is coupled to the sense pad SensePD, and a drain region of the power MISFET that configures the sense cell SC is coupled to the drain pad DP. Further, a gate electrode of the power MISFET that configures the sense cell SC is coupled to the gate pad GP. That is, the drain pad DP and the gate pad GP are shared for the active cells AC and the sense cell SC, and the source pad SourcePD is used in each of the active cells AC. On the other hand, the sense pad SensePD is used in the sense cell SC.

The gate pad GP, sense pad SensePD, source pad SourcePD, drain pad DP, anode pad AP and cathode pad CP respectively function as external coupling terminals for coupling the elements (power MISFETs and diodes) formed inside the semiconductor chip CHP and the outside of the semiconductor chip CHP.

While the active cells AC and the sense cell SC are similar in structure, they are different in the number thereof formed in the semiconductor chip CHP. Since it is necessary to supply current sufficiently for the purpose of driving a load, the number of the active cells AC increases. On the other hand, the sense cell SC is not formed for the purpose of driving the load but is provided to detect current flowing through the entire active cells AC. The sense cell SC is one that may simply obtain a predetermined sense current. Therefore, the ratio in number between the active and sense cells AC and SC becomes 1000:1, for example. However, the ratio in number is not necessarily limited to it. For instance, the number of sense cells SC can also be changed to obtain the predetermined sense current.

Figure 4:
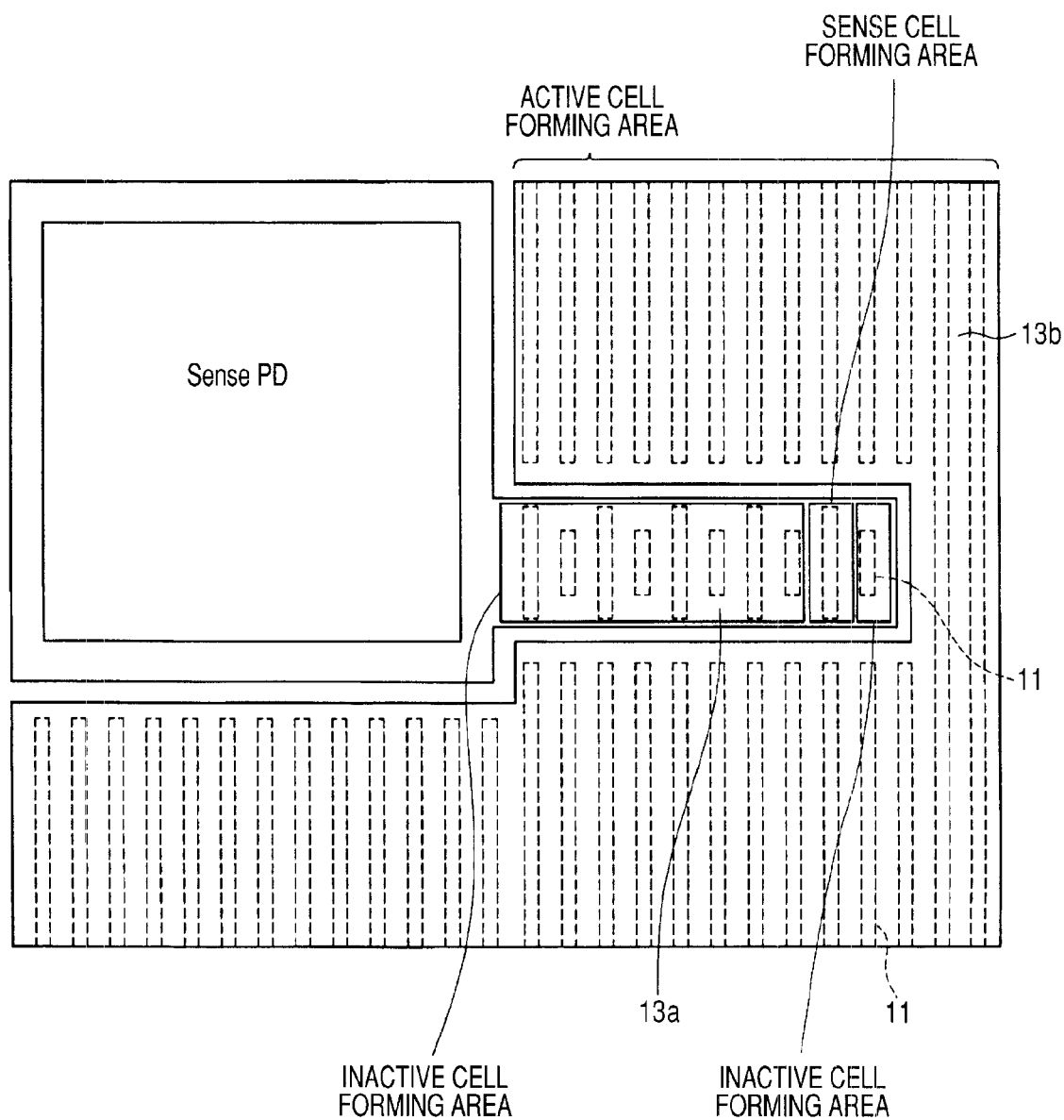
FIG. 4 is a plan view illustrating the periphery of a sense pad shown in FIG. 3 in an enlarged form.

FIG. 4 is a plan view showing the periphery of the sense pad SensePD shown in FIG. 3. As shown in FIG. 4, a sense wiring 13a is coupled to the sense pad SensePD. This sense wiring 13a extends in the right direction of FIG. 4 from the sense pad SensePD. That is, the sense wiring 13a is disposed so as to enter an active cell forming area. Then, the sense wiring 13a reaches a sense cell forming area through an inactive cell forming area. The sense wiring 13a is coupled to plugs 11 formed in the inactive cell forming area and the sense cell forming area. That is, the sense wiring 13a is coupled via the plugs 11 to inactive cells formed in a semiconductor substrate lying in a layer below the plugs 11 in the inactive cell forming area. In the sense cell forming area, the sense wiring 13a is coupled to its corresponding sense cell formed in the semiconductor substrate lying in the layer below the plugs 11. A source wiring 13b separated from the sense wiring 13a without being electrically coupled thereto is formed around the sense wiring 13a. The source wiring 13b is formed in the active cell forming area and coupled via the plugs 11 to active cells formed in the semiconductor substrate lying in the layer below the plugs 11.

A cell structure formed in the layer below each plug 11 shown in FIG. 4 will subsequently be explained using FIGS.

Figure 5:
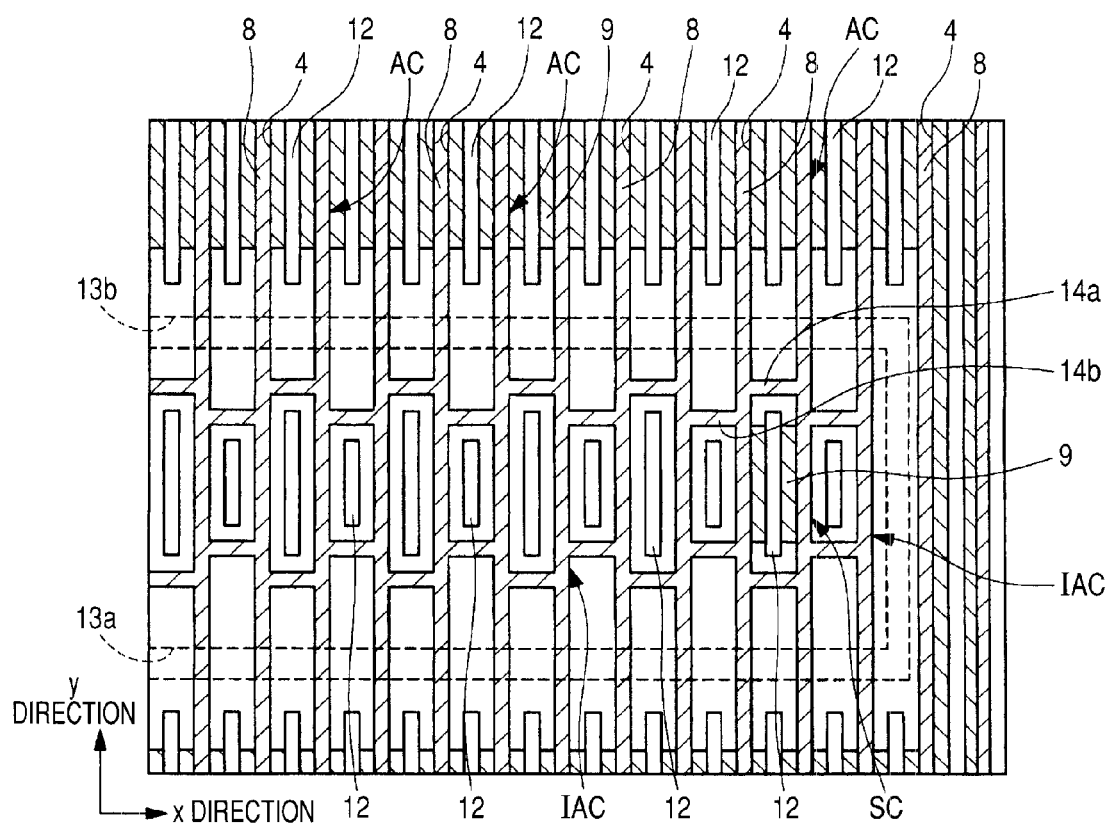
FIG. 5 is a diagram showing a cell structure of a power MISFET formed in a semiconductor substrate.
Figure 6:
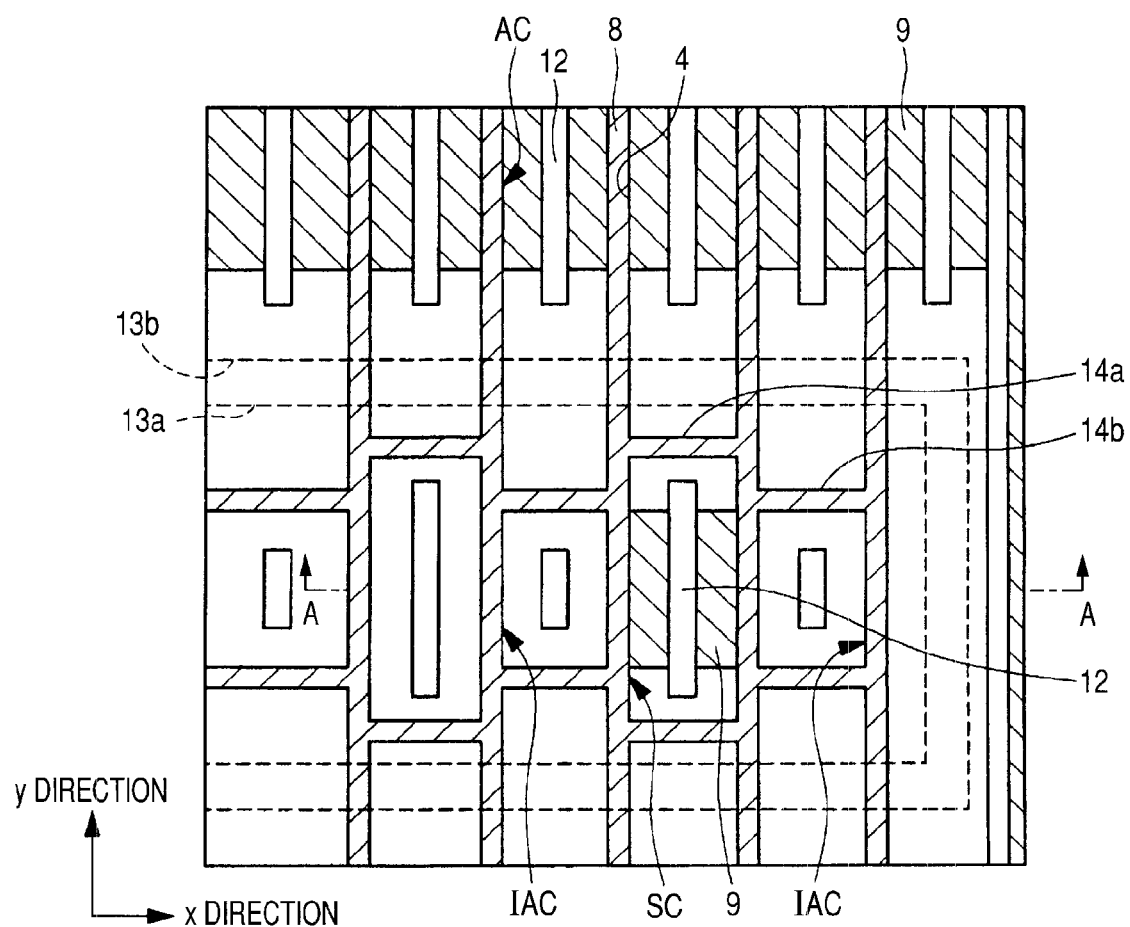
FIG. 6 is a further enlarged view of FIG. 5.

5 and 6. FIG. 5 is a diagram showing a cell structure of a power MISFET formed in the semiconductor substrate. FIG. 6 is a further enlarged view of FIG. 5. In FIGS. 5 and 6, the sense wiring 13a and the source wiring 13b formed in a layer above the semiconductor substrate are indicated by dotted lines. On the other hand, a structure formed by a solid line indicates one formed in the semiconductor substrate. As shown in FIG. 5, a plurality of trenches 4 are formed in the active cell forming area formed in the layer below the source wiring 13b and the inactive cell forming area and sense cell forming area formed in the layer below the sense wiring 13a. The trenches 4 are grooves provided in the semiconductor substrate. The trenches 4 are disposed so as to be arranged in an x direction and formed so as to extend in a y direction. That is, the trenches 4 are formed in stripe form. Of these trenches 4, there are ones disposed so as to extend in the y direction from the active cell forming area lying in the layer below the source wiring 13b through the inactive cell forming area and sense cell forming area lying in the layer below the sense wiring 13a.

A polysilicon film is embedded in each of the trenches 4. Gate electrodes 8 are formed by the polysilicon film. At this time, the gate electrodes 8 embedded in the trenches 4 function as the gate electrodes 8 for the active cells AC in the active cell forming area. In the active cell forming area, each of p-type semiconductor regions 12 corresponding to body contact regions is formed between the two gate electrodes 8. A source region 9 comprised of an n-type semiconductor region is formed between the gate electrode 8 and the p-type semiconductor region 12. That is, a plurality of active cells AC are formed in the active cell forming area. Each of the active cells AC has the gate electrode 8 embedded in the trench 4, the p-type semiconductor region 12 corresponding to the body contact region, and the source region 9. In the active cell forming area, the p-type semiconductor regions 12 corresponding to the body contact regions and the source regions 9 both shown in FIG. 5 are electrically coupled to the plugs 11 shown in FIG. 4 and coupled to the source wiring 13b via the plugs 11.

Next, in the sense cell forming area lying in the layer below the sense wiring 13a, each of the gate electrodes 8 embedded in the trenches 4 functions as the gate electrode 8 for the sense cell SC. In the sense cell forming area, a p-type semiconductor region 12 corresponding to a body contact region is formed between the two gate electrodes 8, and a source region 9 comprised of an n-type semiconductor region is formed between the gate electrode 8 and its corresponding p-type semiconductor region 12. That is, the sense cell SC is formed in the sense cell forming area. The sense cell SC has the gate electrode 8 embedded in the trench 4, the p-type semiconductor region 12 corresponding to the body contact region, and the source region 9 in a manner similar to each of the active cells AC referred to above. In the sense cell forming area, the p-type semiconductor regions 12 corresponding to the body contact regions and the source regions 9 both shown in FIG. 5 are electrically coupled to the plugs 11 shown in FIG. 4 and coupled to the sense wiring 13a via the plugs 11.

Subsequently, each of the gate electrodes 8 embedded in the trenches 4 becomes a gate electrode 8 used for each inactive cell IAC in each inactive cell forming area formed around the sense cell forming area. While a p-type semiconductor region 12 corresponding to a body contact region is formed between the two gate electrodes 8 in the inactive cell forming area, no source region 9 comprised of an n-type semiconductor region is formed between the gate electrode 8 and its corresponding p-type semiconductor region 12. That is, the inactive cell IAC has the gate electrode 8 embedded in its corresponding trench 4 and the p-type semiconductor region 12 corresponding to the body contact region unlike the active cell AC and the sense cell SC, but does not include the source region 9. Therefore, the inactive cell IAC is of a cell that does not operate as the power MISFET and that is provided to separate the active cell AC and the sense cell SC from each other. Even in the inactive cell forming area, the p-type semiconductor regions 12 each used as the body contact region shown in FIG. 5 are electrically coupled to the plugs 11 shown in FIG. 4 and coupled to the sense wiring 13a via the plugs 11.

Further, cutoff or blocking trenches 14a and 14b for coupling the two adjacent trenches 4 are provided in each of the sense cell forming area and the inactive cell forming area. That is, the blocking trenches 14a and 14b are formed in the x direction that intersects with the y direction in which the trenches 4 extend. The blocking trenches 14a and 14b are disposed in such a manner that their forming positions are alternately shifted to avoid their alignment form as shown in FIG. 5, for example. Incidentally, the functions of the blocking trenches 14a and 14b will be described later.

Figure 7:
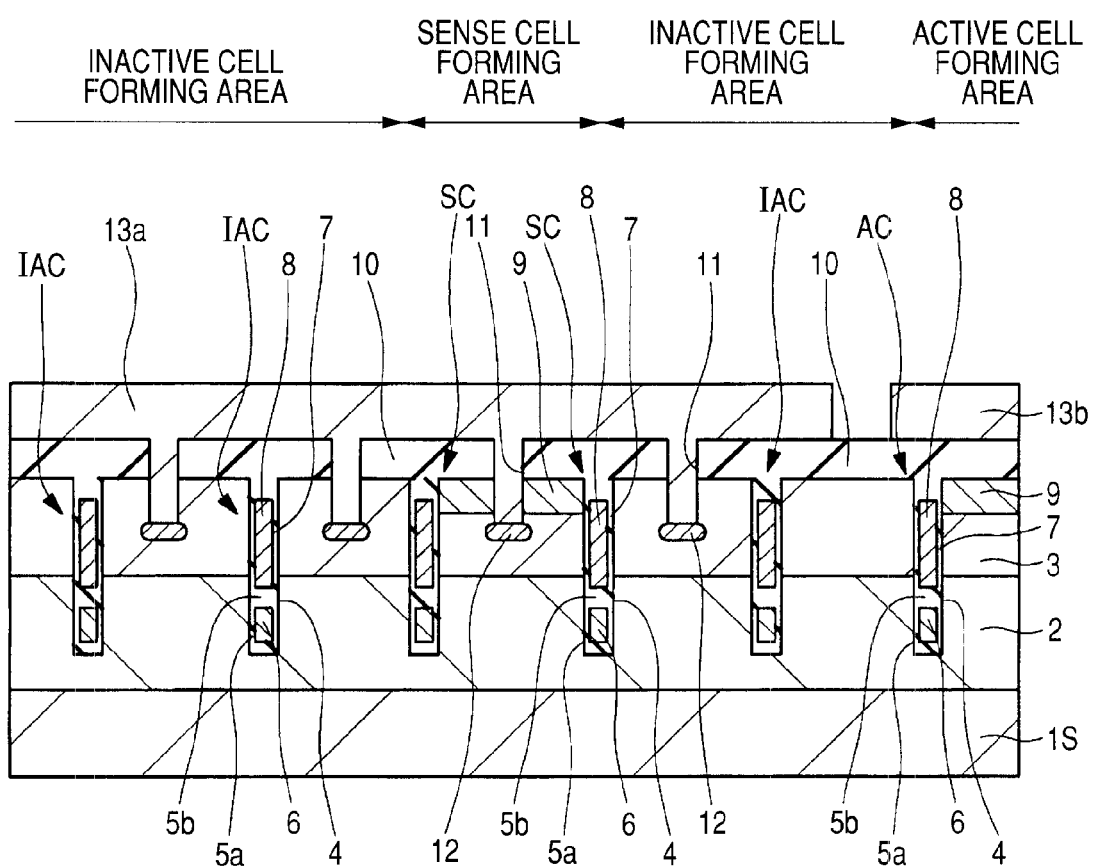
FIG. 7 is a sectional view taken along line A-A of FIG. 6.

Next, FIG. 7 is a sectional view cut along line A-A of FIG. 6. A sectional structure of each cell will be explained using FIG. 7. The inactive cell forming areas, sense cell forming area and active cell forming area are first shown in FIG. 7. It is understood that the sense cell forming area and the active cell forming area are separated from each other by the inactive cell forming area.

A configuration of each sense cell SC formed in the sense cell forming area will first be explained. In FIG. 7, an n-type epitaxial layer 2 in which an n-type impurity such as phosphorous or arsenic is introduced or implanted is formed over its corresponding semiconductor substrate 1S. Each channel forming region (channel forming semiconductor region) 3 is formed over the n-type epitaxial layer 2. A p-type impurity such as boron (B) is introduced in the channel forming region 3. The semiconductor substrate 1S serves as a drain region of the sense cell SC. A source region 9 comprised of an n-type semiconductor region is formed over its corresponding channel forming region 3.

Trenches 4 extending in the direction (direction of thickness of the semiconductor substrate 1S) orthogonal to a main or major surface of the semiconductor substrate 1S are formed in the main surface of the semiconductor substrate 1S. Each of the trenches 4 is formed in alignment with the source region 9 and formed so as to penetrate from the main surface of the semiconductor substrate 1S to the channel forming region 3 and to be terminated within the n-type epitaxial layer 2. In FIG. 7, each dummy electrode 6 is formed downward as viewed inside the trench 4 via an insulting film (first insulating film) 5a. An insulating film (second insulating film) 5b is formed over the dummy gate electrode 6, and a gate electrode 8 is formed over the insulating film 5b. A gate insulating film 7 is formed between the gate electrode 8 and the side surface of each trench 4. While the insulating film 5a and the insulating film 5b, and the gate insulating film 7 are both comprised of, for example, a silicon oxide film, the insulating films 5a and 5b are formed thicker than the gate insulating film 7.

While the dummy gate electrode 6 and the gate electrode 8 are both comprised of, for example, a polysilicon film, they are insulated from each other by the insulating film 5b interposed between the dummy gate electrode 6 and the gate electrode 8. The dummy gate electrode 6 is electrically coupled to the gate electrode 8. That is, in the first embodiment, the dummy gate electrode 6 and the gate electrode 8 are set to the same potential thereby to make it possible to avoid the influence of dielectric breakdown strength of the insulating film 5*b* interposed between the dummy gate electrode 6 and the gate electrode 8 on the breakdown voltage of the gate electrode 8. It is thus possible to attain an improvement in the breakdown voltage of the gate electrode 8. That is, although the breakdown voltage of the gate electrode 8 is susceptible to the dielectric breakdown strength of the insulating film 5*b* interposed between the dummy gate electrode 6 and the gate electrode 8, the voltage load on the insulating film 5*b* is avoided by setting the dummy gate electrode 6 and the gate electrode 8 interposing the insulating film 5*b* therebetween to the same potential in the first embodiment. It is therefore possible to enhance the breakdown voltage of each gate electrode 8.

The gate electrode 8 is of a control electrode used for each sense cell SC. A voltage for controlling the operation of the sense cell SC is to be applied to the gate electrode 8. The upper surface of the gate electrode 8 is set slightly lower than the main surface (upper surface of source region 9) of the semiconductor substrate 1S. A channel for the sense cell SC is formed in the channel forming region 3 opposite to the side surface of the gate electrode 8. Namely, a channel current for the sense cell SC flows in the direction of the thickness of the semiconductor substrate 1S along the side surface of each trench 4.

A body contact trench is formed on the lateral sides of the trenches 4 in which the gate electrodes 8 are embedded, with the source region 9 being interposed therebetween. Each plug 11 is formed by embedding a conductor film into the body contact trench. A p-type semiconductor region 12 used as a body contact region is formed at the bottom of the body contact trench. The p-type semiconductor region 12 used as the body contact region is formed with the aim of taking reliable ohmic contact with each plug 11 and its corresponding channel forming region 3 and suppressing the operation of a parasitic bipolar transistor. The source region 9 and the p-type semiconductor region 12 are electrically coupled via the corresponding plug 11. The plug 11 penetrates an interlayer insulating film 10 and is electrically coupled to the sense wiring 13*a* formed over the interlayer insulating film 10. The sense wiring 13*a* comprises, for example, an aluminium film or an aluminium alloy film. On the other hand, a drain electrode (not shown) is formed over the back surface opposite to the main surface of the semiconductor substrate 1S. The drain electrode is comprised of, for example, a laminated or layered film of a titanium (Ti) film, a nickel (Ni) film and a gold (Au) film. The sense cell SC is configured in this way. That is, in the first embodiment, the sense cell SC is comprised of a trench gate type power MISFET equipped with a dummy gate electrode.

The configuration of each active cell AC will next be explained. However, the active cell AC is similar to the above sense cell SC in configuration. Accordingly, the active cell AC is also comprised of a trench gate type power MISFET equipped with a dummy gate electrode. However, the plug 11 used for each active cell AC is coupled to the source wiring 13*b*. Further, each of the inactive cells IAC is different from the sense cell SC in that although the inactive cell IAC is also basically equal to the sense cell SC in configuration, the source region 9 is not provided. Thus, since the source region 9 is not formed in the inactive cell IAC, it does not operate as a power MISFET. Namely, it is understood that since the inactive cell IAC and the sense cell SC are similar in configuration except for the non-provision of the source region 9, the inactive cell IAC is predicated on the structure of the trench gate type power MISFET equipped with the dummy gate electrode.

While the trench gate type power MISFET that configures each of the cells (active cell AC, inactive cell IAC and sense cell SC) is provided with the dummy gate electrode 6 in the first embodiment, the function of the dummy gate electrode 6 will next be explained.

While the trench gate type power MISFET needs to enhance its breakdown voltage, the breakdown voltage (BVdss) mentioned herein indicates one decided based on the voltage at which avalanche breakdown occurs when the voltage is applied to a drain region in a state in which a gate electrode and a source region are grounded. When the voltage is applied to the drain region in the state in which the gate electrode and the source region are grounded, an electric field becomes strong in the neighborhood (pn junction) of a boundary between a channel forming region and an n-type epitaxial layer and at the bottom of each trench in the trench gate type power MISFET. Accordingly, the avalanche breakdown becomes easy to occur due to the breakdown voltage at each of both the neighborhood (pn junction) of the boundary between the channel forming region and the n-type epitaxial layer and the trench's bottom where the electric field strength becomes strong. At this time, a trench gate type power MISFET with no dummy gate electrode becomes shallower in trench's depth than the trench gate type power MISFET provided with the dummy gate electrode. Described specifically, the depth of the trench in the trench gate type power MISFET with no dummy gate electrode corresponds to a depth to the neighborhood of the boundary between the channel forming region and the n-type epitaxial layer. Therefore, the neighborhood (pn junction) of the boundary between the channel forming region and the n-type epitaxial layer and the bottom of each trench are brought close to each other in the trench gate type power MISFET with no dummy gate electrode. Since the electric field strength becomes high even in both regions, the electric field strength becomes higher due to a synergistic effect when they are brought close to each other. The breakdown voltage is reduced from the above point.

On the other hand, the depth of the trench becomes deep by the provision of the dummy gate electrode in the trench gate type power MISFET provided with the dummy gate electrode. This means that the neighborhood (pn junction) of the boundary between the channel forming region and the n-type epitaxial layer, and the bottom of each trench are spaced away from each other. Thus, since the electric field strength is relaxed as compared with where the neighborhood (pn junction) of the boundary between the channel forming region and the n-type epitaxial layer and the bottom of the trench are brought close to each other, the breakdown voltage is enhanced. Further, since the insulating film thicker than the gate insulating film is provided at the bottom of each trench in the trench gate type power MISFET provided with the dummy gate electrode, the electric field between the dummy gate electrode and the drain region becomes easy to be relaxed. From the above point of view, the trench gate type power MISFET provided with the dummy gate electrode has the advantage that the breakdown voltage can be enhanced as compared with the trench gate type power MISFET provided with no dummy gate electrode.

The trench gate type power MISFET that configures each of the cells (active cell AC, inactive cell IAC and sense cell SC) is configured as described above. The operation thereof will next be explained below. A predetermined voltage is first applied to the gate electrode 8 to turn ON the trench gate type power MISFET. In doing so, the channel forming region 3 is inverted at the side surface of each trench 4 with the gate electrode 8 embedded therein in each active cell AC, so that an inversion layer is formed along the side surface of the trench 4. Therefore, the source region 9 and the n-type epitaxial layer 2 are electrically coupled to each other by the inversion layer formed in the channel forming region 3 in the active cell AC. Accordingly, a current path extending from the semiconductor substrate 1S brought to the drain region to the source region 9 via the n-type epitaxial layer 2 and the inversion layer is formed in the active cell AC. From this point, current flows from the drain region (semiconductor substrate 1S) to the source region 9 in the active cell AC. It is thus possible to drive a normal load.

Since the gate electrode 8 of each active cell AC and the gate electrode 8 of each sense cell SC are electrically coupled to each other, a predetermined voltage is applied even to the gate electrode 8 of the sense cell SC when the predetermined voltage is applied to the gate electrode 8 of the active cell AC. Accordingly, the corresponding channel forming region 3 is inverted at the side surface of the trench 4 with the gate electrode 8 embedded therein even in the case of the sense cell SC, so that an inversion layer is formed along the side surface of the trench 4. Therefore, the source region 9 and the n-type epitaxial layer 2 are electrically coupled to each other by the inversion layer formed in the channel forming region 3 in the sense cell SC. Since, however, although the sense cell SC is also turned ON in this way, the switch SW is coupled to the sense cell SC as shown in FIG. 2 and the switch SW is not turned ON in a normal state in which the load is not short-circuited, no current flows through the sense cell SC. That is, since a difference in potential little takes place between the source terminal of the active cell AC and the source terminal of the sense cell SC in the normal state in which the load is not short-circuited as shown in FIG. 2, the output of the operational amplifier OP is reduced. Therefore, the voltage enough to turn ON the switch SW is not applied to the gate electrode of the switch SW electrically coupled to the output of the operational amplifier OP and thereby the switch SW is not turned ON.

The operation of the power MISFET after the load is short-circuited in this state due to some cause will be explained. When the load is short-circuited, the source terminal of the active cell AC coupled to the load is brought to the GND potential. On the other hand, since the source terminal of the sense cell SC maintains a potential near the power supply or source potential, the difference in potential inputted to the operational amplifier OP becomes large and the output produced from the operational amplifier OP also becomes great. In doing so, the voltage enough to turn ON the switch SW is applied to the gate electrode of the switch SW electrically coupled to the output of the operational amplifier OP, so that the switch SW is turned ON. Therefore, the current flows even in the sense cell SC. Thus, when the current flowing through the sense cell SC flows through the sense resistor $R_{SE}$ (refer to FIG. 2), a predetermined sense voltage $V_{SE}$ occurs. The drive circuit Dr (refer to FIG. 2) controls ON/OFF of each active cell AC by comparison of the sense voltage $V_{SE}$ with its threshold value. Thus, the active cell AC and the load can be protected by turning OFF the active cell AC when the load is short-circuited.

At this time, the threshold value used in the drive circuit Dr (refer to FIG. 2) is derived assuming that all the current flowing through the sense cell SC flows through the sense resistor $R_{SE}$. That is, the threshold voltage is based on the premise that when a current of a rated value or so flows through the active cell AC, current corresponding to the number of cells flows even in the sense cell SC, and all the current flowing through the sense cell SC flows through the sense resistor $R_{SE}$.

Actually, however, all the current flowing through each sense cell SC does not flow through the sense resistor $R_{SE}$ and part of the current flowing through the sense cell SC leaks as a leak current. When the load L is short-circuited, the source region 9 of the active cell AC reaches a potential close to the GND potential. On the other hand, the source region 9 of the sense cell SC reaches a potential close to the power supply potential. Thus, since a large difference in potential occurs between the source region 9 of the active cell AC and the source region 9 of the sense cell SC, part of the current having flowed through the sense cell SC flows between the source regions 9 as a leak current. As shown in FIG. 7 by way of example, the leak current passes from the source region 9 of the sense cell SC to the inversion layer formed at the side surface of the trench 4 of the sense cell SC and flows from the inversion layer to the n-type epitaxial layer 2. Then, the leak current proceeds in the lateral direction through the n-type epitaxial layer 2 and leads from the sense cell forming area to the active cell forming area. The leak current having proceeded to the active cell forming area passes from the n-type epitaxial layer 2 to the inversion layer formed at the side surface of the trench 4 of the active cell AC and reaches the source region 9 of the active cell AC. The leak current flows between the source region 9 of the sense cell SC and the source region 9 of the active cell AC through such a current path.

When part of the current flowing through the sense cell SC leaks as the leak current in this way, the current flowing through the sense resistor $R_{SE}$ becomes smaller than an ideal value and the sense voltage $V_{SE}$ is detected low. When, for example, the load L is short-circuited and a current of a rated value or more flows through the active cell AC, the current proportional to the number of cells flows even in the sense cell SC. When, however, all the current flowing through the sense cell SC flows through the sense resistor $R_{SE}$, the sense voltage $V_{SE}$ becomes a value greater than or equal to the threshold value. On the other hand, when part of the current flowing through the sense cell SC flows into a region other than the sense resistor $R_{SE}$ as the leak current, there is a possibility that the sense voltage $V_{SE}$ will become small and less than or equal to the threshold value. Namely, there is a possibility that even when the current of the rated value or more flows through the active cell AC, the sense voltage $V_{SE}$ will become the threshold value or less. When the current of the rated value or more flows through the active cell AC, it is necessary to turn OFF the active cell AC by the drive circuit Dr. Since, however, the sense voltage $V_{SE}$ inputted to the drive circuit Dr reaches the threshold value or less, the active cell AC is not turned OFF. In doing so, large current flows through the active cell AC and the load L, so that they are brought to destruction. It is understood from this point that it is necessary to suppress the leak current developed between the sense cell SC and the active cell AC in terms of an improvement in current detection accuracy.

The first embodiment realizes the suppression of the leak current developed between the sense cell SC and the active cell AC. Characteristic points of the first embodiment will be explained. Described specifically, one characteristic of the first embodiment resides in that as shown in FIG. 7, such a structure that each of the inactive cells IAC is provided between the sense cell SC and the active cell AC and some distance is put between the sense cell SC and the active cell AC is adopted, and such a trench gate structure that each dummy gate electrode 6 is provided is used as the structure of the inactive cell IAC. Therefore, the depth of the trench 4 can be made deep in the first embodiment shown in FIG. 7 as compared with the trench with no dummy gate electrode 6.

The current flowing through the n-type epitaxial layer 2 in the lateral direction can be suppressed where the depth of the trench 4 can be made deep. That is, the inactive cell IAC is provided between the sense cell SC and the active cell AC thereby to space the sense cell SC and the active cell AC away from each other as a precondition in the first embodiment. Thus, the leak current becomes hard to flow because the sense cell SC and the active cell AC are spaced away from each other. The trench structure provided with each dummy gate electrode 6 is adopted as the structure of the inactive cell IAC. It is thus possible to make the depth of the trench 4 of each inactive cell IAC deep. Described specifically, since the trench 4 is formed so as to reach the inside of the n-type epitaxial layer 2, the effect of blocking the leak current flowing through the n-type epitaxial layer 2 in the lateral direction (corresponding to the direction in which the current proceeds from the sense cell forming area to the active cell forming area) sufficiently by the corresponding trench 4 is obtained.

As shown in FIG. 7 by way of example, the leak current passes from the source region 9 of the sense cell SC to the inversion layer formed at the side surface of the trench 4 of the sense cell SC and flows from the inversion layer to the n-type epitaxial layer 2. The leak current proceeds in the lateral direction through the n-type epitaxial layer 2 and leads from the sense cell forming area to the active cell forming area. The leak current having proceeded to the active cell forming area passes from the n-type epitaxial layer 2 to the inversion layer formed at the side surface of the trench 4 of the active cell AC and reaches the source region 9 of the active cell AC. The leak current flows between the source region 9 of the sense cell SC and the source region 9 of the active cell AC through such a current path. In the first embodiment, however, the path for the current flowing in the lateral direction through the n-type epitaxial layer 2, of such a leak current path becomes apt to be cut off or blocked by the trench 4 formed so as to enter into the n-type epitaxial layer 2. It is therefore possible to suppress the leak current developed between the sense cell SC and the active cell AC.

It is general that, for example, each trench with no dummy gate electrode 6 penetrates the channel forming area 3 but has a depth up to the neighborhood of the boundary between the channel forming area 3 and the n-type epitaxial layer 2. Therefore, the entire n-type epitaxial layer 2 becomes a path for the leak current. That is, since the entire thickness of the n-type epitaxial layer 2 almost serves as the path for the leak current, the magnitude of the leak current increases. On the other hand, each trench 4 is formed up to a region that sufficiently reaches the inside of the n-type epitaxial layer 2 beyond the boundary between the n-type epitaxial layer 2 and the channel forming region 3 in the case of the trench 4 provided with the dummy gate electrode 6 as in the first embodiment (refer to FIG. 7). Therefore, the entire thickness of the n-type epitaxial layer 2 is not brought to the current path and the portion of the n-type epitaxial layer 2 formed with each trench 4 becomes a cut-off or blocking region. That is, in the first embodiment, each portion (portion in which each trench does not enter) for coupling the sense cell forming area and the active cell forming area, of the n-type epitaxial layer 2 becomes very narrow. From this respect, the leak current that flows between the source region 9 of the sense cell SC and the source region 9 of the active cell AC can be reduced.

Further, since the depth of each trench 4 provided with the dummy gate electrode 6 becomes deep as in the first embodiment as compared with the trench with no dummy gate electrode, the leak current is sneaked significantly, so that a current path length becomes long. It is understood even from this point of view that the leak current can be reduced.

As described above, the cell structure according to the first embodiment has a feature in that the trench gate type power MISFET provided with the dummy gate electrode is adopted as each of the sense, active and inactive cells. Further, the first embodiment is characterized even by a cell planar structure as well as the cell sectional structure. Although there are known, for example, a cell structure corresponding to a mesh structure formed in mesh form as a cell planar arrangement or layout, and a cell structure corresponding to a stripe structure in which trenches are arranged in a predetermined direction, as for the trench gate type power MISFET, each cell having the stripe structure has been adopted as shown in FIGS. 5 and 6 by way of example in the first embodiment. This is because the uniformity of an electrical operation of each cell (trench gate type power MISFET) can be ensured since the cell structure corresponding to the strip structure is improved as compared with the cell structure corresponding to the mesh structure in terms of dimensional accuracy and uniformity in a machining process. Namely, the first embodiment is capable of configuring each cell uniform in electrical characteristic by setting the cell structure to the stripe structure and providing a semiconductor device (power MISFET) high in reliability.

However, the mere setting of each trench to the strip structure is not enough in the trench gate type power MISFET provided with the current detection circuit (sense cell SC) and some change is required as in the first embodiment. This point of change (one characteristic point of the first embodiment) will be explained.

As shown in FIGS. 5 through 7, the source region 9 of each sense cell SC and the p-type semiconductor region 12 corresponding to each body contact region are coupled to the sense wiring 13a via each plug 11. Likewise, the p-type semiconductor region 12 corresponding to the body contact region of each inactive cell IAC is also coupled to the sense wiring 13a via each plug 11. On the other hand, the source region 9 of each active cell AC and the p-type semiconductor region 12 corresponding to each body contract region are coupled to the source wiring 13b via each plug 11. This configuration is done because there is a need to separate the source region 9 of the sense cell SC and the source region 9 of the active cell AC from each other in terms of the circuit configuration shown in FIG. 2.

Referring to FIGS. 5 and 6 here, for example, a plurality of trenches 4 are arranged in an x direction and extend in a y direction respectively. At this time, some of the trenches 4 are formed so as to extend from the active cell forming area to the inactive cell forming area and the sense cell forming area. While each of the gate electrodes 8 is formed even inside the trench 4, it functions as the gate electrode 8 of each active cell AC in the active cell forming area, and it functions as the gate electrode 8 of each inactive cell IAC in the inactive cell forming area. Further, it functions as the gate electrode 8 of each sense cell SC in the sense cell forming area. Namely, the gate electrode 8 embedded in one trench 4 shares the gate electrode of the active cell AC, the gate electrode of the inactive cell IAC and the gate electrode of the sense cell SC. When a predetermined voltage is applied to the gate electrode 8 embedded in the trench 4, an inversion layer is formed at the side surface of the trench 4. Since this inversion layer is formed along the side surface of the trench 4, the inversion is also formed so as to extend in the y direction along the y direction in which one trench 4 extends. In other words, the inversion layer formed in one trench 4 is formed over the active cell forming area, the inactive cell forming area and the sense cell forming area. Thus, even though the destinations to be coupled to the source region 9 of the active cell AC formed in the active cell forming area and the source region 9 of the sense cell SC formed in the sense cell forming area are separated from each other, the source region 9 of the active cell AC and the source region 9 of the sense cell SC are coupled to each other via the inversion layer formed in the channel forming region 3. Accordingly, it is understood that there is a need to divide the inversion layer formed at the side surface of each trench 4 extending in the y direction between the active cell forming area and the sense cell forming area or between the active cell forming area and the inactive cell forming area.

Therefore, the blocking trenches 14a and 14b are provided in the inactive cell forming area and the sense cell forming area as shown in FIG. 6 in the first embodimemt. With the provision of the blocking trenches 14a and 14b, the inversion layer formed at the side surface of one trench 4 extending in the y direction can be divided. That is, when the blocking trenches 14a and 14b are not provided, the inversion layer formed at the side surface of one trench 4 extends from the active cell forming area to the sense cell forming area through the inactive cell forming area, whereas the inversion layer can be divided by laying out the blocking trenches 14a and 14b so as to intersect with the y direction in which the inversion layer extends. Each of the blocking trenches 14a and 14b is also similar in configuration to the trench 4 and has a structure in which the dummy gate electrode (not shown in FIG. 6) and the gate electrode 8 are embedded thereinside. As described above, the first embodiment has one feature even in that each cell having the stripe structure is formed and the inversion layer formed from the active cell forming area to the sense cell forming area is divided by the blocking trenches 14a and 14b.

Figure 8:
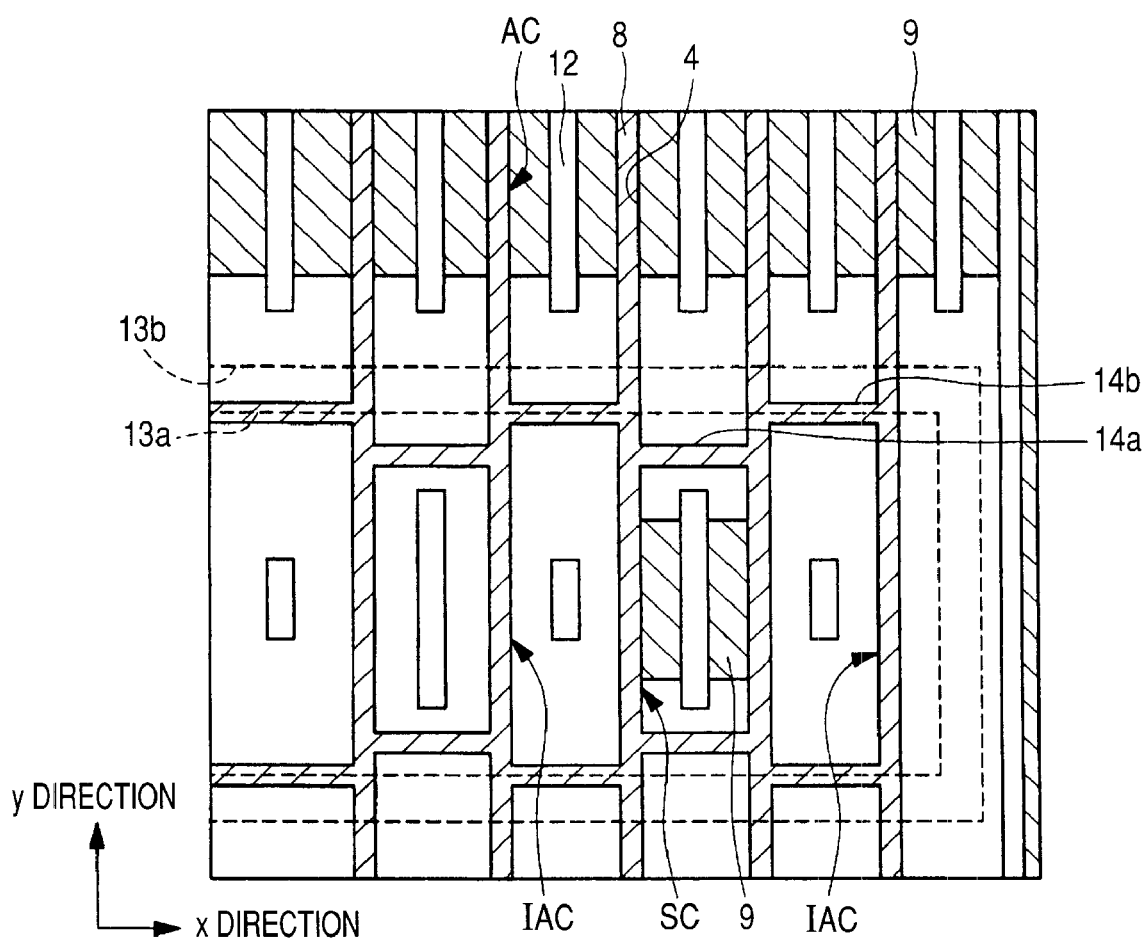
FIG. 8 is a diagram showing a layout example of blocking trenches.
Figure 9:
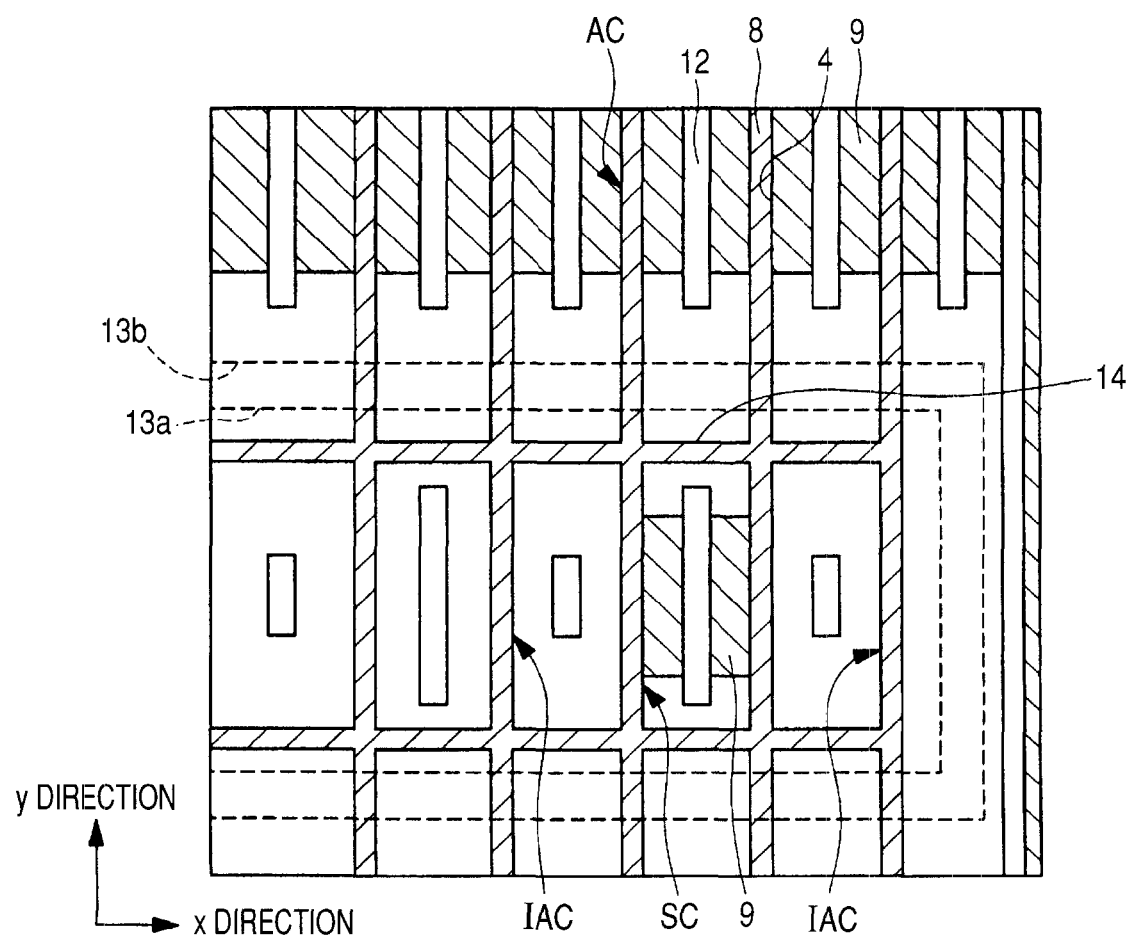
FIG. 9 is a diagram illustrating a layout example of blocking trenches.

Although the blocking trenches 14a and 14b are disposed in such a manner that their forming positions are alternately shifted to avoid their alignment form as shown in FIG. 6, for example, they can also be disposed as shown in FIG. 8 as such an arrangement or layout example that the forming positions of the blocking trenches 14a and 14b are shifted alternately. Further, the blocking trenches 14a and 14b need not necessarily be disposed with being shifted in their position. A blocking trench 14 may be disposed in the x direction in linear form as shown in FIG. 9.

However, such a configuration that the blocking trenches 14a and 14b are disposed with shifted in position makes it possible to improve the accuracy of processing form as compared with such a configuration that the blocking trench 14 is disposed linearly. When the blocking trench 14 is laid out linearly as shown in FIG. 9, for example, each region at which the blocking trench 14 and the trench 4 intersect is crossshaped. At this time, there is a fear that while the blocking trench 14 and each trench 4 are formed by etching based on the same process, the accuracy of processing of the region (crossed form) at which the blocking trench 14 and each trench 4 intersect is degraded because the corner of the crossed form is apt to be etched upon etching. When the accuracy of processing of the blocking trench 14 and each trench 4 is degraded, there is a fear that it influences the electrical characteristic of the trench gate type power MISFET.

On the other hand, when the blocking trenches 14a and 14b shown in FIGS. 6 and 8 are disposed in shifted form, the form of a region at which each of the blocking trenches 14a and 14b and the trench 4 intersect is shaped in T-like form and is not shaped in the form of the cross. Therefore, when the blocking trenches 14a and 14b and each trench 4 are formed by etching, the processing accuracy can be improved as compared with the processing thereof in the cross-shaped manner. Accordingly, the configuration in which the blocking trenches 14a and 14b are disposed with being shifted in position, reduces a fear of adversely affecting the electrical characteristic of the trench gate type power MISFET as compared with the configuration in which the blocking trench 14 is laid out linearly. From this point of view, it can be said that the configuration in which the blocking trenches 14a and 14b are disposed with being shifted in position, is desired as compared with the configuration in which the blocking trench 14 is disposed linearly.

Figure 10:
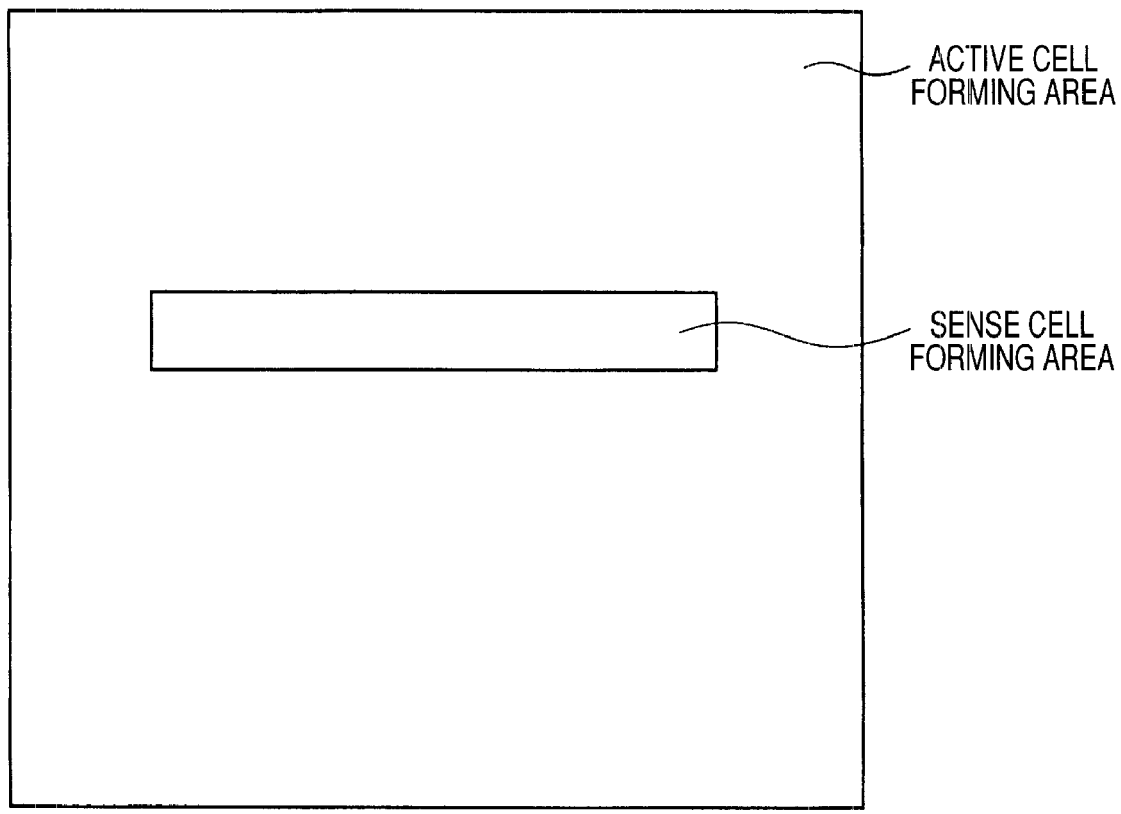
FIG. 10 is a conceptual diagram showing where a sense cell forming area is made rectangular in shape.

The optimum shape of the sense cell firming area for disposing or laying out each sense cell will next be explained. Consider where, for example, a sense cell forming area is disposed in part of an active cell forming area in which each active cell is disposed. FIG. 10 is a conceptual diagram showing a case in which the shape of the sense cell forming area is made rectangular. It is understood that in this case, the region of contact between the sense cell forming area and the active cell forming area becomes large significantly. Increasing the region of contact between the sense cell forming area and the active cell forming area means that the region in which each sense cell and its corresponding active cell approach each other becomes large. Thus, leak current developed between the sense cell and the active cell increases. That is, assuming that the leak current is identical between one sense cell and one active cell, the larger the area of contact between the sense cell forming area and the active cell forming area, the greater the number of the sense and active cells adjacent to each other, thus resulting in an increase in leak current. It is understood from this respect that there is a need to reduce the area of contact between the sense cell forming area and the active cell forming area in terms of a reduction in the leak current generated between the sense cell and the active cell.

Figure 11:
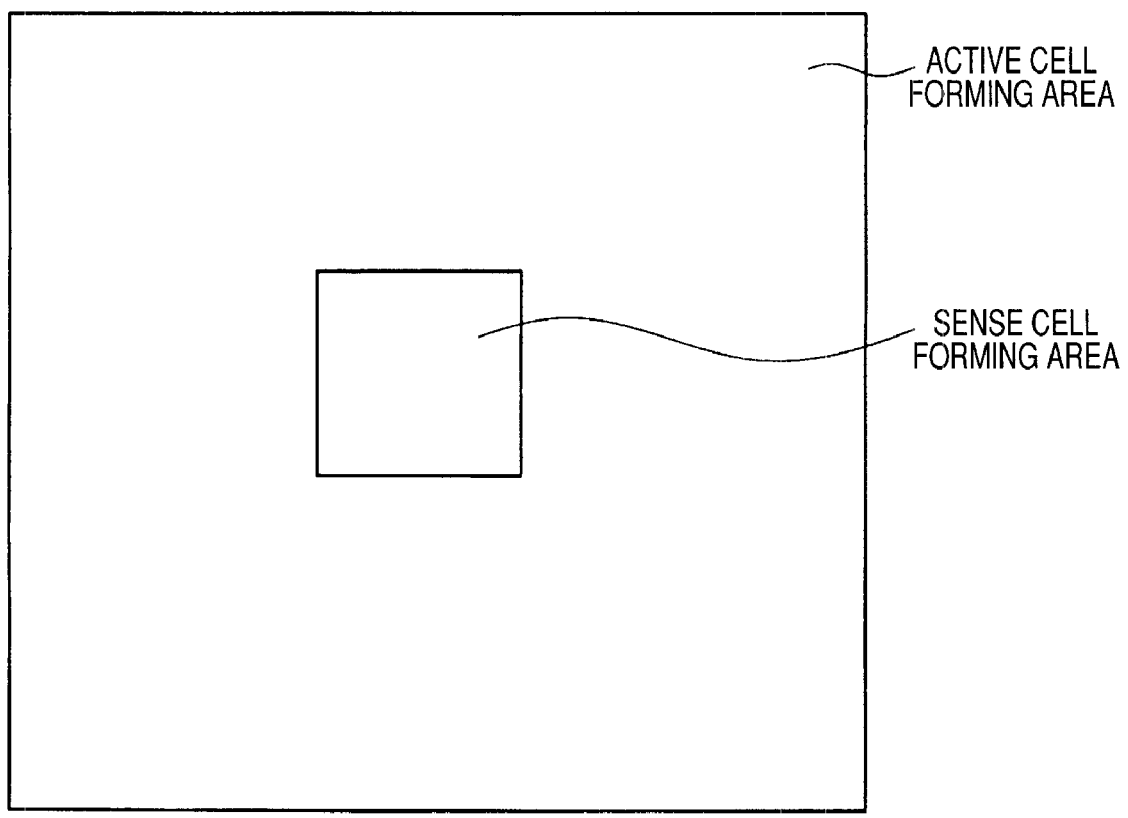
FIG. 11 is a conceptual diagram illustrating where a sense cell forming area is made square in shape.

FIG. 11 is a conceptual diagram showing a case in which the shape of the sense cell forming area is square. Here, the area of the rectangular sense cell forming area shown in FIG. 10 and the area of the square-like sense cell forming area shown in FIG. 11 become equal. It is understood that referring to FIG. 11 under this assumption, the area of contact between the sense cell forming area and the active cell forming area (area of boundary region) becomes small as compared with the case shown in FIG. 10. That is, it is understood that when an attempt is made to reduce the boundary region as small as possible in the same area, the square makes it possible to reduce the boundary region as compared with the rectangle. Namely, as the shape of the sense cell forming area is allowed to approach the square, the leak current generated between the sense and active cells can be reduced. Further, since the shape that can minimize the boundary region in the same area is of a circle, the leak current between the sense and active cells can be reduced even by setting the shape of the sense cell forming area to circular form. It is understood from the above that the shape of the sense cell forming area is brought into the square or circular form, thereby making it possible to reduce the leak current between the sense and active cells.

Figure 12:
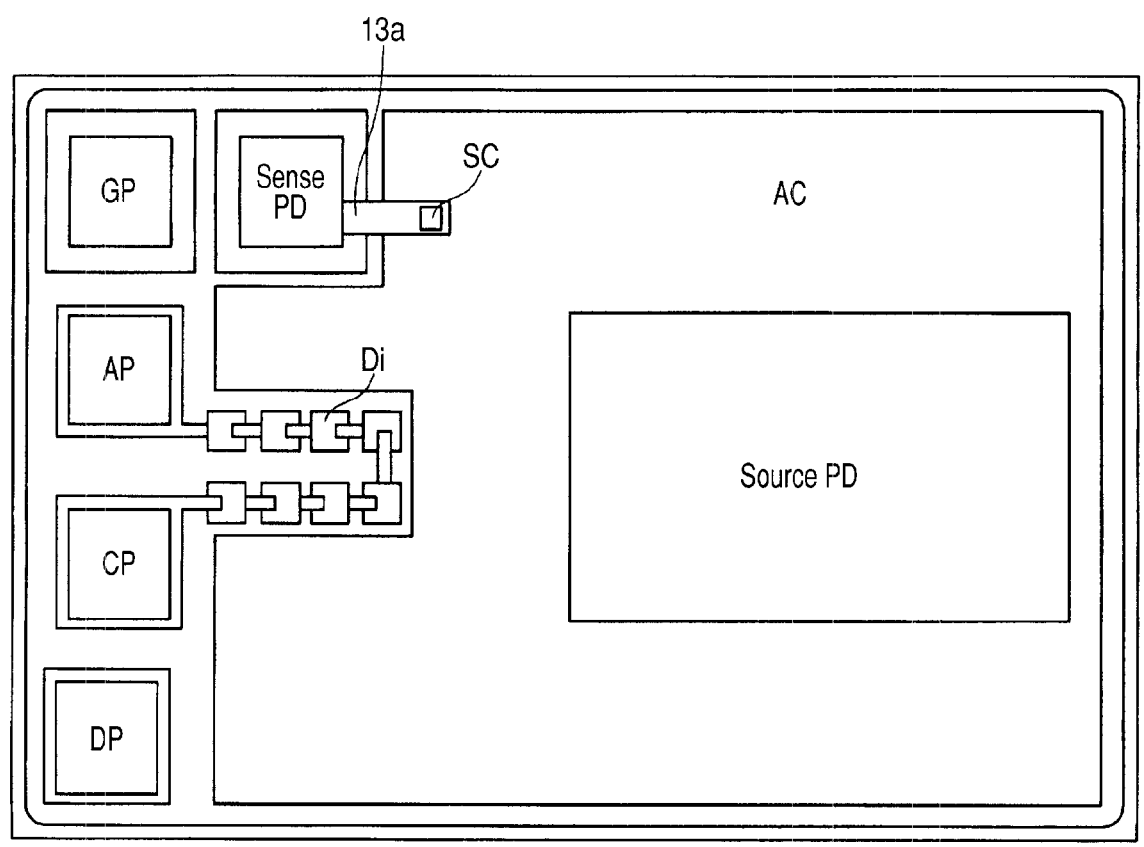
FIG. 12 is a plan view showing an example in which a sense cell is arranged at a peripheral portion of an active cell forming area for forming an active cell.

Subsequently, while each sense cell is formed inside the active cell forming area for forming each active cell, an advantage differs depending on the layout position of each further detailed sense cell even though the active cell is formed thereinside. This point will be explained. FIG. 12 is a plan view showing an example in which a sense cell SC is disposed or laid out at a peripheral portion of an active cell forming area for forming each active cell AC. When the sense cell forming area for forming each sense cell SC is formed at the peripheral portion of the active cell forming area as shown in FIG. 12, the following advantages are obtained. The layout of the sense cell SC at the peripheral portion of the active cell forming area means that the active cell AC is not formed at at least part of the periphery of the sense cell SC. Thus, a sense wiring 13a can be drawn or led out from an area or region formed with no each active cell AC, of the periphery that surrounds the sense cell SC. The sense wiring 13a can be coupled to a sense pad SensePD. Since no active cell AC is formed in the left area or region of the sense cell SC in FIG. 12, for example, the sense wiring 13a can be drawn from the left region of the sense cell SC. Since, at this time, no active cell AC is formed in the left region of the sense cell SC, an advantage is brought about in that no active cell AC is sacrificed upon drawing the sense wiring 13a. Further, since the active cell AC does not exist in the drawing region of the sense wiring 13a, a source wiring is not formed either and the sense wiring 13a can be formed by a first layer wiring of the same layer as the source wiring. As an advantage that the sense cell SC is formed at the peripheral portion of each active cell forming area as described above, the sacrifice of the active cell AC can be minimized and the sense wiring 13a can be formed of the first layer wiring.

Figure 13:
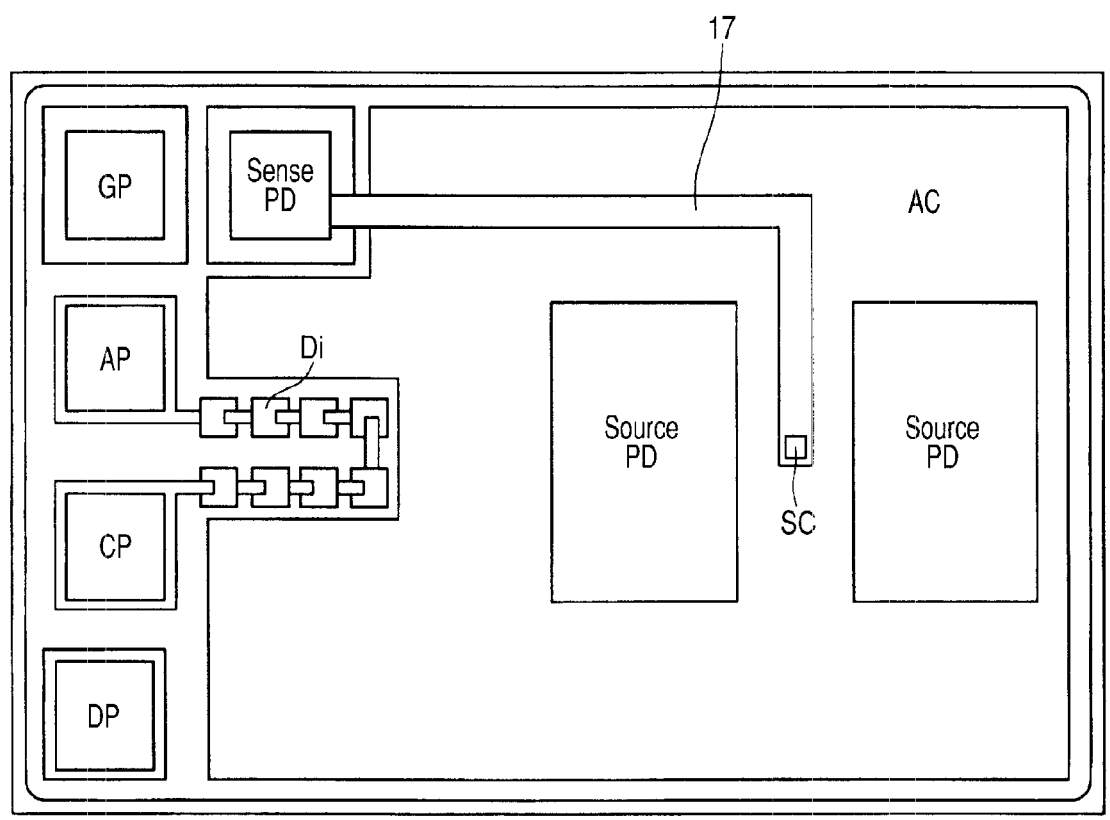
FIG. 13 is a plan view showing an example in which a sense cell is arranged at a central part of an active cell forming area for forming an active cell.

FIG. 13 is a plan view showing an example in which a sense cell SC is disposed or laid out at a central part of an active cell forming area for forming each active cell AC. When a sense cell forming area for forming the sense cell SC is formed at the central part of the active cell forming area as shown in FIG. 13, the following advantages are obtained.

First, the first advantage resides in that since the central part of the active cell forming area is stable in temperature (uniform in temperature) as compared with the peripheral portion of the active cell forming area, the sense cell SC is resistant to a change in temperature and a high-precision current detecting function can be realized by the sense cell SC. Described concretely, since the peripheral portion of the active cell forming area is close to an outer peripheral portion of a semiconductor chip, a variation in characteristic due to a change in outside-air temperature becomes pronounced. On the other hand, since the central part of the active cell forming area exists in the central part of the semiconductor chip, it is not so sensitive to the change in outside-air temperature and the amount of radiation is stable. Therefore, a variation in temperature is low. From this respect, the variation in characteristic due to the change in temperature is hard to occur in both the sense and active cells SC and AC, and a stable current detecting function resistant to the change in temperature can be realized.

Subsequently, the second advantage resides in that the ON operation of the sense cell SC can be delayed with respect to the ON operation of the active cell AC. Described specifically, the sense cell SC is provided at the central part of the active cell forming area, thereby making it possible to increase the parasitic resistance and capacitance of a gate electrode at the sense cell SC. While the gate electrode of the sense cell SC is coupled to its corresponding gate pad GP, it is routed from the gate pad GP to the peripheral region or area of the active cell forming area by means of aluminium wiring. A polysilicon film embedded in each stripe-like trench is electrically coupled to the aluminum wiring. Thus, the layout of the sense cell SC at the central part of the active cell forming area means that the gate electrode of the sense cell SC is coupled from the peripheral portion of the active cell forming area by the polysilicon film (that functions as the gate electrode of each active cell in the active cell forming area) embedded in each trench. Since, at this time, the sense cell SC is disposed at the central part of the active cell forming area, the length of the polysilicon film embedded in each trench also becomes long. Thus, while the gate electrode of the sense cell SC is coupled to the gate pad GP, the parasitic resistance (R) and capacitance (C) of the gate electrode increase with an increase in the length of the polysilicon film that exists between the gate pad GP and the gate electrode of the sense cell SC. From this respect, since the time constant (RC) becomes large until the voltage applied to the gate pad GP is transferred to the gate electrode of the sense cell SC, it becomes late in time. That is, the timing provided to apply the voltage applied to the gate pad GP to the gate electrode of the sense cell SC becomes later than that provided to apply the voltage applied to the gate pad GP to the gate electrode of the active cell AC. This means that the active cell AC is first turned ON and the sense cell SC is turned ON with a delay of a predetermined time.

An advantage that the sense cell SC is delayed in time with respect to the active cell AC will next be explained with reference to FIG. 2. To begin with, consider where the sense cell SC (sense cell $Q_{SE}$ in FIG. 2) is first operated before the active cell AC (main cell $Q_0$ in FIG. 2). In this case, the sense cell $Q_{SE}$ (sense cell SC) is turned ON and the main cell $Q_0$ (active cell AC) is turned OFF in FIG. 2. Since the sense cell $Q_{SE}$ (sense cell SC) is turned ON at this time, the source terminal S2 of the sense cell $Q_{SE}$ (sense cell SC) is brought to the potential close to the power supply potential, whereas since the main cell $Q_0$ (active cell AC) is turned OFF, the source terminal S1 of the main cell $Q_0$ (active cell AC) is brought to the GND potential. Therefore, since a large difference in potential is inputted to the operational amplifier OP in which the source terminal S2 of the sense cell $Q_{SE}$ (sense cell SC) and the source terminal S1 of the main cell $Q_0$ (active cell AC) are used as input terminals, the output of the operational amplifier OP also becomes large. In doing so, the voltage enough to turn ON the switch SW is applied to the gate terminal G2 of the switch SW coupled to the output of the operational amplifier OP. Aa a result, the switch SW is turned ON so that current flows through the sense resistor $R_{SE}$ and the sense voltage $V_{SE}$ corresponding to a predetermined voltage (large voltage close to the power supply potential) is outputted. Thus, the drive circuit Dr inputted with the sense voltage $V_{SE}$ greater than or equal to its threshold voltage controls the main cell $Q_0$ (active cell AC) to turn OFF the main cell $Q_0$. That is, when the sense cell $Q_{SE}$ (sense cell SC) operates previous to the main cell $Q_0$ (active cell AC), the drive circuit Dr controls the main cell $Q_0$ (active cell AC) to turn OFF the main cell $Q_0$ regardless of the main cell $Q_0$ (active cell AC) being turned OFF. This means that the drive circuit controls the main cell $Q_0$ (active cell AC) to turn OFF the main cell $Q_0$ irrespective of the short circuiting or non-short circuiting of the load L. That is, despite of the non-short circuiting of the load L, the main cell $Q_0$ (active cell AC) is turned OFF, so that the load L cannot be driven.

On the other hand, consider where the sense cell $Q_{SE}$ (sense cell SC) operates with a delay with respect to the main cell $Q_0$ (active cell AC). In this case, the sense cell $Q_{SE}$ (sense cell SC) is turned OFF and the main cell $Q_0$ (active cell AC) is turned ON in FIG. 2. Since the main cell $Q_0$ (active cell AC) is turned ON at this time, current flows through the load L via the main cell $Q_0$ (active cell AC). Assuming that the load L is held in the normal state without being short-circuited, the source terminal S1 of the main cell $Q_0$ (active cell AC) becomes a potential close to the power supply potential. On the other hand, when the sense cell $Q_{SE}$ (sense cell SC) is turned ON with a delay, the source terminal S2 of the sense cell $Q_{SE}$ (sense cell SC) is also brought to the potential close to the power supply or source potential. Therefore, since only a small difference in potential is inputted to the operational amplifier OP in which the source terminal S2 of the sense cell $Q_{SE}$ (sense cell SC) and the source terminal S1 of the main cell $Q_0$ (active cell AC) are used as the input terminals, the output of the operational amplifier OP also becomes small. In doing so, the voltage enough to turn ON the switch SW is not applied to the gate terminal G2 of the switch SW coupled to the output of the operational amplifier OP. Aa a result, the switch SW remains OFF, so no current flows through the sense resistor $R_{SE}$ and the sense voltage $V_{SE}$ corresponding to the GND potential is outputted. From this respect, the drive circuit Dr inputted with the sense voltage $V_{SE}$ greater than or equal to its threshold voltage controls the main cell $Q_0$ (active cell AC) to continue to turn ON the main cell $Q_0$. That is, when the sense cell $Q_{SE}$ (sense cell SC) operates with being delayed with respect to the main cell $Q_0$ (active cell AC), the drive circuit controls the main cell $Q_0$ (active cell AC) to allow current to continue to flow therethrough in a state in which the load is not short-circuited, and thereby functions normally.

On the other hand, consider again in a state in which the sense cell $Q_{SE}$ (sense cell SC) is turned OFF and the main cell $Q_0$ (active cell AC) is turned ON in FIG. 2. Since the main cell $Q_0$ (active cell AC) is ON at this time, current flows through the load L via the main cell $Q_0$ (active cell AC). Assuming that the load L is held in a short-circuited state, the source terminal S1 of the main cell $Q_0$ (active cell AC) becomes a potential close to the GND potential. On the other hand, when the sense cell $Q_{SE}$ (sense cell SC) is turned ON with a delay, the source terminal S2 of the sense cell $Q_{SE}$ (sense cell SC) is brought to the potential close to the power supply or source potential. Therefore, since a large difference in potential is inputted to the operational amplifier OP in which the source terminal S2 of the sense cell $Q_{SE}$ (sense cell SC) and the source terminal S1 of the main cell $Q_0$ (active cell AC) are used as the input terminals, the output of the operational amplifier OP also becomes large. In doing so, the voltage enough to turn ON the switch SW is applied to the gate terminal G2 of the switch SW coupled to the output of the operational amplifier OP. Consequently, since the switch SW is turned ON, current flows through the sense resistor $R_{SE}$ and the sense voltage $V_{SE}$ close to the source potential is outputted. From this respect, the drive circuit Dr inputted with the sense voltage $V_{SE}$ greater than or equal to its threshold voltage controls the main cell $Q_0$ (active cell AC) to turn OFF the main cell $Q_0$. That is, when the sense cell $Q_{SE}$ (sense cell SC) operates with being delayed with respect to the main cell $Q_0$ (active cell AC), the drive circuit controls the main cell $Q_0$ (active cell AC) to turn OFF the main cell $Q_0$ in a state in which the load is short-circuited, and thereby functions normally. It is understood from the above that when the sense cell $Q_{SE}$ (sense cell SC) operates with being delayed with respect to the main cell $Q_0$ (active cell AC), the function of turning OFF the main cell $Q_0$ (active cell AC) forcedly is enabled only when the load L is short-circuited, and the normal operation can be performed. It is thus necessary to delay the sense cell SC with respect to the active cell AC in operation. Since the parasitic resistance and capacitance of the gate electrode of the sense cell SC can be increased by providing the sense cell SC at the central part of the active cell forming area, an advantage that the on operation of the sense cell SC can be delayed than that of the active cell AC is obtained.

When, however, the sense cell SC is disposed at the central part of the active cell forming area for forming each active cell AC, there is a need to lengthen a sense wiring 17 for coupling the sense cell SC and its corresponding sense pad SensePD as shown in FIG. 13. When, for example, the sense wiring 17 is formed of a first layer wiring of the same layer as a source wiring, each active cell AC cannot be laid out in an area or region for forming the sense wiring 17 from the above point of view. That is, when the sense wiring 17 is formed of the same layer as the source wiring, each active cell AC cannot be formed in a lower region of the sense wiring 17, so that a considerable number of active cells AC must be sacrificed.

Therefore, when the sense cell SC is disposed in the central part of the active cell forming area, it is desirable that the sense wiring 17 for coupling the sense cell SC and the sense pad SensePD is formed in a layer (second layer wiring) above the source wiring. Laying out the sense wiring 17 in the layer above the source writing in this way makes it possible to form each active cell AC and the source wiring even in the region below the sense wiring 17. That is, even when the sense wiring 17 is routed from the central part of the active cell forming area to the sense pad SensePD, an advantageous effect is obtained in that there is no need to sacrifice the considerable number of active cells AC.

Figure 14:
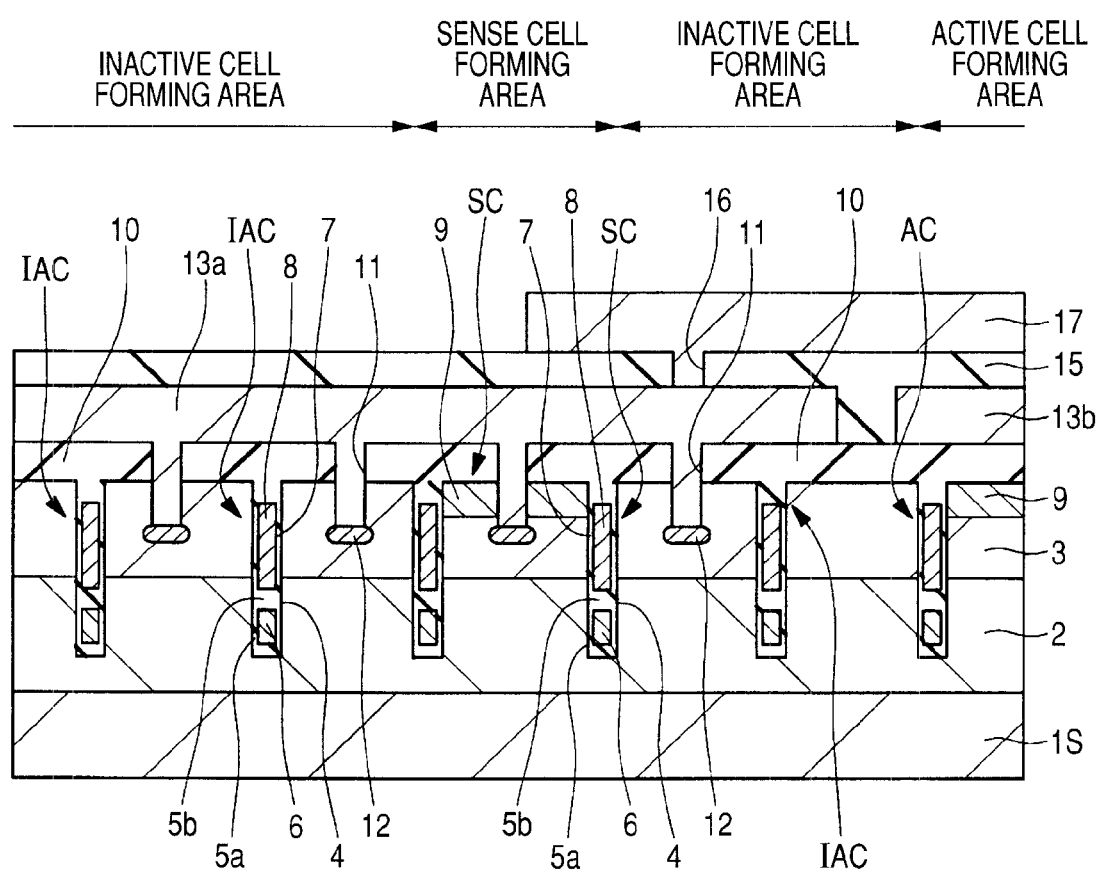
FIG. 14 is a sectional view illustrating an example in which a detection wiring is disposed in a layer above a source wiring.

FIG. 14 is a sectional view showing an example in which a sense wiring 17 is disposed in a layer above a source wiring 13b. As shown in FIG. 14, a sense wiring 13a and the source wiring 13b are formed over an interlayer insulating film 10, and an interlayer insulating film 15 is formed over the sense wiring 13a and the source wiring 13b. The sense wiring 17 is formed over the interlayer insulating film 15. The sense wiring 17 configures a second layer wiring and is coupled via a corresponding plug 16 to the sense wiring 13a that forms a first layer wiring. The sense wiring 17 extends to an active cell forming area and finally reaches an unillustrated sense pad SensePD. In the active cell forming area, the source wiring 13b and its corresponding active cell AC are formed in a layer below the sense wiring 17. It is therefore understood that an advantageous effect is obtained in that even when the sense wiring 17 is routed from the central part of the active cell forming area to the sense pad SensePD, there is no need to sacrifice quite a few active cells AC.

Figure 15:
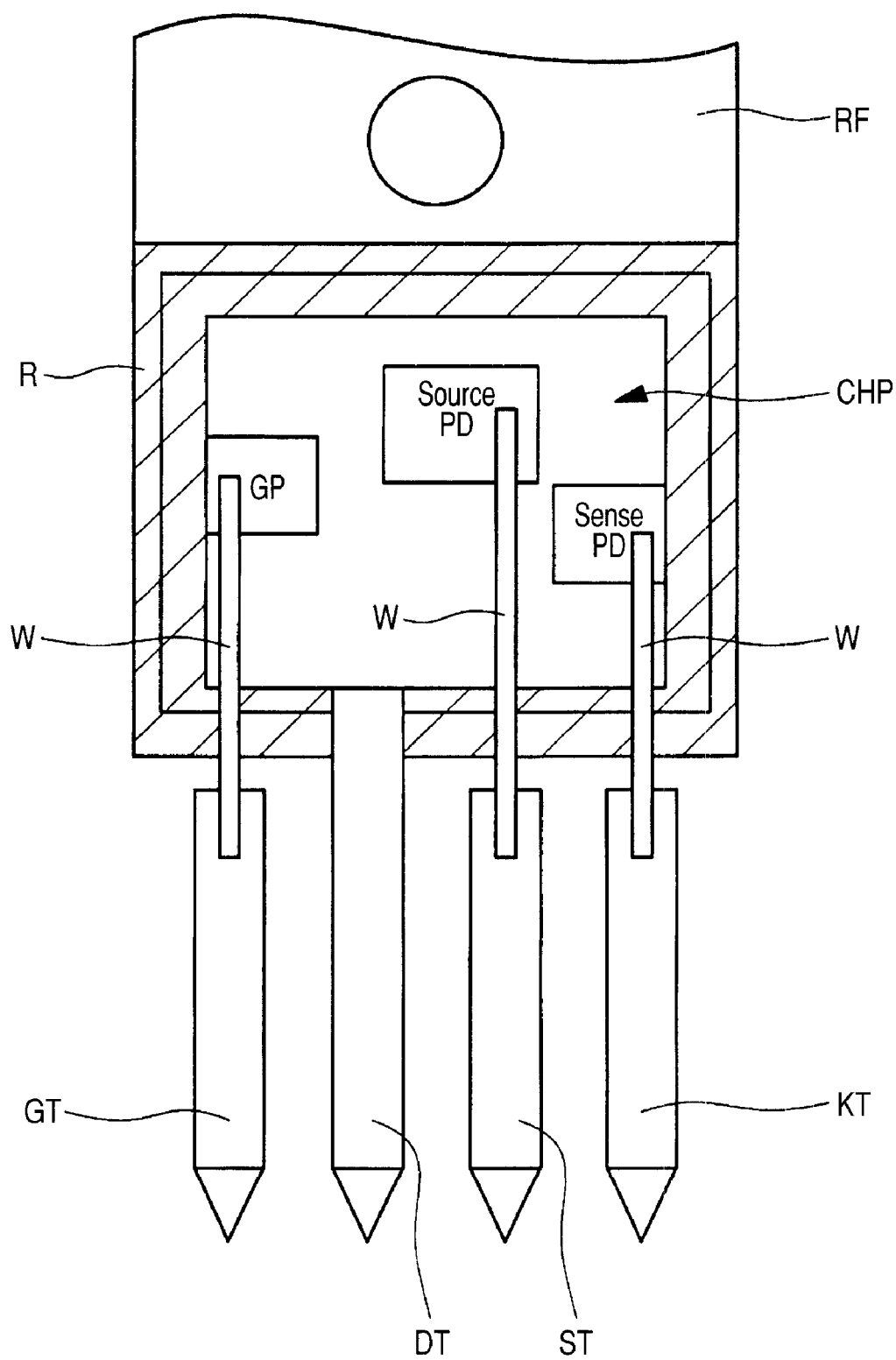
FIG. 15 is a diagram showing an example in which a semiconductor chip is mounted onto a lead frame.

A description will next be made of an example in which a semiconductor chip CHP formed with the power MISFET according to the first embodiment is mounted. FIG. 15 is a diagram showing an example in which the semiconductor chip CHP is mounted onto a lead frame. In FIG. 15, the semiconductor chip CHP is mounted onto its corresponding lead frame RF. The power MISFET according to the first embodiment is formed in the semiconductor chip CHP. The periphery of the semiconductor chip CHP is sealed with a resin R. For example, a gate pad GP, a source pad SourcePD and a sense pad SensePD are formed in the central part on the main surface side, of the semiconductor chip CHP. On the other hand, the back surface of the semiconductor chip CHP serves as a drain pad (not shown).

At this time, the gate pad GP is coupled to a gate terminal GT using a wire W, and the source pad SourcePD is coupled to a source terminal ST using a wire W. Likewise, the sense pad SensePD is coupled to a sense terminal KT using a wire W, and the drain pad is coupled to a drain terminal DT. According to the semiconductor device configured in this way, a current detecting or sensing function of the power MISFET that configures the semiconductor device can be brought to high accuracy. It is therefore possible to obtain an advantageous effect that the breakdown of the load coupled to the semiconductor device due to its short-circuit can be prevented sufficiently.

Second Embodiment

Figure 16:
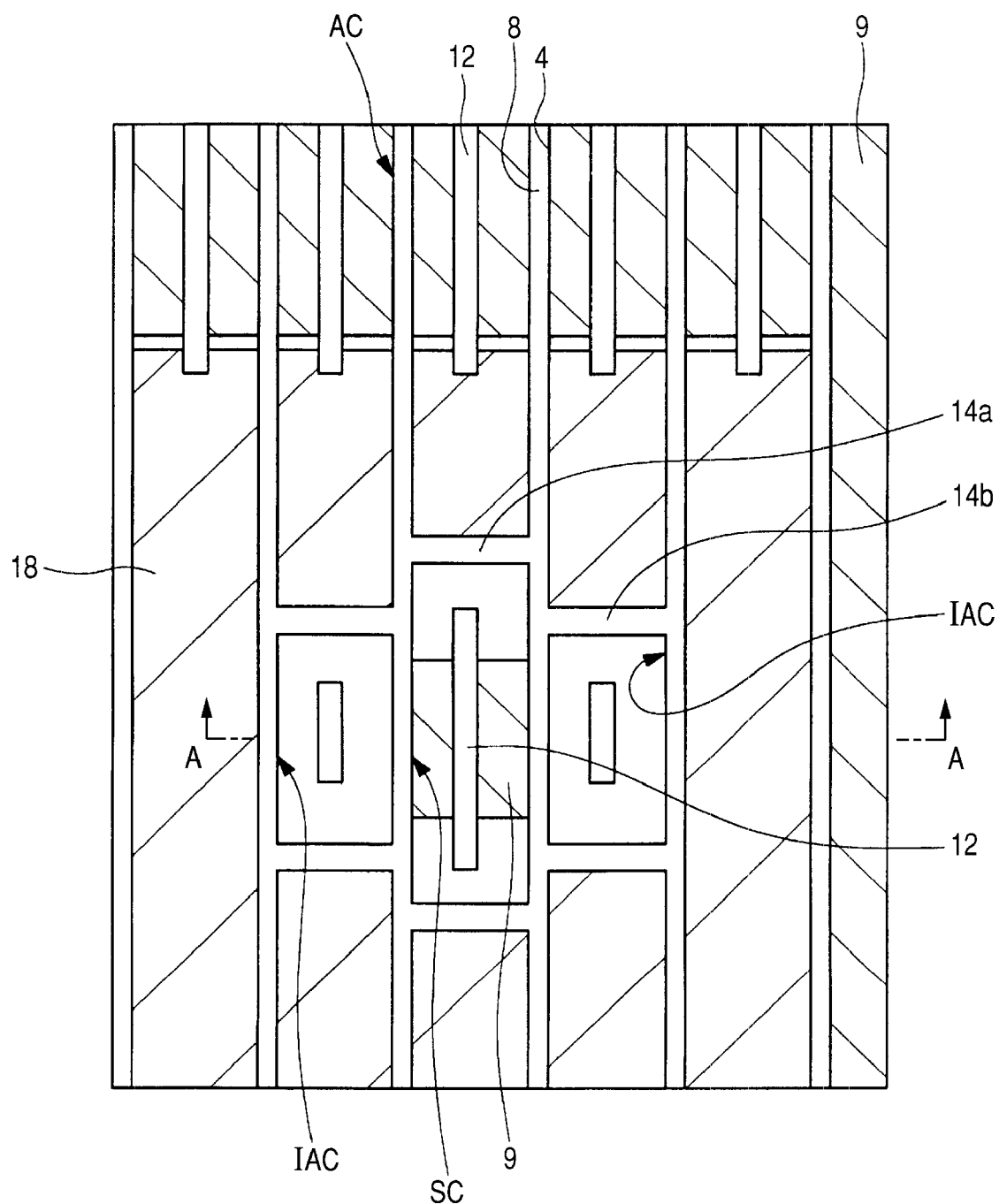
FIG. 16 is a plan view depicting part of a power MISFET according to a second embodiment.

The present embodiment will explain a configuration of a power MISFET capable of enhancing a breakdown voltage (BVdss) in addition to the configuration of the first embodiment. FIG. 16 is a plan view showing part of the power MISFET according to the second embodiment. FIG. 16 shows an active cell AC corresponding to the power MISFET, a sense cell SC for current detection, and inactive cells IAC provided around a sense cell SC to separate the active cell AC and the sense cell SC from each other. This configuration is similar to the first embodiment. The active cell AC, the sense cell SC and the inactive cells IAC comprise a trench gate type power MISFET. Here, the power MISFET according to the second embodiment differs from the power MISFET according to the first embodiment in that an electric field relaxation layer 18 is provided in a peripheral area or region that surrounds the sense cell SC. The electric field relaxation layer 18 comprises a p-type semiconductor region.

Figure 17:
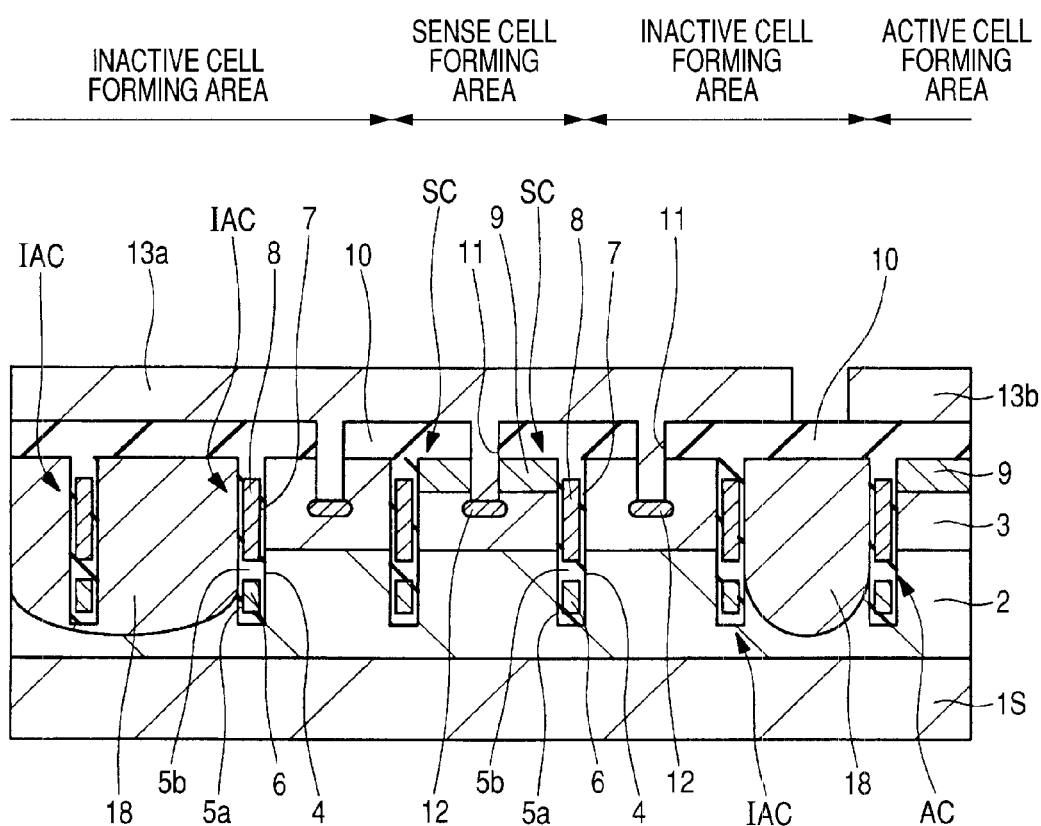
FIG. 17 is a sectional view cut along line A-A of FIG. 16.

FIG. 17 is a sectional view cut along line A-A of FIG. 16. As shown in FIG. 17, inactive cell forming areas are provided on both sides of a sense cell forming area. Further, an active cell forming area is formed outside the right inactive cell forming area. The inactive cells IAC are formed so as to surround each sense cell SC formed in the sense cell forming area. The electric field relaxation layer 18 is formed outside the inactive cells IAC. The electric field relaxation layer 18 is formed in each inactive cell forming area, and the active cell AC is formed outside the electric field relaxation layer (right side) 18.

The electric field relation layer 18 formed in the second embodiment is formed from a region in which a channel forming region 3 is formed, to a region that reaches the inside of an n-type epitaxial layer 2. That is, the regions corresponding to parts of the channel forming region 3 and the n-type epitaxial layer 2 in each inactive cell forming area serve as the electric field relaxation layer 18 in the second embodiment. The electric field relaxation layer 18 is formed of a p-type semiconductor region with a p-type impurity introduced therein and identical to the channel forming region 3 formed of the p-type semiconductor region in this respect. In the channel forming region 3, however, the concentration of the introduced p-type impurity is decided in such a manner that an inversion layer (n-type semiconductor region) is formed where a predetermined voltage is applied to the corresponding gate electrode 8. That is, the impurity concentration of the channel forming region 3 is decided from the viewpoint that the inversion layer is formed where the predetermined gate voltage is applied. It cannot be said that the breakdown voltage (pn-junction breakdown voltage between channel forming region 3 and n-type epitaxial layer 2) is brought into optimization.

On the other hand, the electric field relaxation layer 18 is not formed for the purpose of forming the inversion layer, but formed for the purpose of ensuring the breakdown voltage (electric field relaxation layer 18 and n-type epitaxial layer 2). That is, since the electric field relaxation layer 18 corresponds to the region in which it is formed in the inactive cell forming area formed with each inactive cell non-operated as the power MISFET, there is no need to dare to form the inversion layer where a predetermined gate voltage is applied. Accordingly, the impurity concentration of the electric field relaxation layer 18 needs not to consider the formation of the inversion layer and can be determined from the viewpoint that the breakdown voltage is ensured sufficiently. From this respect, the impurity concentration of the electric field relaxation layer 18 can be determined under the condition optimum to ensure the breakdown voltage. Thus, according to the power MISFET of the second embodiment, an advantageous effect similar to the first embodiment is obtained. Further, such an outstanding advantageous effect that the breakdown voltage can be enhanced is obtained. Incidentally, the electric field relaxation layer 18 is set to the same potential as the source region, for example.

Third Embodiment

Although the first embodiment has explained the configuration in which the leak current developed between the sense cell SC and the active cell AC is reduced, the present embodiment will also explain an example of another configuration in which a leak current developed between a sense cell SC and an active cell AC can be reduced, and a configuration example capable of realizing a further reduction in the leak current.

Figure 18:
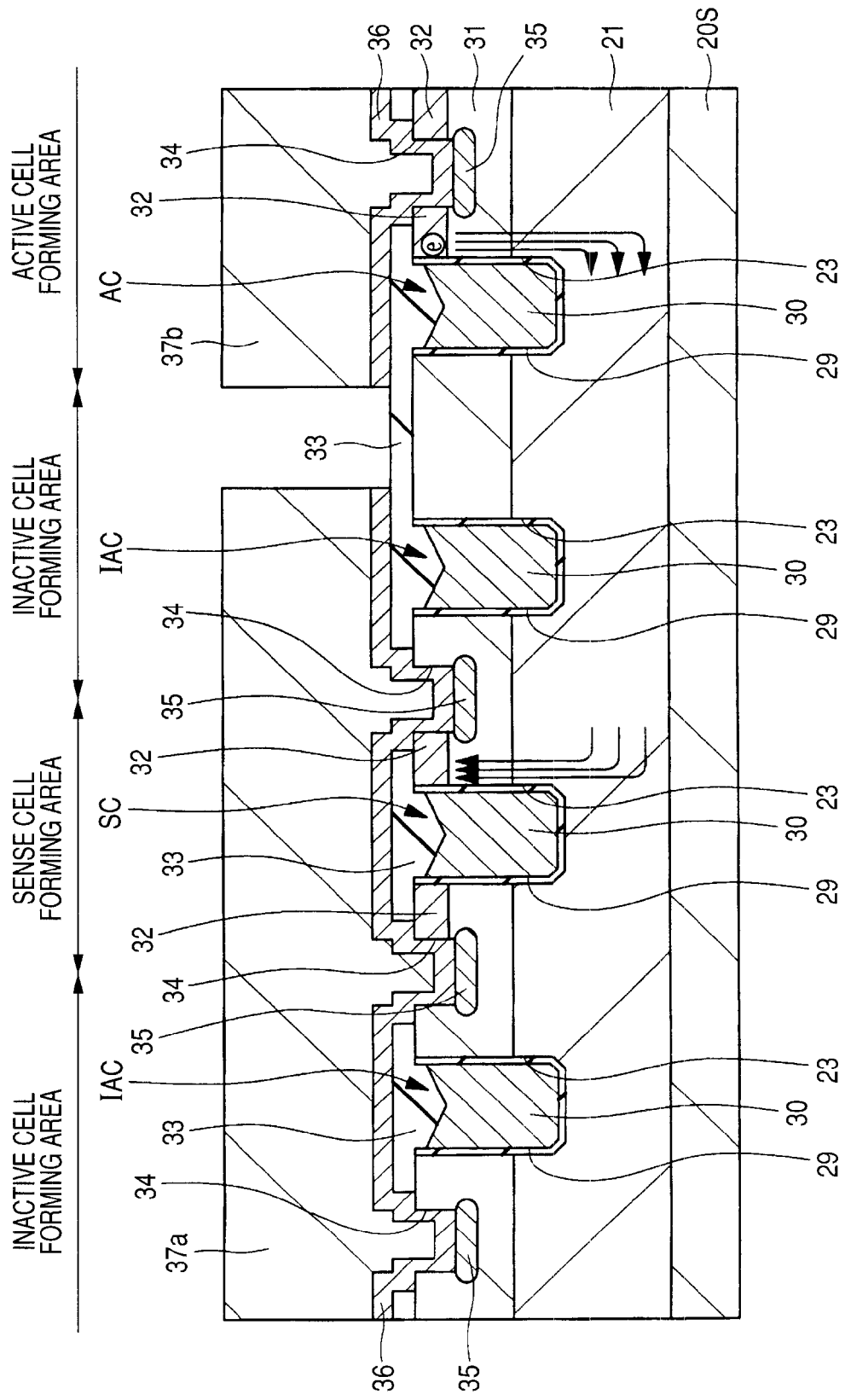
FIG. 18 is a sectional view showing a structure in which leak current between a sense cell and an active cell presents a problem.

FIG. 18 is a sectional view showing a structure in which a leak current developed between a sense cell SC and an active cell AC presents a problem. The sense cell SC, active cell AC and inactive cells IAC are illustrated in FIG. 18. A description will first be made of a configuration of a sense cell SC formed in its corresponding sense cell forming area. In FIG. 18, an n-type epitaxial layer 21 in which an n-type impurity such as phosphorus or arsenic has been introduced, is formed over a semiconductor substrate 20S. A channel forming region (semiconductor region for channel formation) 31 is formed over the n-type epitaxial layer 21. A p-type impurity such as boron (B) or the like is introduced in the channel forming region 31. The semiconductor substrate 20S serves as a drain region for the sense cell SC. A source region 32 comprised of an n-type semiconductor region is formed over the channel forming region 31.

Trenches 23 each extending in the direction (direction of thickness of semiconductor substrate 20S) orthogonal to a main surface of the semiconductor substrate 20S are formed over the main surface of the semiconductor substrate 20S. Each of the trenches 23 is formed in alignment with the source region 32 and formed so as to penetrate from the main surface of the semiconductor substrate 20S to the channel forming region 31 and to be terminated in the neighborhood of the boundary between the n-type epitaxial layer 21 and the channel forming region 31. A gate electrode 30 is embedded within each trench 23 via a gate insulating film 29 interposed therebetween. The gate electrode 30 is comprised of, for example, a polysilicon film.

The gate electrode 30 is of a control electrode used for the sense cell. A voltage for controlling the operation of the sense cell is to be applied to the gate electrode 30. The upper surface of the gate electrode 30 is set slightly lower than the main surface (upper surface of source region 32) of the semiconductor substrate 20S. A channel for the sense cell is formed in the channel forming region 31 opposite to the side surface of the gate electrode 30. Namely, a channel current for the sense cell flows in the direction of the thickness of the semiconductor substrate 20S along the side surface of each trench 23.

Each body contact trench 34 is formed on the lateral sides of the trenches 23 in which the gate electrodes 30 are embedded, with the source region 32 being interposed therebetween. Each plug is formed by embedding a conductor film into the body contact trench 34. A p-type semiconductor region 35 used as a body contact region is formed at the bottom of each body contact trench 34. The p-type semiconductor region 35 used as the body contact region is formed with the aim of taking reliable ohmic contact with each plug and its corresponding channel forming region 31 and suppressing the operation of a parasitic bipolar transistor. The source region 32 and the p-type semiconductor region 35 are electrically coupled via the corresponding plug. The plug penetrates an interlayer insulating film 33 and is electrically coupled to a sense wiring 37a formed over the interlayer insulating film 33. The sense wiring 37a comprises, for example, an aluminium film or an aluminium alloy film formed over a titanium tungsten film 36. On the other hand, a drain electrode (not shown) is formed over the back surface opposite to the main surface of the semiconductor substrate 20S. The drain electrode is comprised of, for example, a laminated or layered film of a titanium (Ti) film, a nickel (Ni) film and a gold (Au) film. The sense cell SC is configured in this way.

While the configuration of the active cell AC will next be explained, the active cell AC is similar to the above sense cell SC in configuration. However, the plug for the active cell AC is coupled to a source wiring 37b. Further, although each inactive cell IAC is also basically equal to the sense cell SC in configuration, the former are different from latter in that the source region 32 is not provided. Thus, since no source region 32 is formed in the inactive cell IAC, it does not operate as the power MOSFET. That is, the inactive cell IAC and the sense cell SC are similar in configuration except for non-provision of the source region 32.

In the power MISFET configured in this way, the bottom of each trench 23 is formed only up to the neighborhood of the boundary between the channel forming region 31 and the n-type epitaxial layer 21. Thus, since the sense cell SC and the active cell AC are coupled to each other in the region equivalent to the thickness of the n-type epitaxial layer 21, a current path is formed which proceeds in a lateral direction from the source region 32 of the sense cell SC to the region corresponding to the thickness of the n-type epitaxial layer 21 and reaches the source region 32 of the active cell AC. Therefore, a leak current of non-negligible extent flows between the source region 32 of the sense cell SC and the source region 32 of the active cell AC in the power MISFET shown in FIG. 18. Incidentally, since the leak current is represented as an electron's flow in FIG. 18, electrons are shown in the figure so as to flow from the active cell AC to the sense cell SC.

Figure 19:
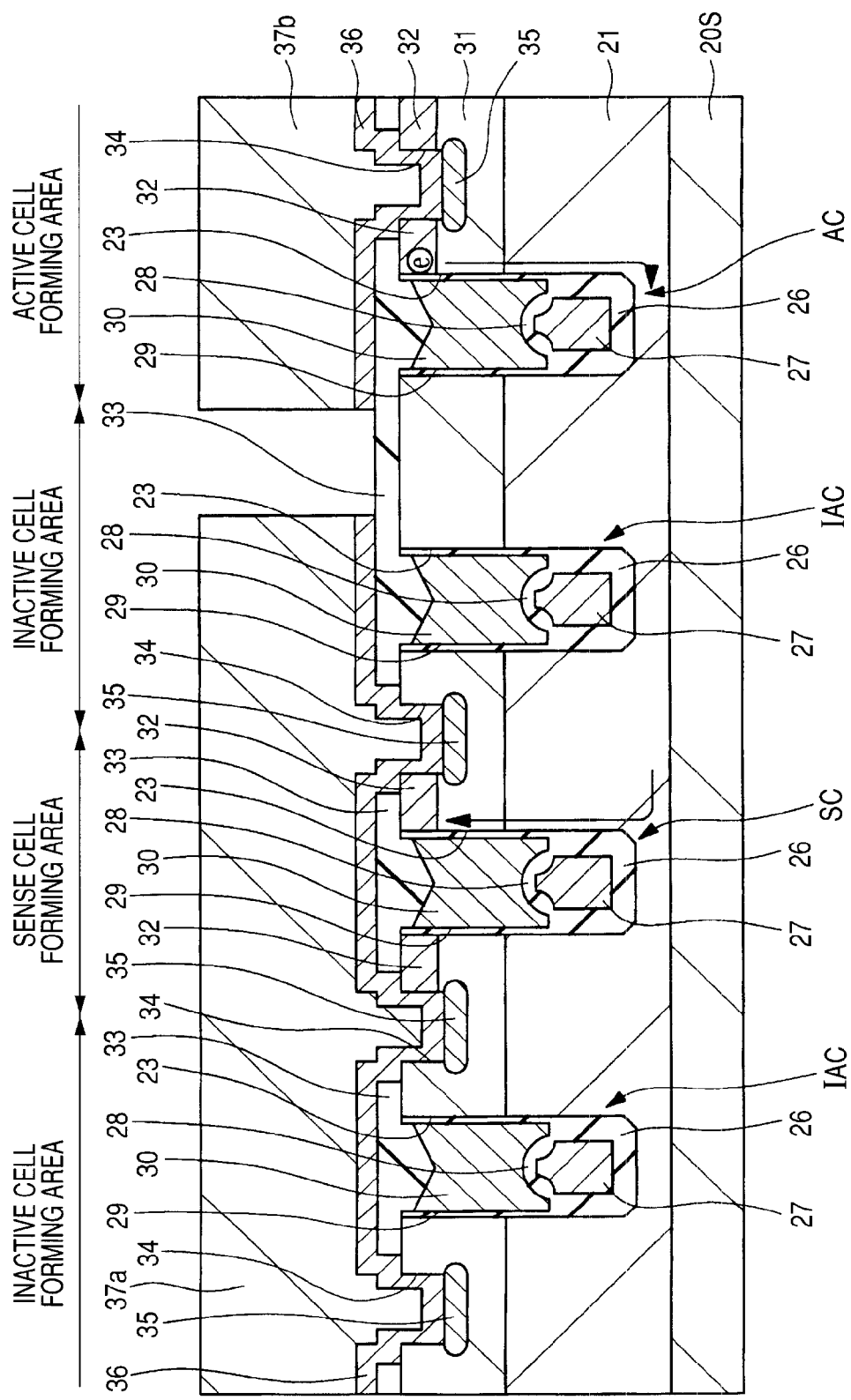
FIG. 19 is a sectional view in which all of sense, active and inactive cells respectively comprise a trench gate type power MISFET having a dummy gate electrode.

Thus, in the first embodiment, all of the sense cell SC, active cell AC and inactive cells IAC are respectively configured as the trench gate type power MISFET provided with the dummy gate electrode. FIG. 19 is a sectional view showing a section of a trench gate type power MISFET provided with a dummy gate electrode, which configures all of a sense cell SC, an active cell AC and inactive cells IAC. As shown in FIG. 19, an insulating film 26 is formed at the bottom of each trench 23, and a dummy gate electrode 27 is formed over the insulating film 26. An insulating film 28 is formed over each dummy electrode 27 and a gate electrode 30 is formed over the insulating film 28. A gate insulating film 29 is formed between the gate electrode 30 and the side surface of each trench 23. FIG. 19 is similar to FIG. 18 in configuration other than the above.

The characteristic of the present structure resides in that the depth of each trench 23 is made deep by the provision of the dummy gate electrode 27 in the trench 23. As shown in FIG. 19, each of the trenches 23 extends through a channel forming region 31 and further reaches the deep inside of an n-type epitaxial layer 21. Thus, the structure shown in FIG. 19 is different from the structure shown in FIG. 19, and most regions each equivalent to the thickness of the n-type epitaxial layer 21 are cut off or blocked by the trenches 23. Therefore, only a slight region of the n-type epitaxial layer 21 to which each trench 23 does not attain as viewed from the source region 32 of the sense cell SC, can be a current path for coupling the source region 32 of the sense cell SC and the source region 32 of the active cell AC. Namely, since the current path for coupling the source region 32 of the sense cell SC and the source region 32 of the active cell AC becomes narrow, leak current can be reduced. This technical characteristic resides in that the depth of each trench 23 is made deep thereby to narrow the current path for the leak current. Thus, if the depth of each trench 23 can be made deep, then each dummy gate electrode 27 is not necessarily provided in terms of a reduction in leak current.

Figure 20:
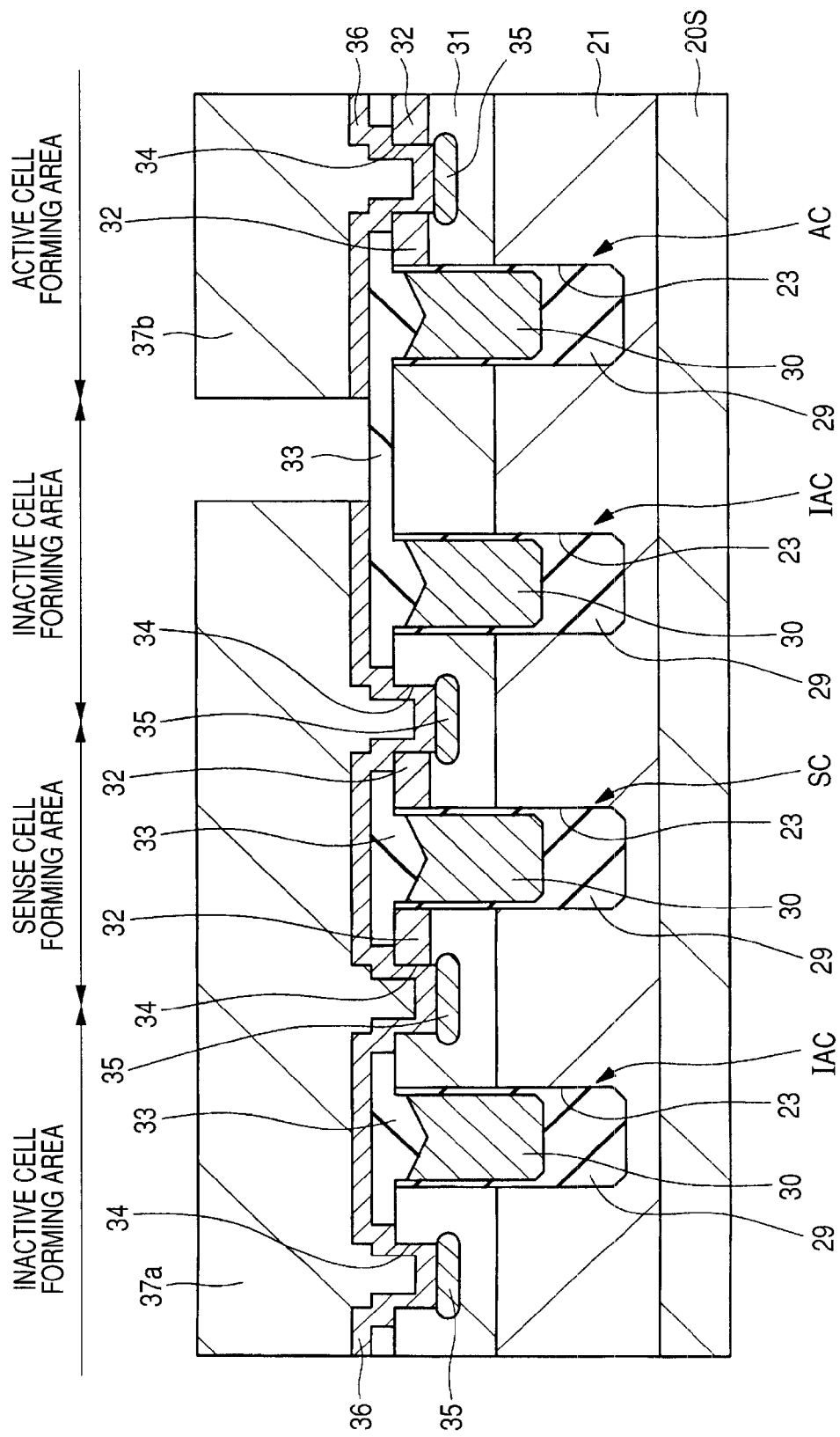
FIG. 20 is an example of a trench gate type power MISFET deep in trench depth.

FIG. 20 shows one example of a trench gate type power MISFET in which the depth of each trench 23 is made deep. While the trench gate type power MISFET shown in FIG. 20 does not have a dummy gate electrode, the depth of the trench 23 is formed deep sufficiently. Each of the trenches 23 penetrates a channel forming region 31 and further reaches the deep inside of an n-type epitaxial layer 21. While the trench 23 is made deep in this way, the thickness of a gate insulating film 29 formed in a portion below each gate electrode 30 is formed thick without changing the depth of the gate electrode 30.

Thus, since most regions each equivalent to the thickness of the n-type epitaxial layer 21 are cut off or blocked by the trenches 23 in the structure shown in FIG. 20, only a slight region of the n-type epitaxial layer 21 to which each trench 23 does not attain as viewed from a source region 32 of a sense cell SC, can be a current path for coupling the source region 32 of the sense cell SC and a source region 32 of an active cell AC. Namely, since the current path for coupling the source region 32 of the sense cell SC and the source region 32 of the active cell AC becomes narrow, leak current can be reduced.

Figure 21:
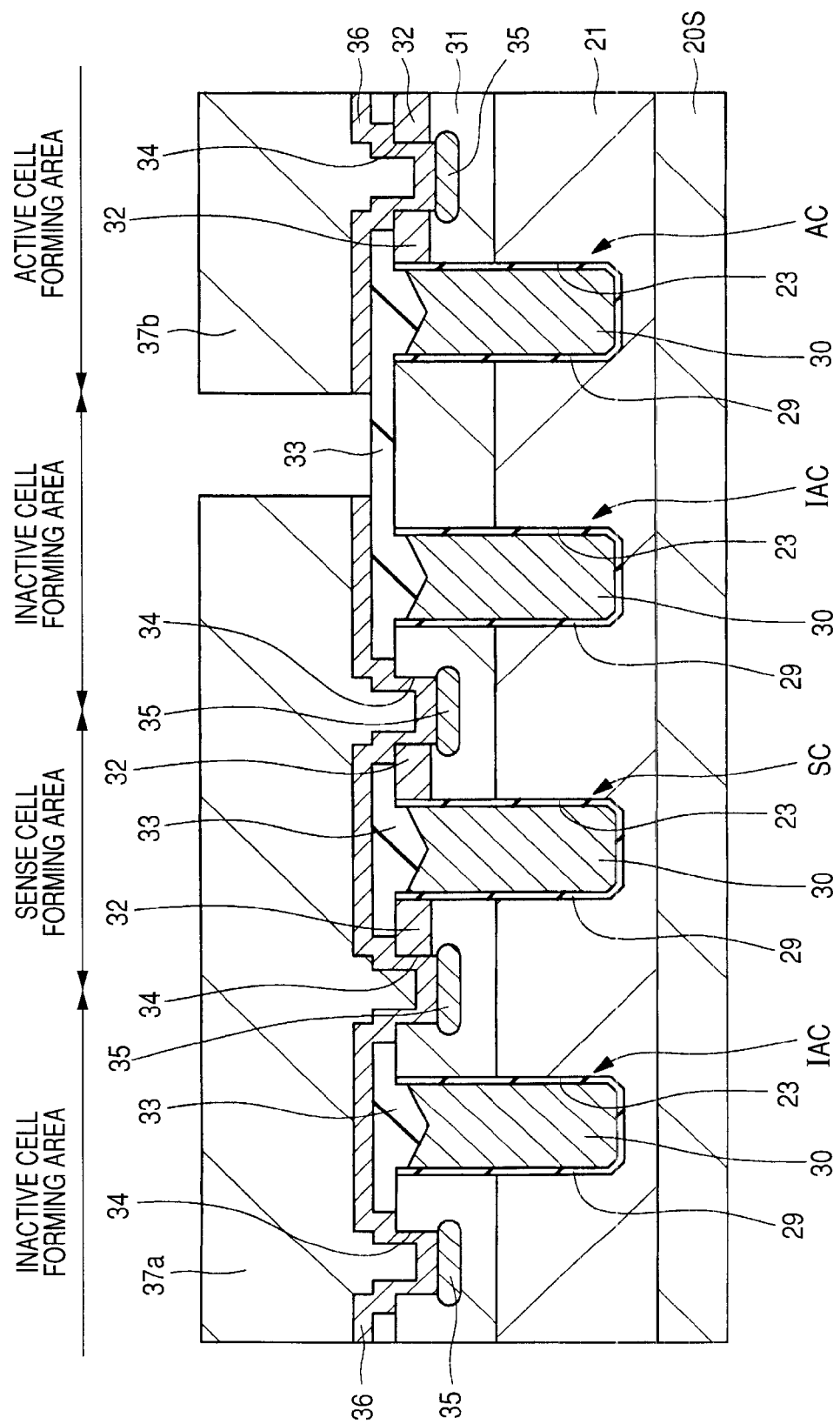
FIG. 21 is another example of a trench gate type power MISFET deep in trench depth.

FIG. 21 shows another example of a trench gate type power MISFET in which the depth of each trench 23 is made deep. While the trench gate type power MISFET shown in FIG. 21 does not have a dummy gate electrode, the depth of the trench 23 is made deep sufficiently. Each of the trenches 23 extends through a channel forming region 31 and further reaches the deep inside of an n-type epitaxial layer 21. The depth of a gate electrode 30 embedded in each trench 23 is also made deep in association with deepening of each trench 23. The thickness of a gate insulating film 29 formed in a portion below the gate electrode 30 is set to a thickness equivalent to that of the gate insulating film 29 formed over the side surface of the trench 23.

Thus, since most regions each equivalent to the thickness of the n-type epitaxial layer 21 are cut off or blocked by the trenches 23 in the structure shown in FIG. 21, only a slight region of the n-type epitaxial layer 21 to which each trench 23 does not attain as viewed from a source region 32 of a sense cell SC, can be a current path for coupling the source region 32 of the sense cell SC and a source region 32 of an active cell AC. Namely, since the current path for coupling the source region 32 of the sense cell SC and the source region 32 of the active cell AC becomes narrow, leak current can be reduced.

In the structures shown in FIGS. 19 through 21, the depth of each trench 23 is formed up to the deep region lying inside the n-type epitaxial layer 21, thereby making it possible to narrow the current path for the leak current. It is therefore possible to reduce the leak current generated between the sense cell SC and the active cell AC. Since, however, each trench 23 does not penetrate the n-type epitaxial layer 21 completely while the depth of the trench 23 is formed deep, the leak current that flows in the lateral direction of the n-type epitaxial layer 21 cannot be blocked completely. Therefore, such a structure that leak current that flows in a lateral direction of an n-type epitaxial layer 21 can be further suppressed in a trench gate type power MISFET to be shown below will be explained.

Figure 22:
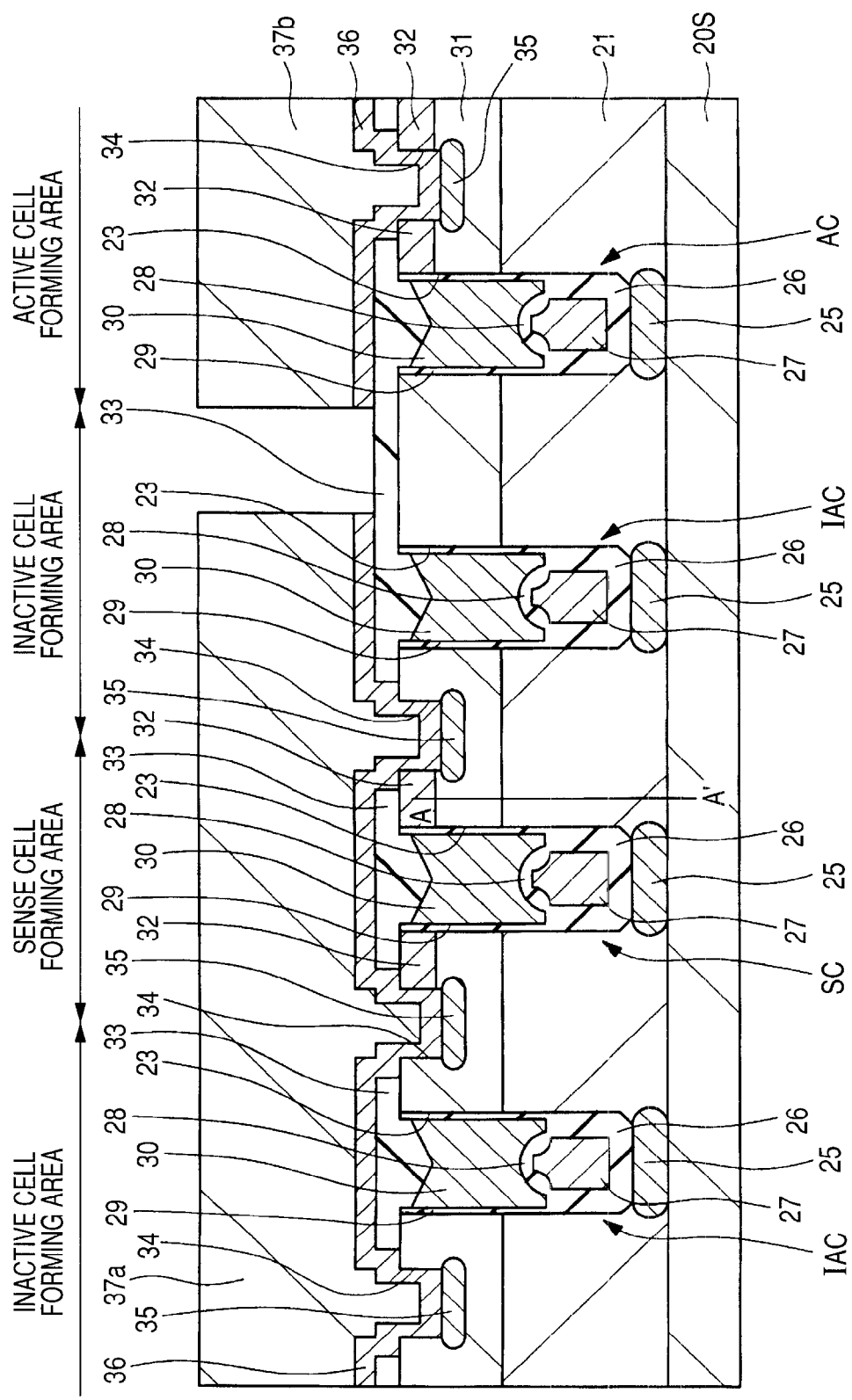
FIG. 22 is a sectional view showing one example of a trench gate type power MISFET according to a third embodiment.

FIG. 22 is a sectional view showing the trench gate type power MISFET according to the third embodiment. In FIG. 22 in a manner similar to FIG. 19, dummy electrodes 27 are provided inside trenches 23 respectively, and the depth of each trench 23 is deep. Described specifically, each of the trenches 23 extends through a channel forming region 31 and further reaches the deep inside of an n-type epitaxial layer 21. However, the trench 23 does not reach the bottom of the n-type epitaxial layer 21. Therefore, there is a fear that a slight leak current flows between a sense cell SC and an active cell AC via the n-type epitaxial layer 21 to which the trench 23 does not attain. Thus, a p-type semiconductor region 25 is provided between a lower portion of each trench 23 and the bottom (also contactable with a semiconductor substrate 20S) of the n-type epitaxial layer 21 in the trench gate type power MISFET shown in FIG. 22. With such a configuration, the n-type epitaxial layer 21 is completely separated from the trench 23 by the p-type semiconductor region 25. That is, since the n-type epitaxial layer 21 is of an n-type semiconductor region, the n-type epitaxial layer 21 can be electrically isolated from the trench 23 by forming the p-type semiconductor region 25 at the bottom of the trench 23. Namely, a leak current path extending via the n-type epitaxial layer 21 existing in the lower portion of each trench 23 can be blocked completely by forming the p-type semiconductor region 25. From this respect, the leak current generated between the sense cell SC and the active cell AC can be further reduced in the trench gate type power MISFET shown in FIG. 22. At this time, it is desirable that the p-type semiconductor region 25 formed in the lower portion of the trench 23 reaches the bottom of the n-type epitaxial layer 21 in terms of a reduction in the leak current. However, leak current can be reduced sufficiently even when a p-type semiconductor region 25 formed in a lower portion of each trench 23 does not attain the bottom of an n-type epitaxial layer 21 as shown in FIG. 23.

Figure 23:
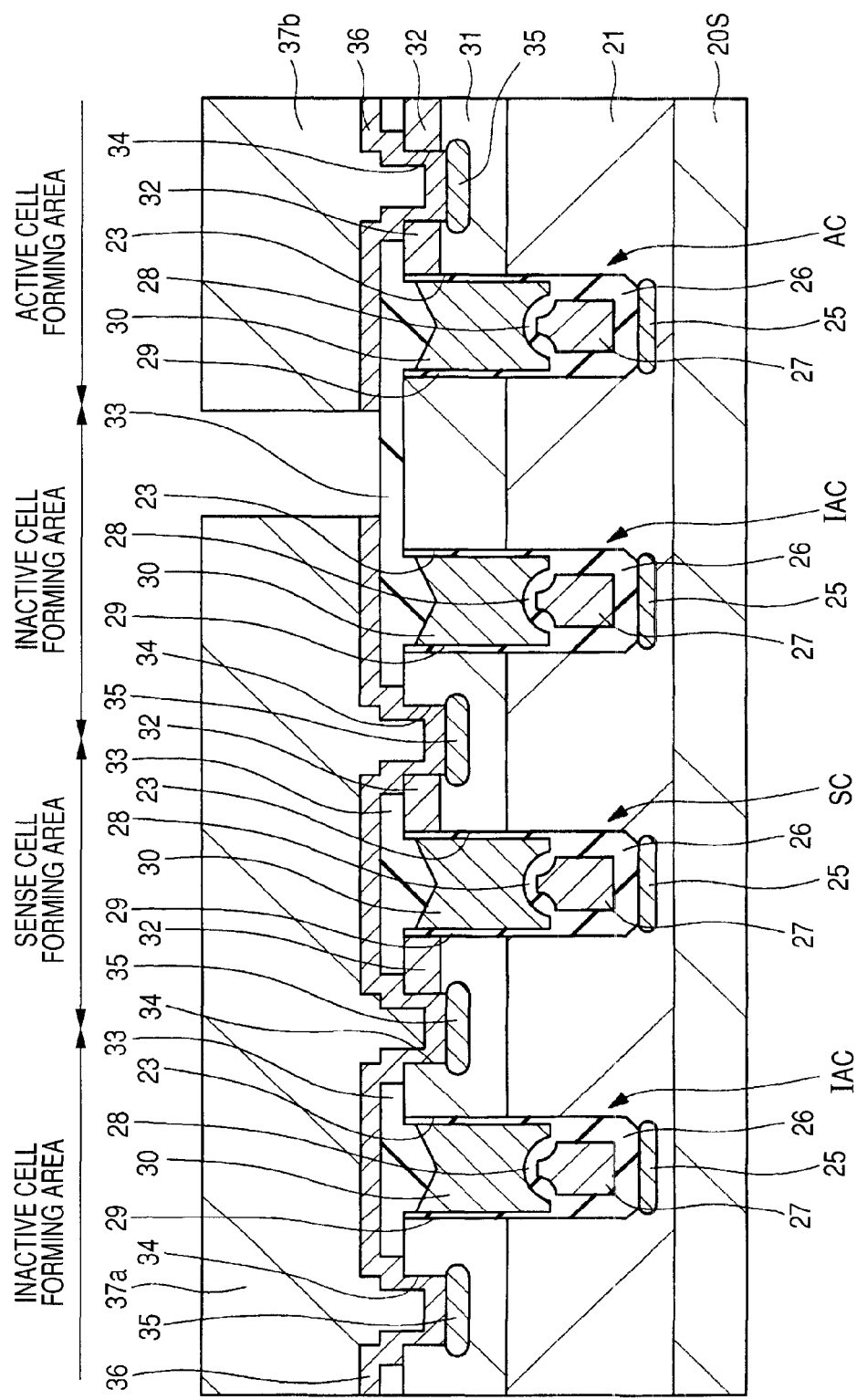
FIG. 23 is a sectional view illustrating one example of the trench gate type power MISFET according to the third embodiment.
Figure 24:
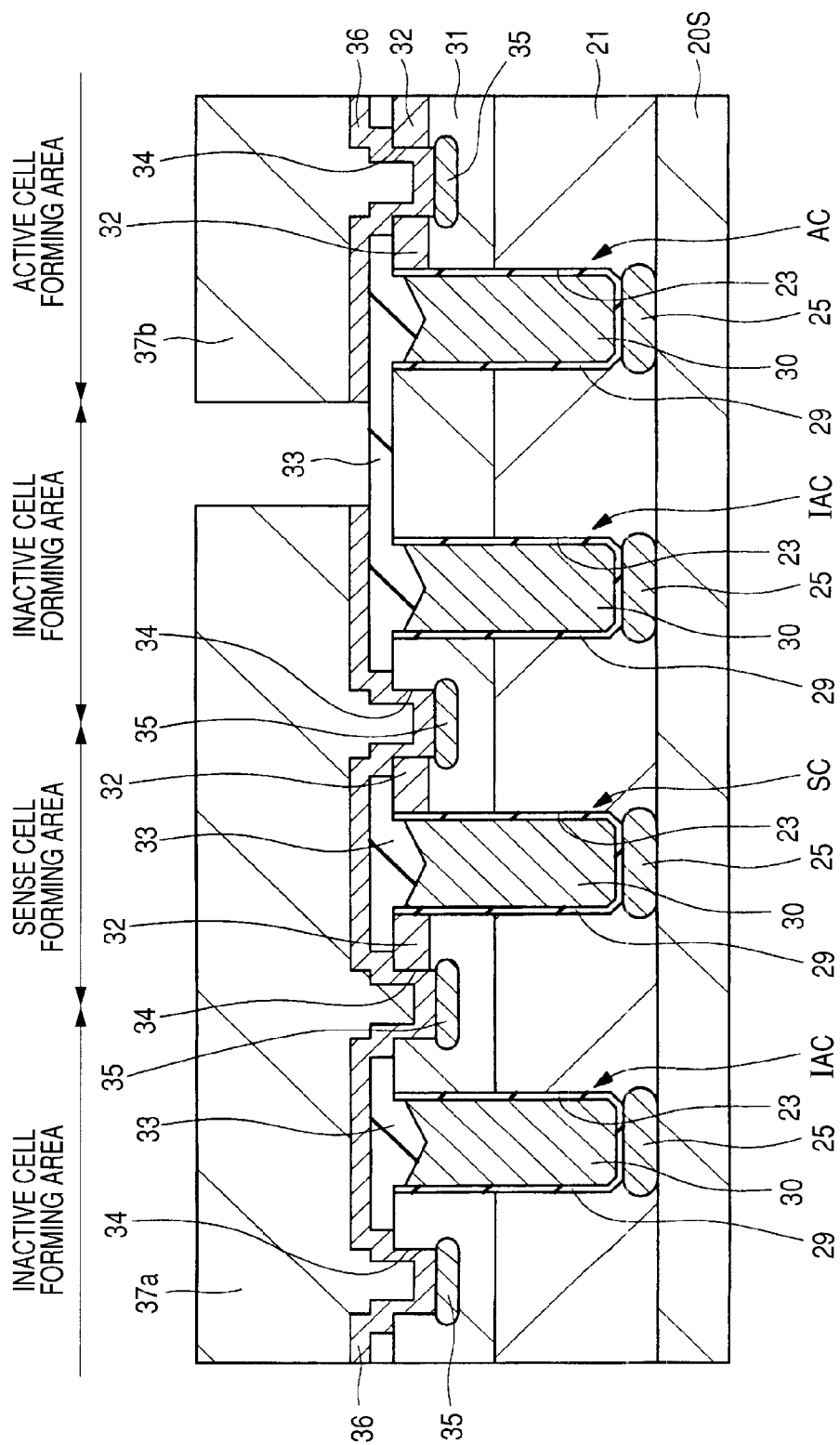
FIG. 24 is a sectional view showing one example of the trench gate type power MISFET according to the third embodiment.
Figure 25:
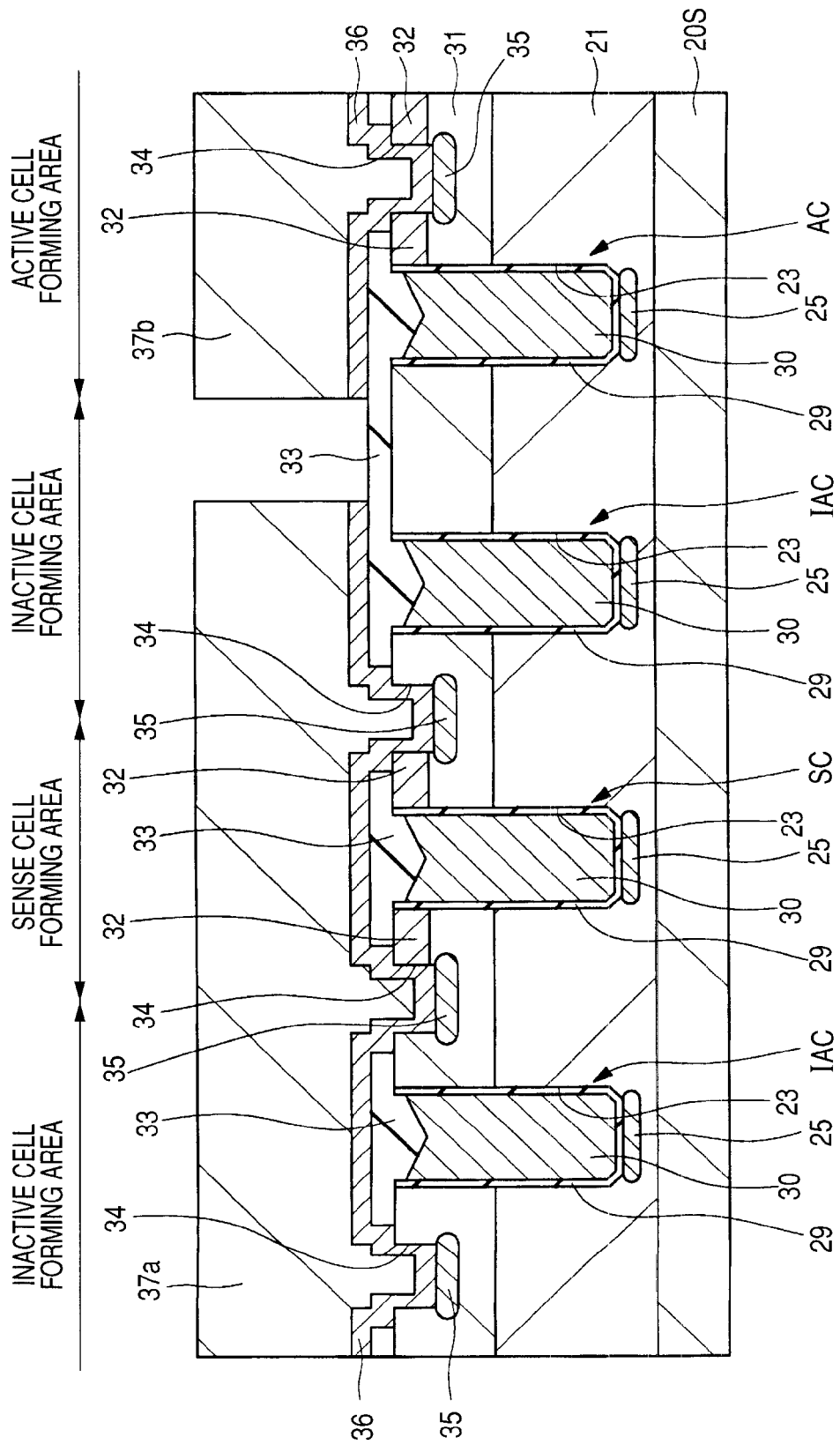
FIG. 25 is a sectional view depicting one example of the trench gate type power MISFET according to the third embodiment.

Incidentally, although FIGS. 22 and 23 respectively have explained the example in which the dummy gate electrodes 27 are formed, such a structure that the p-type semiconductor region 25 is provided between the lower portion of each trench 23 and the bottom of the n-type epitaxial layer 21 is useful in terms of a reduction in leak current even in the case of the structure in which each trench 23 is formed deep without providing the dummy gate electrode 27. FIG. 24 shows an example in which a p-type semiconductor region 25 is provided between the lower portion of each trench 23 and the bottom of the n-type epitaxial layer 21 in the trench gate type power MISFET shown in FIG. 21. Even in the present structure, a leak current path extending via the n-type epitaxial layer 21 existing in the lower portion of each trench 23 can be completely blocked by forming the p-type semiconductor region 25. From this respect, the leak current generated between the sense cell SC and the active cell AC can be further reduced in the trench gate type power MISFET shown in FIG. 24. Incidentally, the p-type semiconductor region 25 formed in the lower portion of each trench 23 may not be attained to the bottom of the n-type epitaxial layer 21 as shown in FIG. 25. Even in this case, the leak current can be reduced sufficiently.

Figure 26:
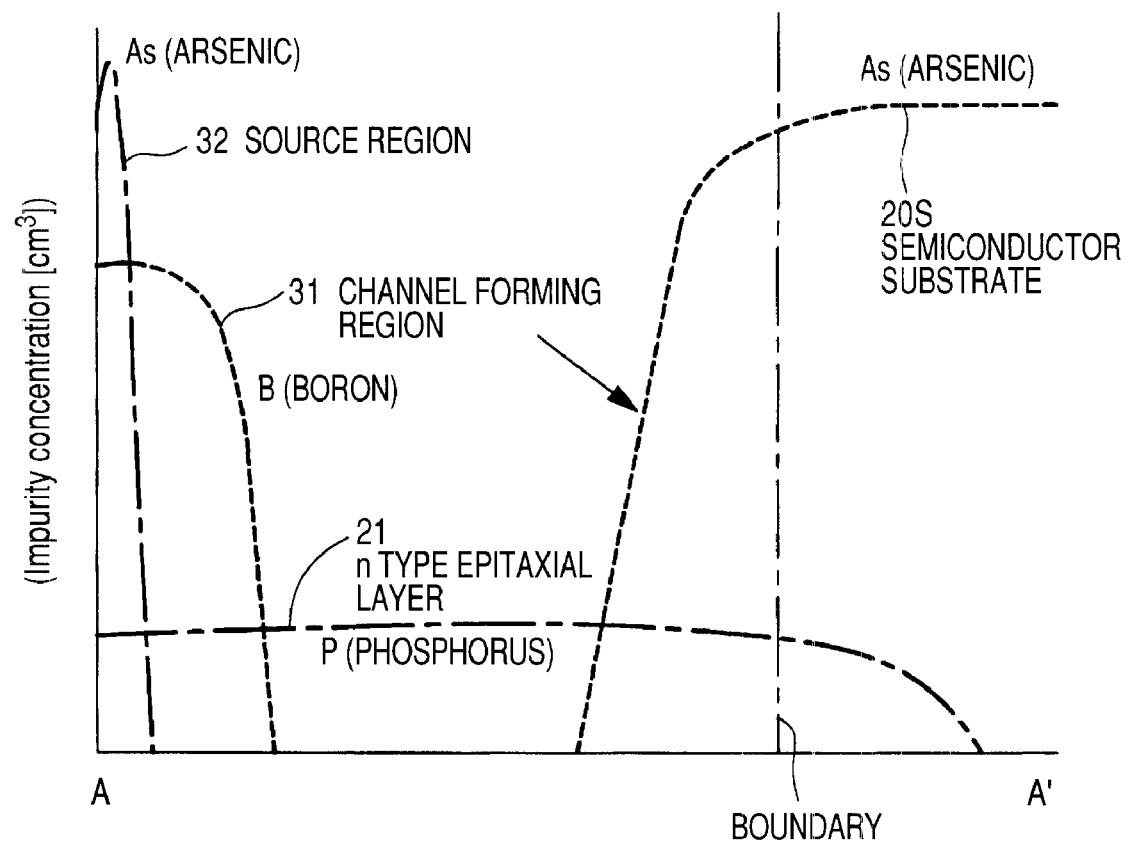
FIG. 26 is a diagram showing an impurity concentration distribution taken along line A-A' of FIG. 22.

Here, the attainment of the p-type semiconductor region 25 to the bottom of the n-type epitaxial layer 21 indicates that the p-type semiconductor region 25 is in contact with the semiconductor substrate 20S provided in the layer below the n-type epitaxial layer 21. A description will be made of what the contact of the p-type semiconductor region 25 with the semiconductor substrate 20S is going to be like, using an impurity concentration distribution (impurity profile). FIG. 26 is a graph showing an impurity concentration distribution taken along line A-A' of FIG. 22. In FIG. 26, the vertical axis indicates an impurity concentration and the horizontal axis indicates the position taken along line A-A'. FIG. 26 will be explained using an impurity concentration distribution extending from a point A to a point A'. First, the point A indicates the source region 32 and arsenic (As) has been introduced in the source region 32 in a high concentration. Subsequently, a region in which boron (B) has been introduced corresponds to the channel forming region 31. Phosphorous (P) has been introduced over a wide range from the point A to the point A'. A region in which the phosphorus (P) has been introduced corresponds to the n-type epitaxial layer 21. At the point A', a region in which arsenic (As) has been introduced in a high concentration corresponds to the semiconductor substrate 20S. There is shown a boundary between the semiconductor substrate 20S and the n-type epitaxial layer 21. At this time, the impurity concentration of arsenic gradually rises as indicated by arrow in FIG. 26 without arsenic (As) introduced into the semiconductor substrate 20S being increased suddenly at the boundary between the semiconductor substrate 20S and the n-type epitaxial layer 21. That is, the concentration of arsenic gradually increases at the boundary between the semiconductor substrate 20S and the n-type epitaxial layer 21. Accordingly, the boundary between the semiconductor substrate 20S and the n-type epitaxial layer 21 is actually unclear. Thus, although the impurity concentration of the p-type semiconductor region 25 is not shown in FIG. 26, the contact of the p-type semiconductor region 25 with the semiconductor substrate 20S can define that it is in contact with a region in which an n-type impurity has been introduced in a concentration higher than the impurity concentration of the n-type epitaxial layer 21. Described concretely, it can be said that when the p-type semiconductor region 25 contacts the rising region indicated by arrow in FIG. 26, the semiconductor substrate 20S and the p-type semiconductor region 25 are in contact with each other.

The power MISFET according to the third embodiment is configured as described above. A manufacturing method thereof will be explained below. As the manufacturing method, an example illustrative of a trench gate type power MISFET having dummy gate electrodes and for forming a p-type semiconductor region in a region or area brought into contact with a semiconductor substrate from the bottom of each trench will be explained.

Figure 27:
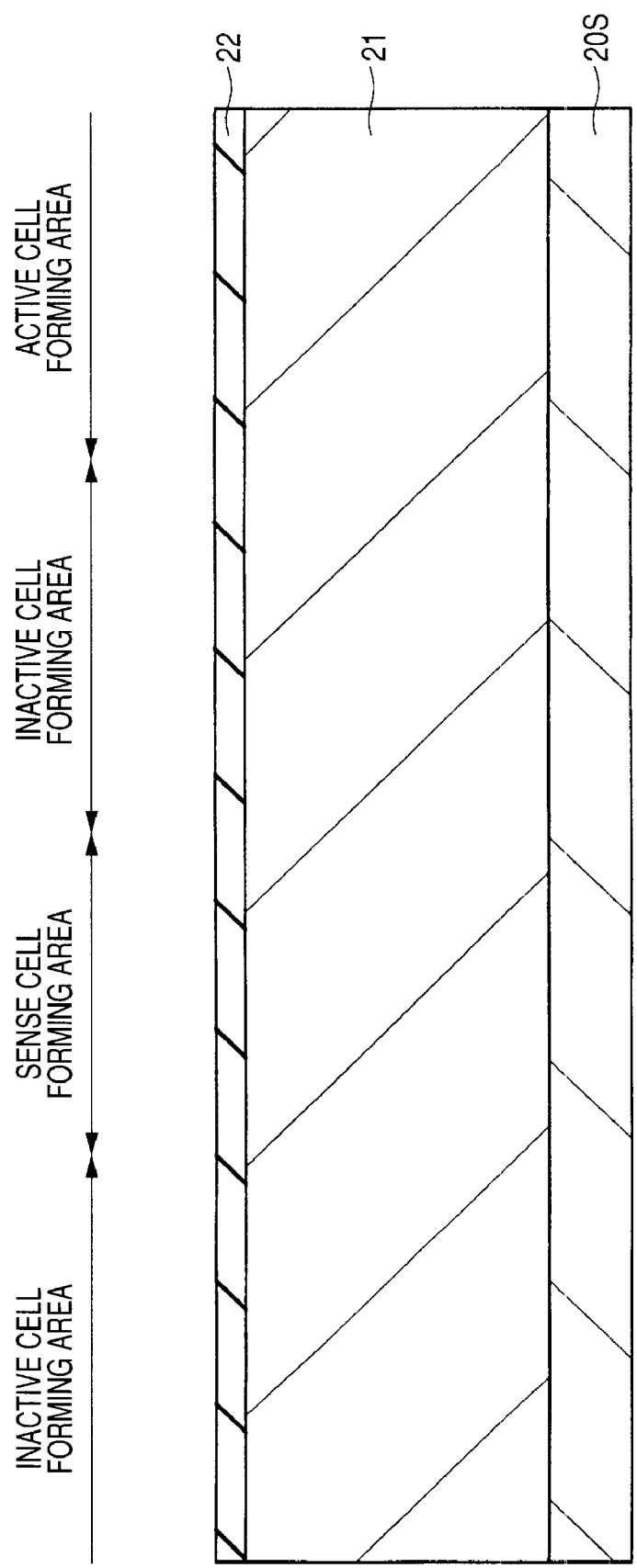
FIG. 27 is a sectional view illustrating a process for manufacturing the power MISFET according to the third embodiment.

As shown in FIG. 27, one or member in which an n-type epitaxial layer 21 comprised of a high-resistance n-type silicon monocrystal is formed over a semiconductor substrate 20S comprised of a low-resistance $n^+$-type silicon (Si) monocrystal is first prepared. Subsequently, an insulating film 22 comprised of, for example, a silicon oxide film is formed over a main surface of the semiconductor substrate 20S. Although the silicon oxide film is used here, another material like a silicon nitride film ($SiN_4$) or the like may be used.

Figure 28:
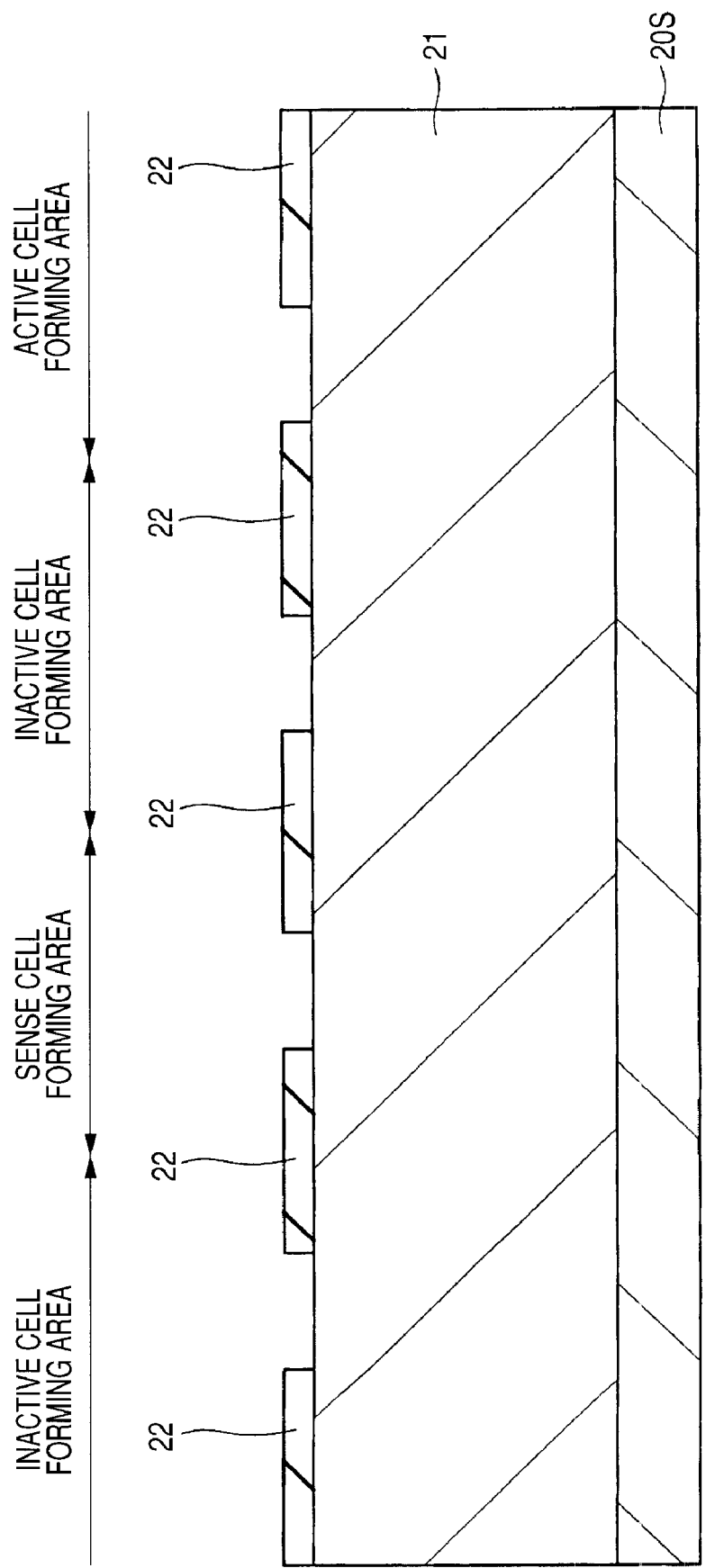
FIG. 28 is a sectional view following FIG. 27, showing the manufacturing process of the power MISFET.

Thereafter, as show in FIG. 28, a resist pattern is formed over the insulating film 22 through a series of photolithography techniques like application, exposure and development of a photoresist film (hereinafter called simply resist film). Then, the insulating film 22 is etched with the resist pattern as an etching mask. Further, the insulating film 22 for trench formation is patterned by removing the resist pattern. Each pattern of the insulating film 22 has a function as a hard mask film for trench formation.

Figure 29:
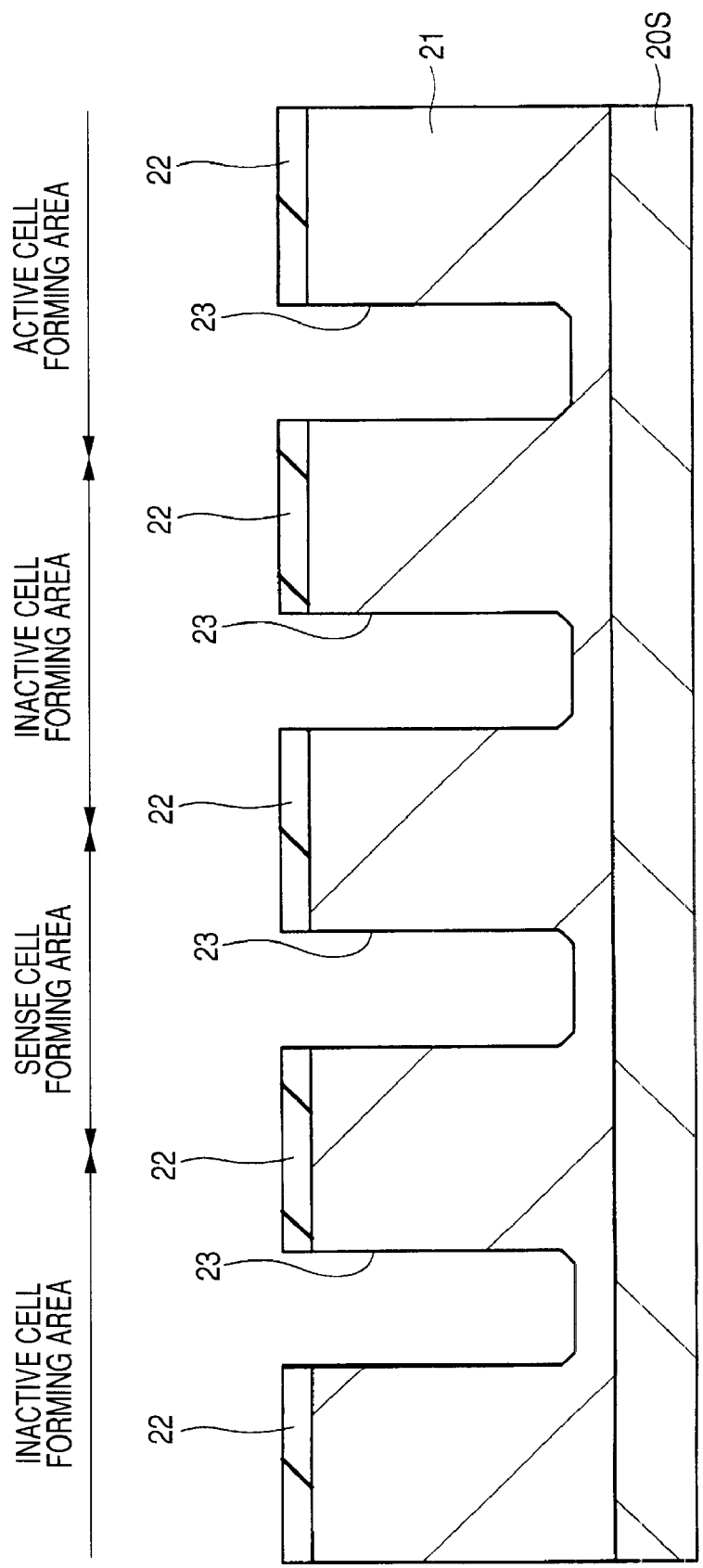
FIG. 29 is a sectional view following FIG. 28, showing the manufacturing process of the power MISFET.

Next, as shown in FIG. 29, the n-type epitaxial layer 21 is etched by anisotropic dry etching with the patterns of the insulating film 22 as etching masks to form trenches 23. The depth of each trench 23 formed at this time is deep and formed up to the deeper inside of the n-type epitaxial layer 21. Further, the trench 23 is formed so as to reach up to the neighborhood of a boundary between the semiconductor substrate 20S and the n-type epitaxial layer 21. The insulating film 22 needs a high etching selection ratio in such a manner that the insulating film 22 is not etched at a process step for forming each trench 23.

Figure 30:
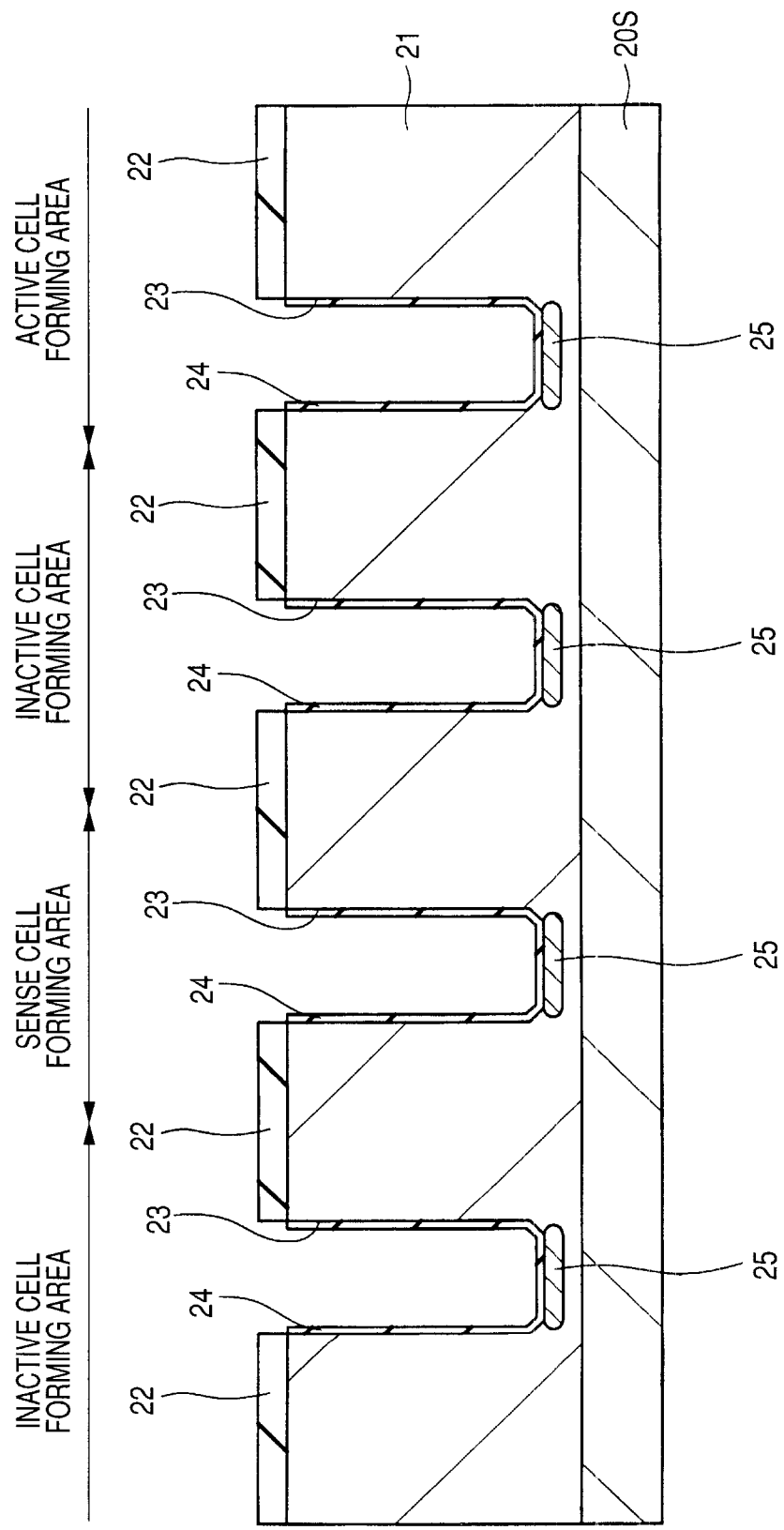
FIG. 30 is a sectional view following FIG. 29, showing the manufacturing process of the power MISFET.

Subsequently, as shown in FIG. 30, a thermal oxidation process (pre-oxidation process) is performed on the semiconductor substrate 20S thereby to form a thin insulating film 24 over bottom and side faces of each trench 23. The insulating film 24 is formed of, for example, a silicon oxide film. Thereafter, a p-type impurity such as boron is ion-implanted in the presence of the insulating film 22 used as the mask upon forming each trench 23. Since the insulating film 22 is formed considerably thick at this time, ion implantation is not performed on the n-type epitaxial layer 21 covered with the insulating film 22. On the other hand, since the bottom of each trench 23 is not formed with the insulating film 22 and is exposed, a p-type impurity is introduced in the n-type epitaxial layer 21 at a lower portion of each trench 23 so that a p-type semiconductor region 25 is formed. The insulating film 22 used as the mask upon forming each trench 23 in this way is further used as a mask at the ion implantation, thereby making it possible to form the p-type semiconductor region 25 on a self-alignment basis only at the lower portion of each trench 23. Although each p-type semiconductor region 25 is formed so as not to contact the semiconductor substrate 20S in FIG. 30, the p-type semiconductor region 25 can also be formed so as to contact the semiconductor substrate 20S by increasing injection energy upon ion implantation. The patterned insulating films 22 are eliminated.

Figure 31:
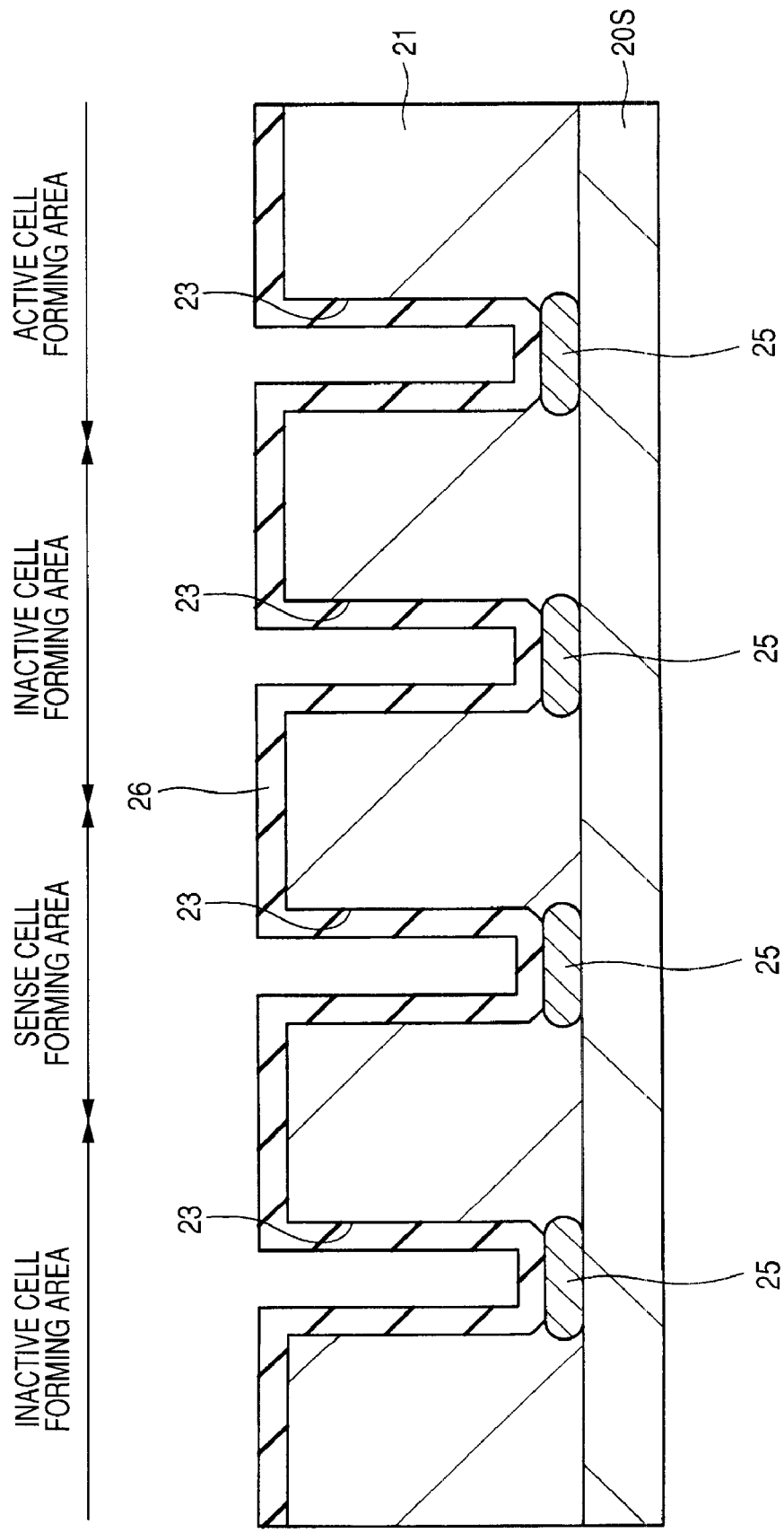
FIG. 31 is a sectional view following FIG. 30, showing the manufacturing process of the power MISFET.

Next, as shown in FIG. 31, the semiconductor substrate 20S is heat-treated to form a thick insulating film 26 over the inner wall of each trench 23 and the surface of the n-type epitaxial layer 21. The insulating film 26 is formed of, for example, a silicon oxide film. With the heat treatment at this time, the p-type semiconductor regions 25 formed at the lower portions of the trenches 23 are diffused and thereby brought into contact with the semiconductor substrate 20S.

Figure 32:
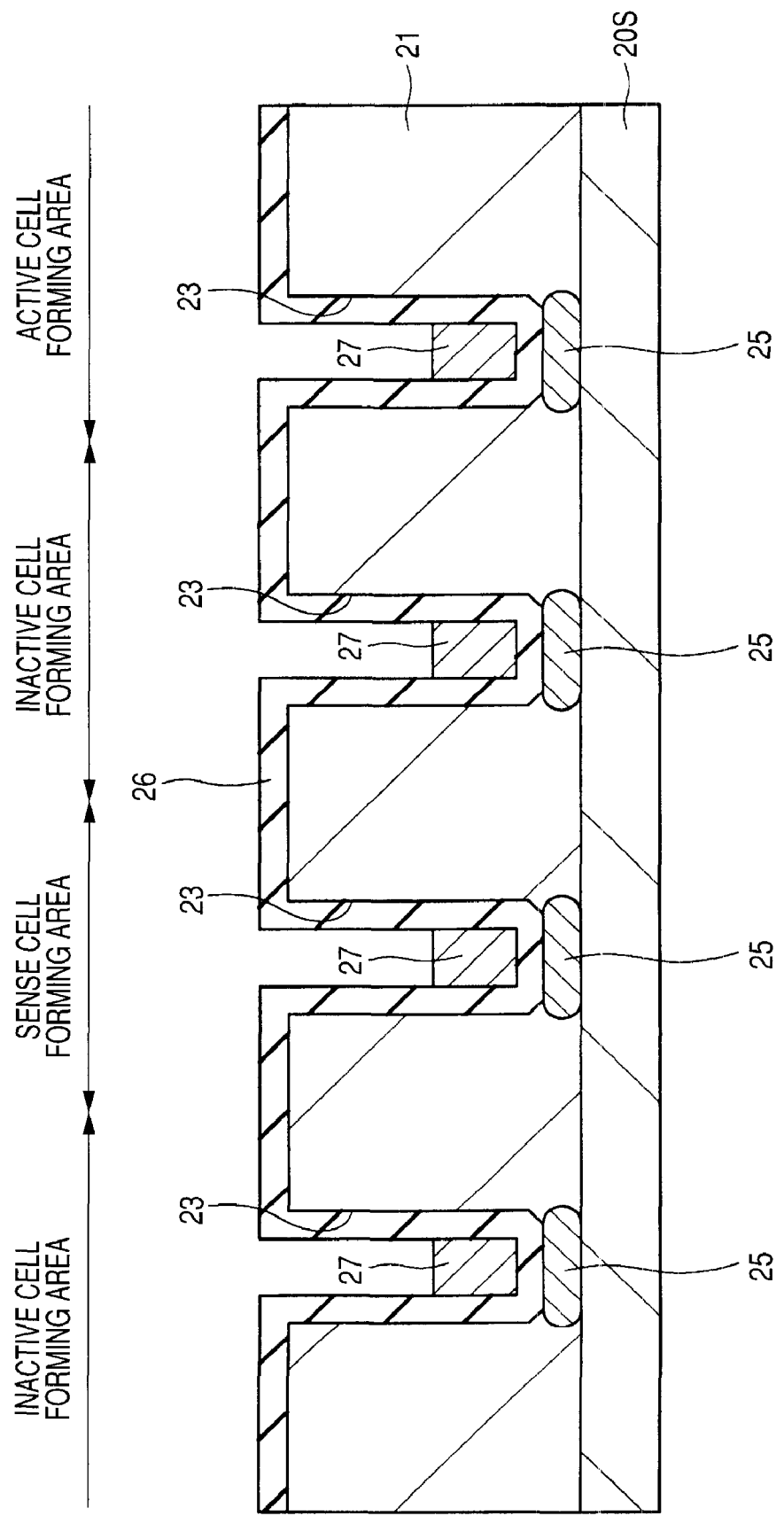
FIG. 32 is a sectional view following FIG. 31, showing the manufacturing process of the power MISFET.

Subsequently, as shown in FIG. 32, a polysilicon film is formed over the n-type epitaxial layer 21 including the inside of each trench 23. The polysilicon film is formed using, for example, a CVD (Chemical Vapor Deposition) method and formed to bury the inside of each trench 23. Then, the polysilicon film is patterned using a photolithography technique and an etching technique. Thus, the polysilicon film formed within each trench 23 is etched up to a midway depth to form a dummy gate electrode 27 within each trench 23.

Figure 33:
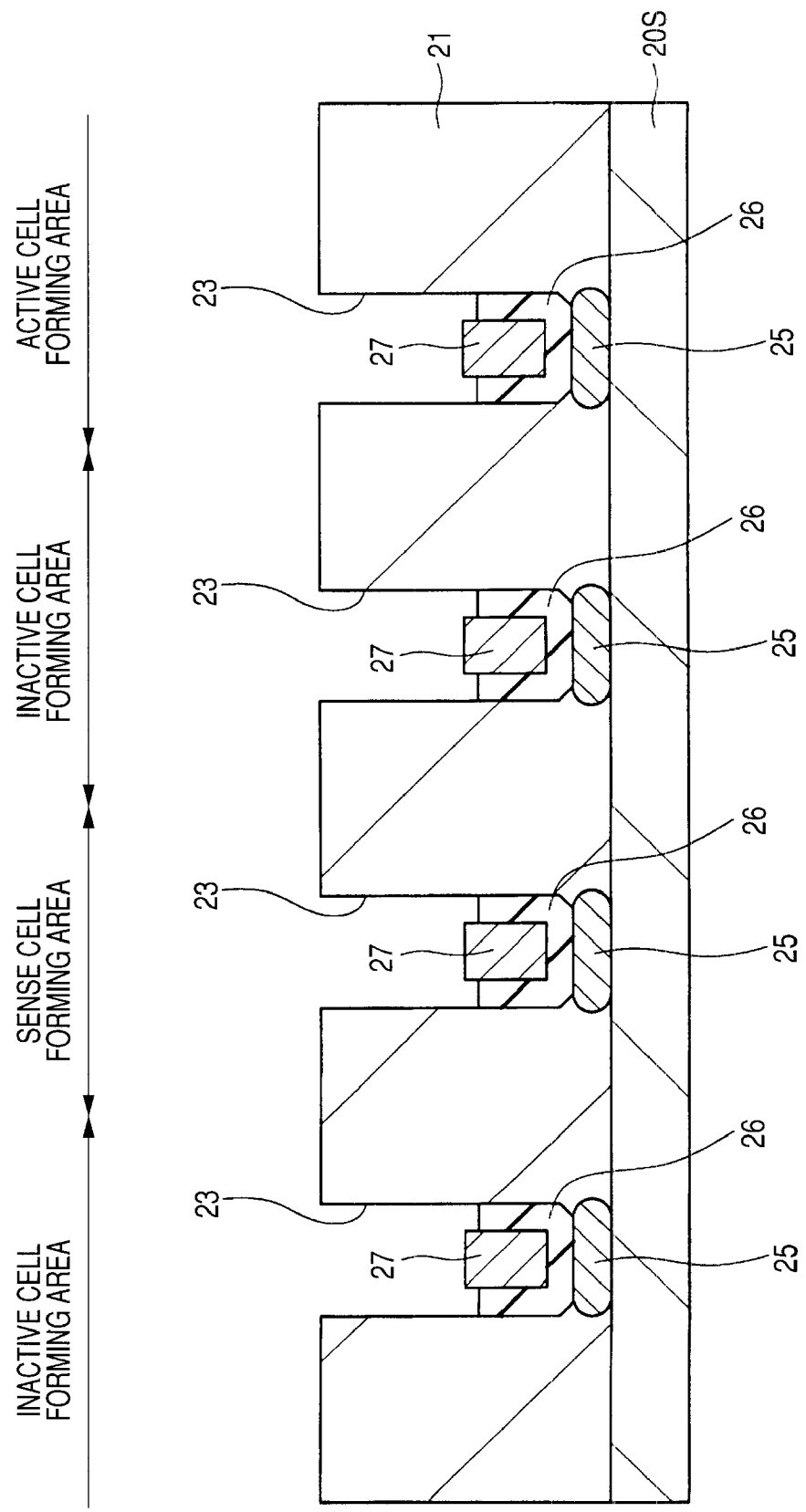
FIG. 33 is a sectional view following FIG. 32, showing the manufacturing process of the power MISFET.

Next, as shown in FIG. 33, the insulating film 26 formed over the n-type epitaxial layer 21 and inside the trenches 23 is patterned using the photolithography technique and the etching technique. With this patterning, the insulating film 26 formed over the n-type epitaxial layer 21 is eliminated and part of the insulating film 26 formed inside each trench 23 is also removed. Described specifically, the insulating film 26 is etched and removed up to the height of the same degree as the dummy gate electrode 27 formed inside each trench 23.

Figure 34:
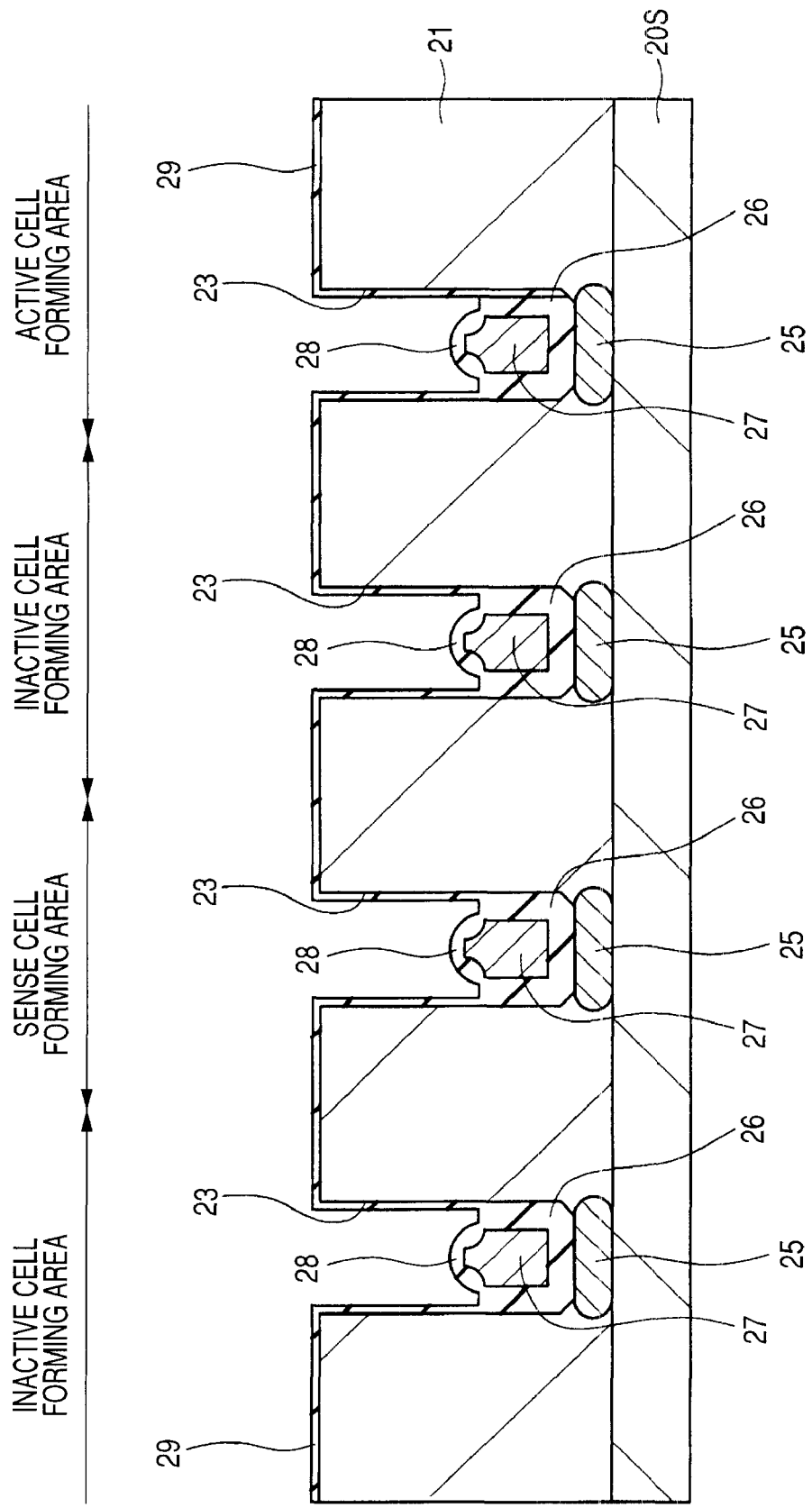
FIG. 34 is a sectional view following FIG. 33, showing the manufacturing process of the power MISFET.

Subsequently, as shown in FIG. 34, a gate insulating film 29 is formed over the main surface of the n-type epitaxial layer 21 including the side surface of each trench 23. The gate insulating film 29 is comprised of, for example, a silicon oxide film formed by the pre-oxidation process and formed so as to be thinner than the insulating film 26. This is required to enhance current drivability of the power MISFET and reduce its on resistance. Incidentally, while the gate insulating film 29 is formed over the side surface of each trench 23, an insulating film 28 thicker than the gate insulating film 29 is formed above each dummy gate electrode 27 at this process step.

Figure 35:
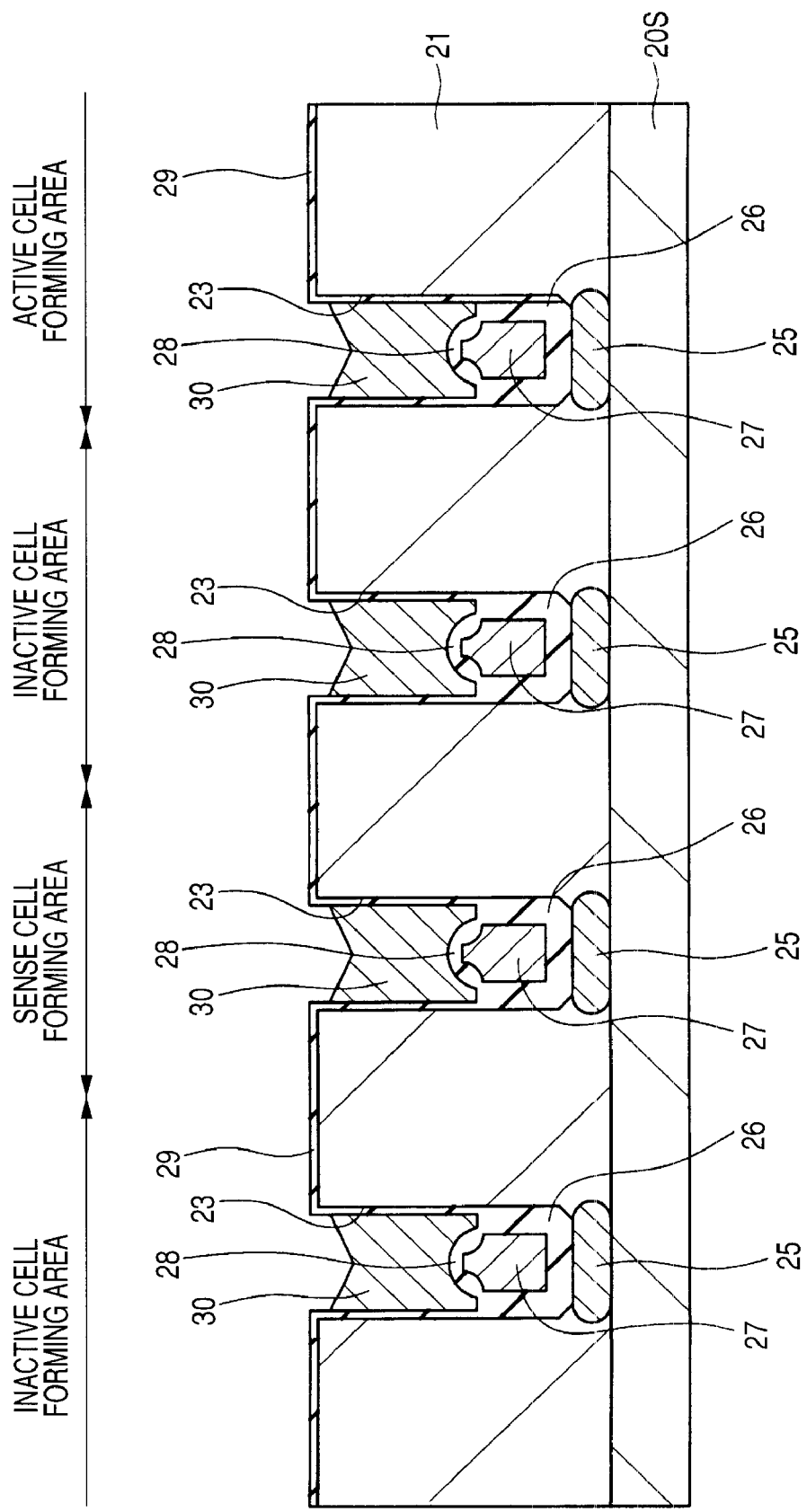
FIG. 35 is a sectional view following FIG. 34, showing the manufacturing process of the power MISFET.

Next, as shown in FIG. 35, a polysilicon film is formed over the gate insulating film 29. The polysilicon film is formed using the CVD method, for example. Thereafter, the polysilicon film is patterned using the photolithography technique and the etching technique thereby to form gate electrodes 30 within the trenches 23. Each of the gate electrodes 30 is brought to a recess structure in which its upper surface is made more recessed than the main surface of the n-type epitaxial layer 21. Thus, the dummy gate electrode 27 and the gate electrode 30 can be formed inside each trench 23.

Figure 36:
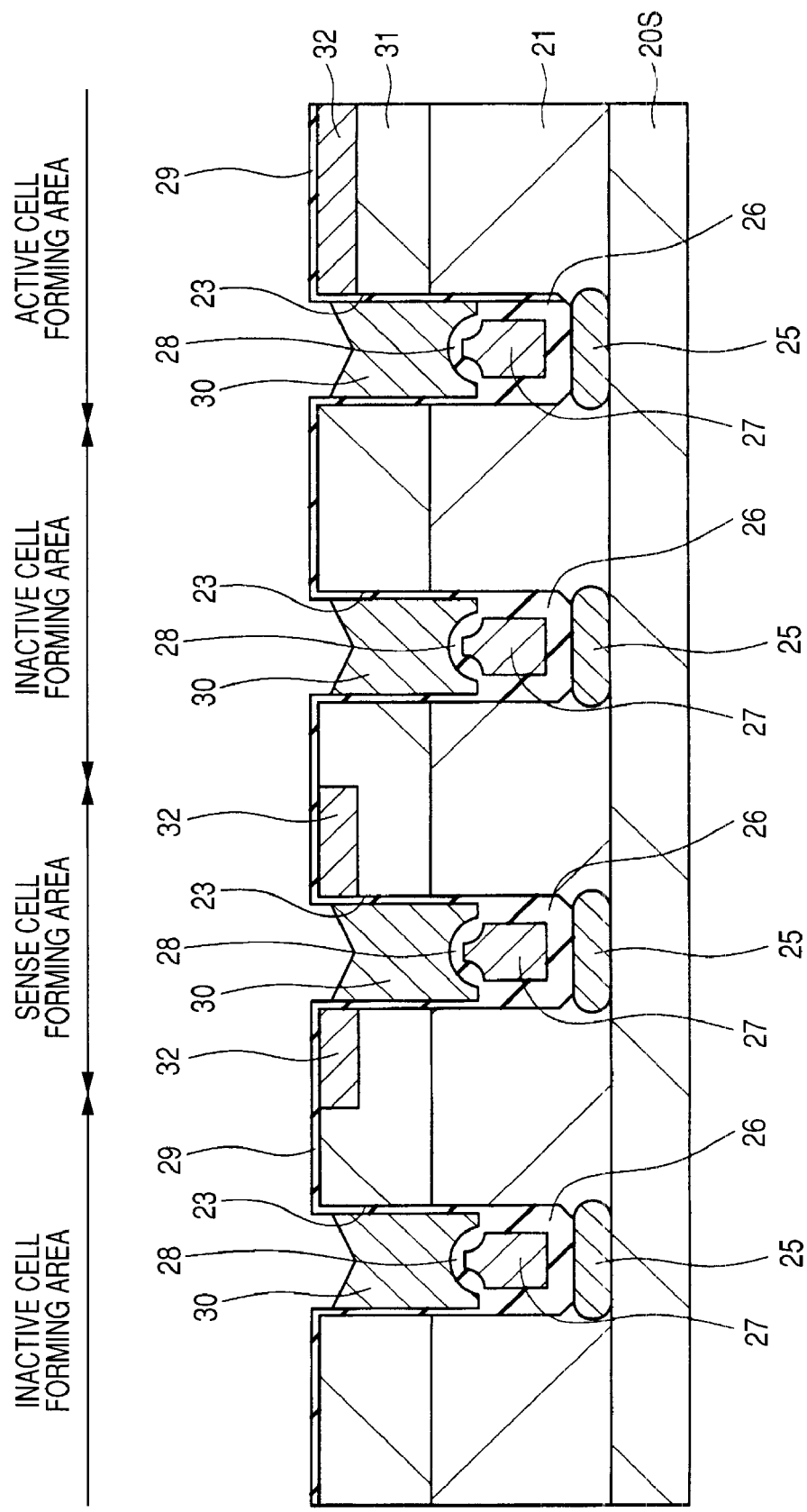
FIG. 36 is a sectional view following FIG. 35, showing the manufacturing process of the power MISFET.

Subsequently, as shown in FIG. 36, a resist pattern for exposing each channel forming region is formed over the main surface of the n-type epitaxial layer 21 by the photolithography technique. With the formed resist pattern as a mask, a p-type impurity like, for example, boron (B) or the like is introduced in the main surface of the n-type epitaxial layer 21 by an ion implantation method. Subsequently, the resist pattern is removed and thereafter a thermal diffusion process is performed on the semiconductor substrate 20S, thereby forming a channel forming region 31 comprised of a p-type semiconductor region. Afterwards, a resist pattern for exposing a source forming region is formed over the main surface (over the channel forming region 31) of the semiconductor substrate 20S by the photolithography technique. With the formed resist pattern as a mask, an n-type impurity like, for example, phosphorous or arsenic or the like is introduced into the surface region of the channel forming region 31 by the ion implantation method. Subsequently, the formed resist pattern is removed and thereafter the thermal diffusion process is effected on the semiconductor substrate 20S thereby to form source regions 32. The source regions 32 are formed only in the sense cell forming area and the active cell forming area, but not formed in the inactive cell forming areas. The source region 32 is formed in alignment with each trench 23.

Figure 37:
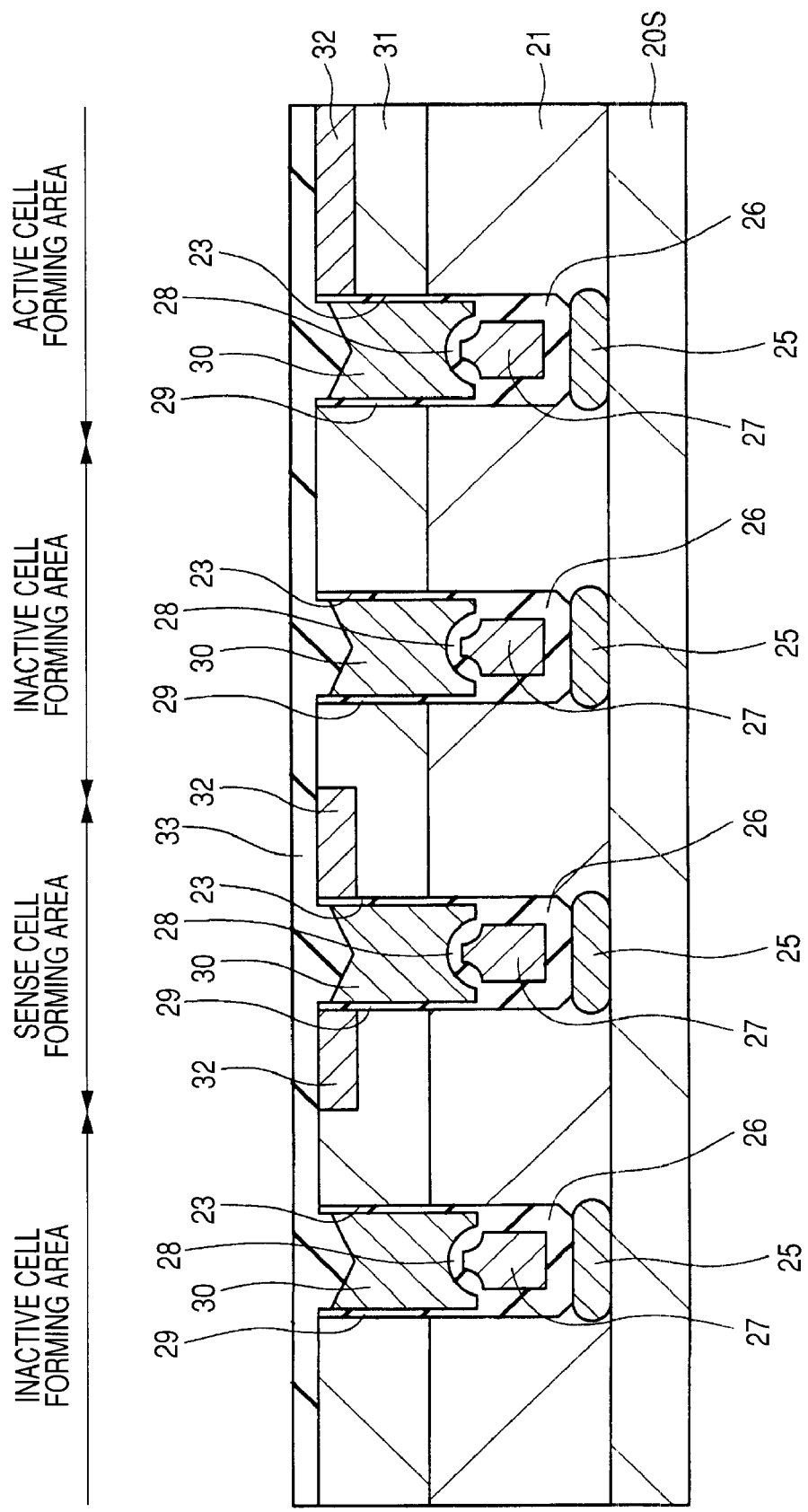
FIG. 37 is a sectional view following FIG. 36, showing the manufacturing process of the power MISFET.
Figure 38:
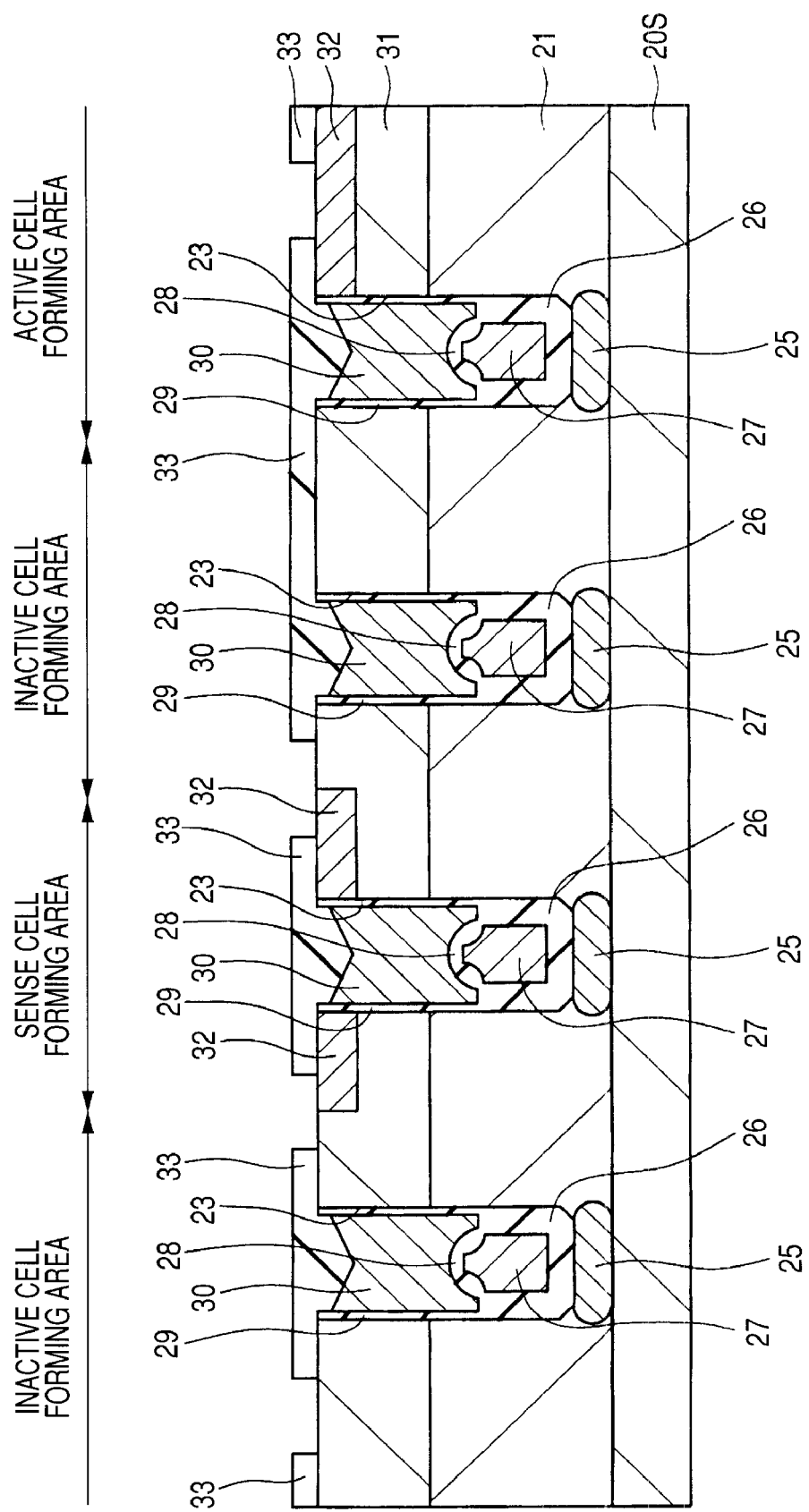
FIG. 38 is a sectional view following FIG. 37, showing the manufacturing process of the power MISFET.

Next, as shown in FIG. 37, an interlayer insulating film 33 comprised of, for example, a PSG (phosphosilicate glass) film is formed over the main surface of the semiconductor substrate 20S. Thereafter, a resist pattern for exposing each body contact forming region is formed over the interlayer insulating film 33 by the photolithography technique. Subsequently, as shown in FIG. 38, the interlayer insulating film 33 is etched with the formed resist pattern as an etching mask and thereafter removed, thereby patterning the interlayer insulating film 33. The patterning of the interlayer insulating film 33 is performed so as to expose each body contact region.

Figure 39:
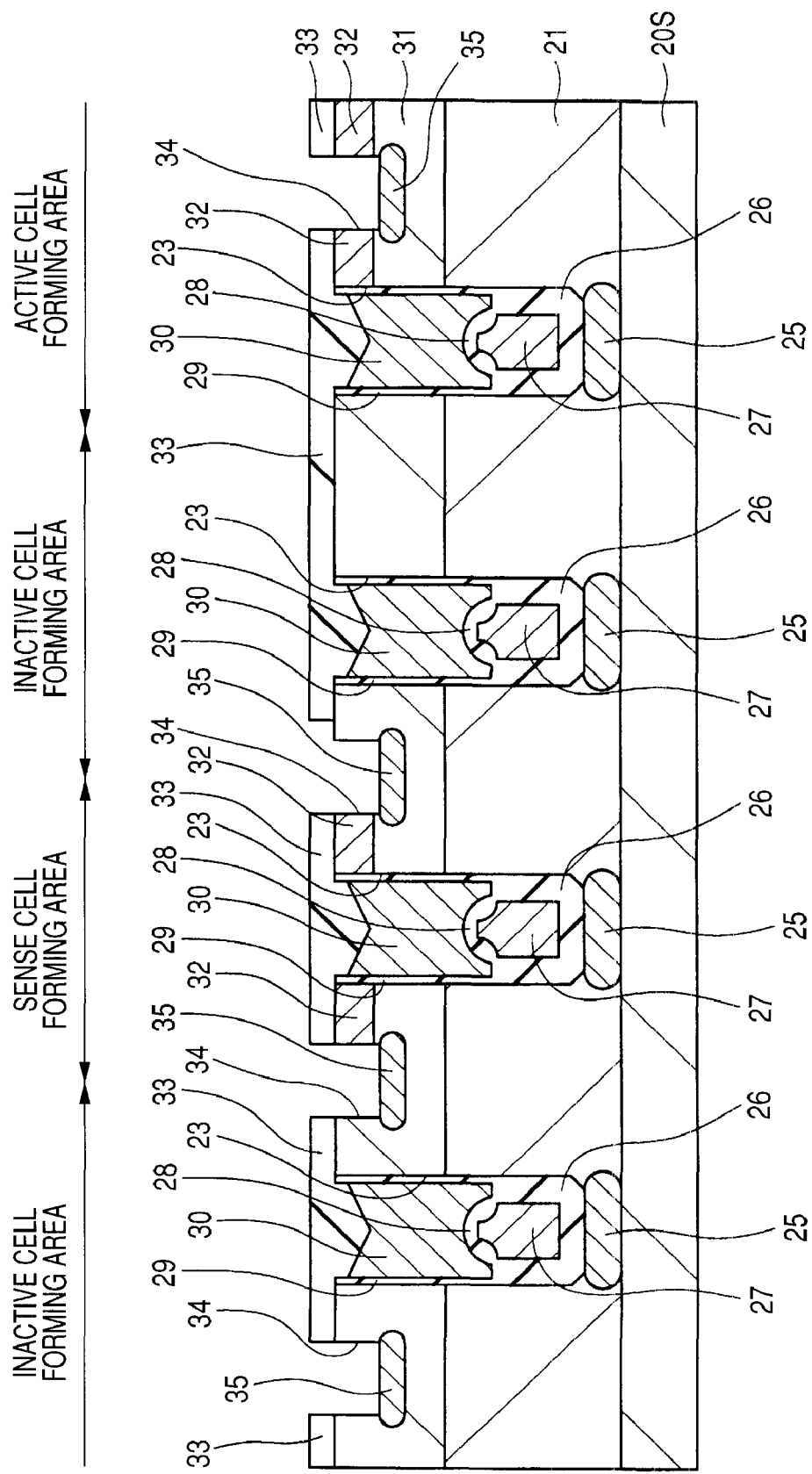
FIG. 39 is a sectional view following FIG. 38, showing the manufacturing process of the power MISFET.

Next, as shown in FIG. 39, part of the channel forming region 31 exposed with each patterned interlayer insulating film 33 as a mask is etched to form each body contact trench 34. Thereafter, a p-type impurity like, for example, boron or the like is introduced in a lower portion of the body contact trench 34 by the ion implantation method thereby to form a p-type semiconductor region 35.

Figure 40:
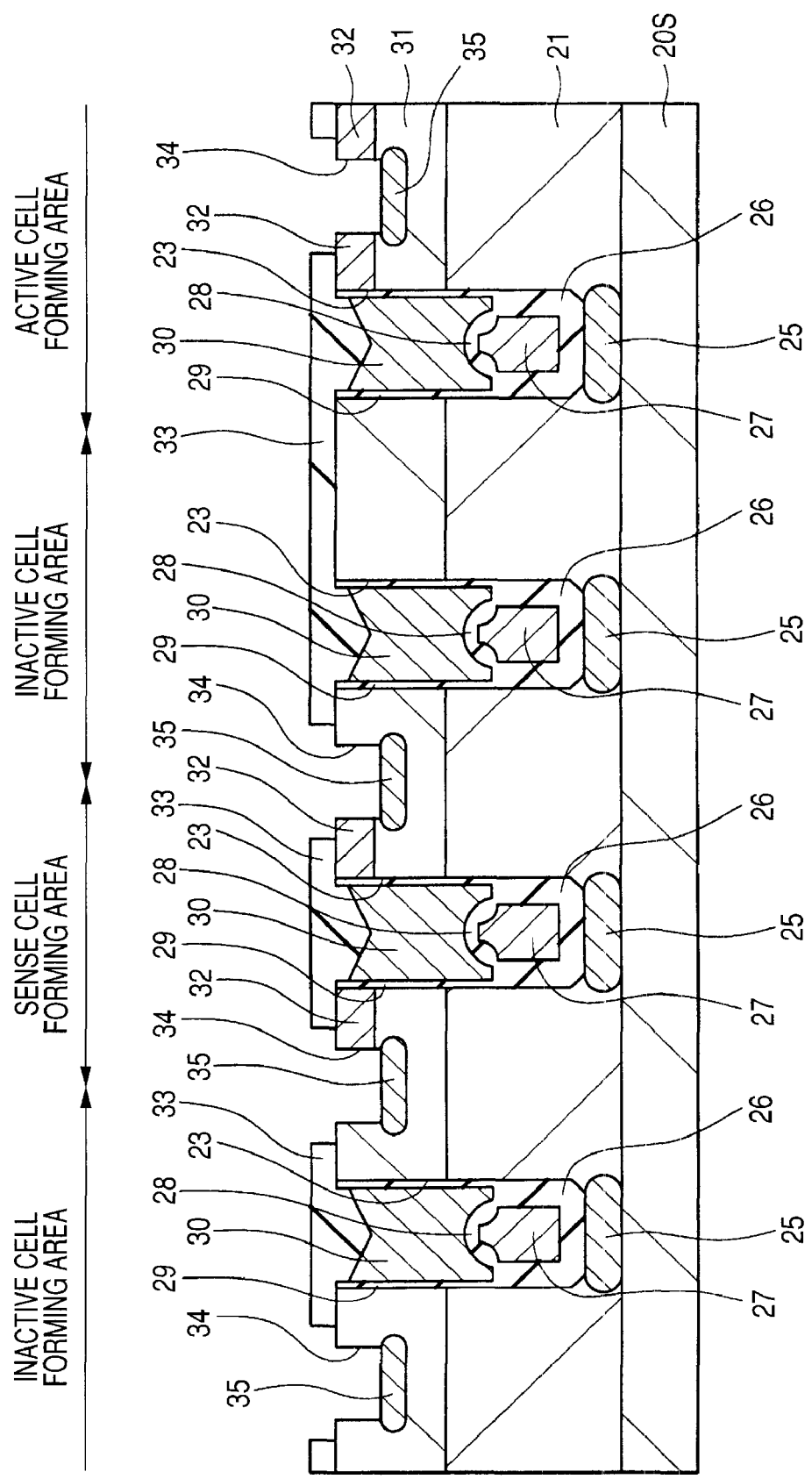
FIG. 40 is a sectional view following FIG. 39, showing the manufacturing process of the power MISFET.
Figure 41:
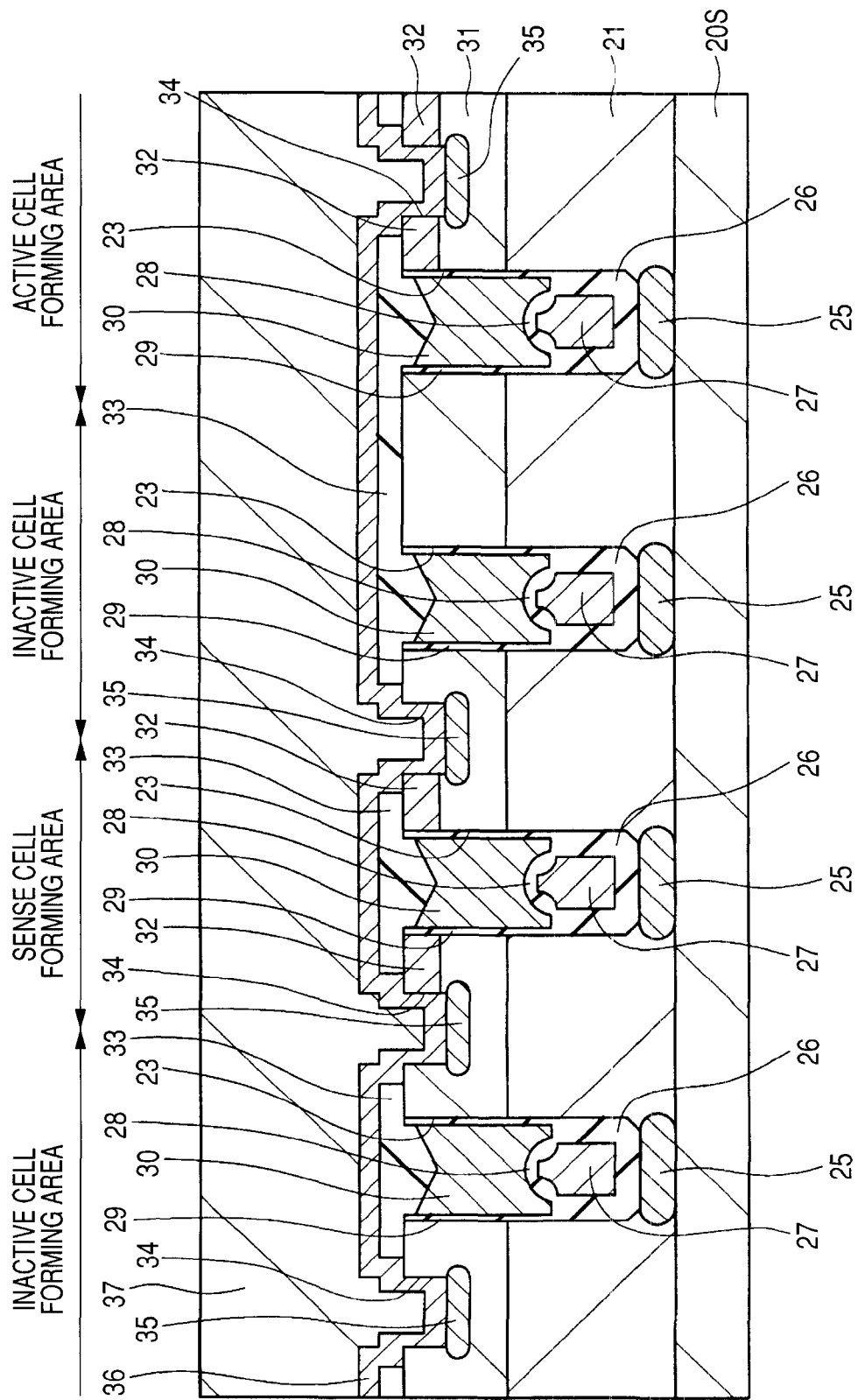
FIG. 41 is a sectional view following FIG. 40, showing the manufacturing process of the power MISFET.

Subsequently, as shown in FIG. 40, sputter pre-cleaning is performed on the semiconductor substrate 20S. At this process step, the end of the interlayer insulating film 33 is retreated. Thereafter, as shown in FIG. 41, a titanium tungsten (TiW) film 36 used as a barrier metal film is formed over the main surface of the semiconductor substrate 20S. Further, an aluminum film 37 is formed over the titanium tungsten film 36 by using, for example, a sputtering method. As shown in FIG. 22, the titanium tungsten film 36 and the aluminum film 37 are patterned by using the photolithography technique and the etching technique. The titanium tungsten film 36 and a sense wiring 37$a$, a source wiring 37$b$ and a gate wiring (not shown) or the like comprised of the aluminum film 37 are formed by this patterning.

Next, a polyimide resin film (not shown) corresponding to a surface protective film is formed over the main surface of the semiconductor substrate 20S and thereafter patterned using the photolithography technique. The patterning is performed to expose part of the sense wiring 37$a$, part of the source wiring 37$b$ and part of the gate wiring (not shown), whereby a sense pad (not shown), a source pad (not shown) and a gate pad (not shown) or the like are formed.

After the back surface of the semiconductor substrate 20S has been ground, a laminated film comprised of a titanium film (not shown), a nickel film (not shown) and a gold film (not shown) is formed over the entire back surface of the semiconductor substrate 20S using the sputtering method, for example. Thus, a drain electrode comprised of the laminated film of the titanium film, nickel film and gold film is formed. It is possible to form the power MISFET (semiconductor device) according to the third embodiment in this way.

Fourth Embodiment

The present embodiment will explain an example in which a power MISFET having a current detecting function and a control circuit for controlling the power MISFET are accommodated in one package. A product in which the power MISFET having the current detecting function and the control circuit are accommodated in one package, is called "IPD (Intelligent Power Device)". The IPD is equipped with a heating protection function and a current limitation function for overcurrent, etc. in addition to the high-efficiency power MISFET. The IPD is connected directly to a microcomputer, thereby making it possible to-protect a semiconductor device from a short-circuit in a load circuit, a slowdown in motor or an excessive rise in ambient temperature or the like. Therefore, the IPD is used in severe automotive applications. Described specifically, the IPD is used in a fuel pump motor, transmission control and the like.

Figure 42:
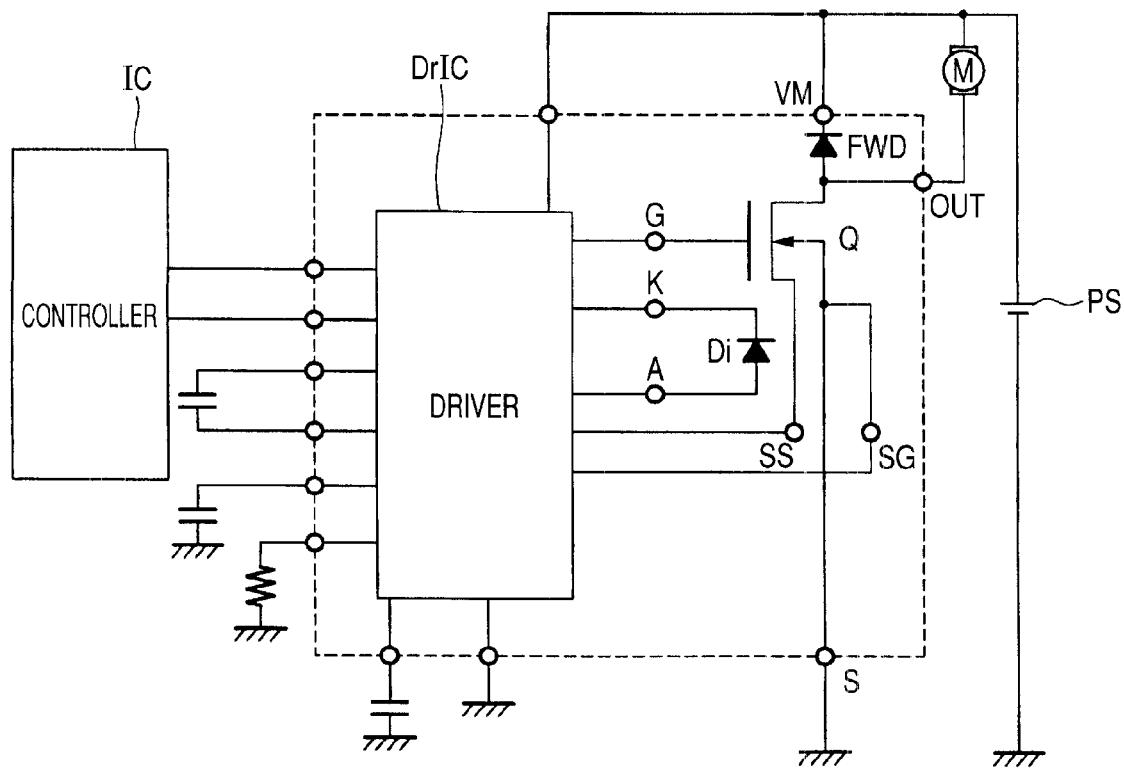
FIG. 42 is a diagram illustrating a configuration of an IPD according to a fourth embodiment.

FIG. 42 is a diagram showing a configuration of an IPD. A configuration surrounded by a broken line of FIG. 42 corresponds to the IPD. The IPD is equipped with a power MISFET coupled to a power supply PS through a motor M and a flywheel diode FWD. A power MISFETQ is illustrated in FIG. 42. In the present power MISFETQ, a main cell (active cell) and a sense cell are shown in one element. The power MISFETQ is equipped with a drain terminal coupled to the motor M and the flywheel diode FWD, and a gate terminal G coupled to a gate electrode. Further, the power MISFETQ includes a source terminal S coupled to GND. In order to realize a current detecting function, the power MISFETQ has a sense source terminal SS and a sense GND terminal SG.

The IPD includes a driver DrIC for driving the power MISFET in addition to the power MISFET having the current detecting function referred to above. The driver DrIC is provided with a plurality of input/output terminals and electrically coupled to the gate terminal G, sense source terminal SS and sense GND terminal SG. Further, the IPD is equipped with a diode Di that serves as a temperature sensor. An anode terminal A of the diode Di and a cathode terminal K thereof are coupled to the driver DrIC. The driver DrIC is electrically coupled to a controller IC.

In the IPD configured in this way, a control signal from the controller IC is inputted to the driver DrIC. When the control signal from the controller IC is inputted to the driver DrIC, the driver DrIC generates a drive signal for driving the power MISFETQ, thereby driving the motor M. For example, the driver DrIC controls the voltage applied to the gate terminal G to control ON/OFF of the power MISFETQ.

Further, the driver DrIC detects or senses an overheated state of the power MISFETQ in response to a signal from the diode Di (temperature sensor) built in the power MISFETQ. When the power MISFETQ is overheated more than necessary, the driver DrIC turns OFF the power MISFETQ. The driver DrIC inputs information sent from the diode Di (temperature sensor) through the anode terminal A and the cathode terminal K to determine the presence or absence of the overheated state.

The driver DrIC inputs a signal from the sense cell and thereby detects whether current more than necessary flows through the power MISFETQ. Described specifically, the driver DrIC controls the gate voltage of the power MISFETQ using signals inputted from the sense source terminal SS and the sense GND terminal SG thereby to avoid the flowing of current more than a constant through the power MISFETQ.

When the overheated temperature or overcurrent is detected by the above function, the driver DrIC outputs a diagnosis signal to notify a malfunction to the controller IC disposed outside. The IPD is operated in this way.

In FIG. 42, the flywheel diode FWD is contained in an equivalent circuit. When the motor M is PWM-controlled, current can be regenerated within a closed circuit.

Figure 43:
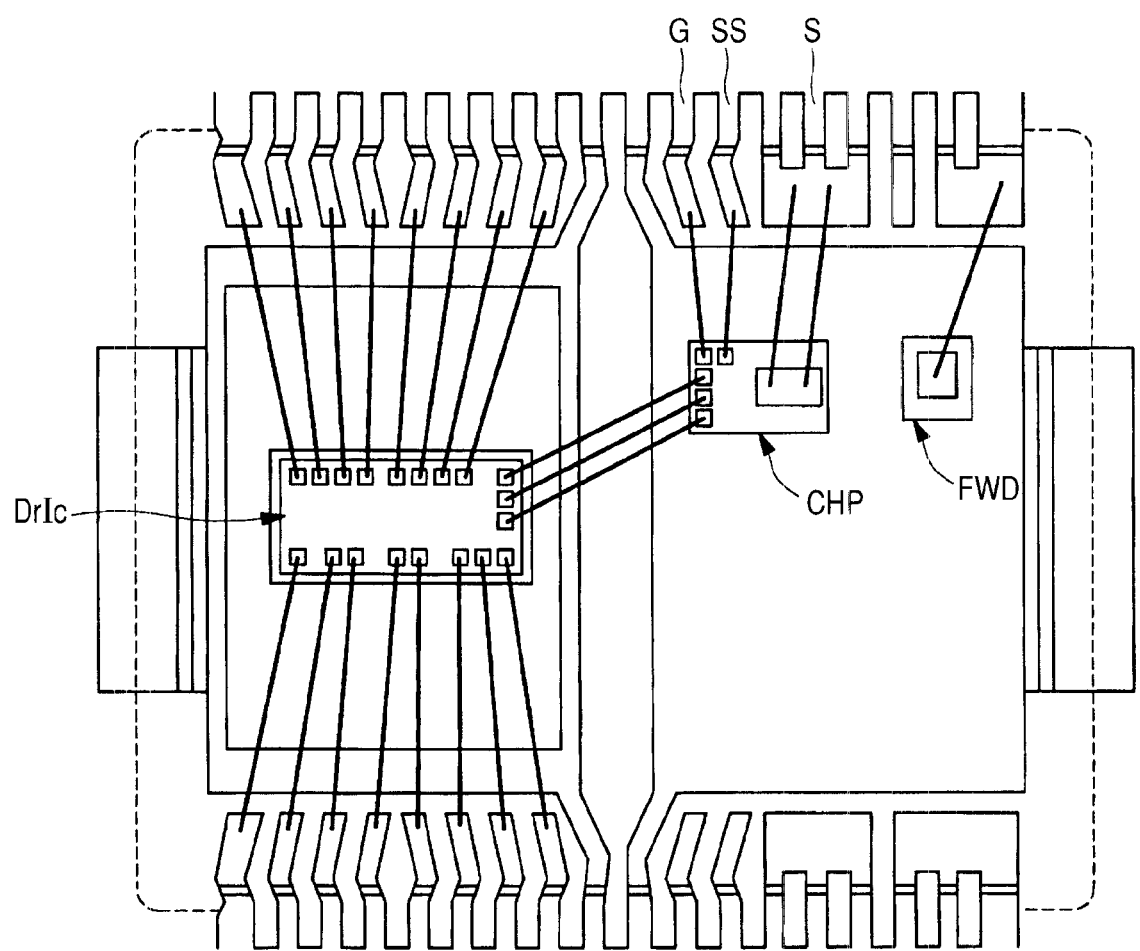
FIG. 43 is a diagram depicting a mounting configuration of the IPD according to the fourth embodiment.

A mounting configuration of the IPD will be explained subsequently. FIG. 43 is a plan view showing the mounting configuration of the IPD. As shown in FIG. 43, the IPD has a semiconductor chip CHP and a driver DrIC. For example, the power MISFET described in the first embodiment is formed in the semiconductor chip CHP. Thus, in the IPD, the semiconductor chip CHP (power MISFET) and the driver DrIC are mounted onto discrete tubs and insulated from each other. Electrical coupling between the semiconductor chip CHP (power MISFET) and the driver DrIC is performed by coupling between pads by wires. The IPD configured in this way is sealed in an area or region indicated by a broken line. Since heat generated in the semiconductor chip CHP (power MISFET) becomes hard to be transferred to the driver DrIC owing to the mounting of the semiconductor chip CHP and the driver DrIC onto the discrete tubs, the reliability of the driver DrIC can be enhanced.

As shown in FIG. 43, the IPD is equipped with the flywheel diode FWD and the constant current flowing by the voltage supplied from the power supply SP can be regenerated into the motor M in the equivalent circuit shown in FIG. 42.

Even the IPD according to the fourth embodiment can realize a high-precision current detecting function by using the power MISFET described in each of the first through third embodiments. Accordingly, a high-performance and high-reliability IPD can be provided.

While the invention made above by the present inventors has been described specifically on the basis of the preferred embodiments, the present invention is not limited to the embodiments referred to above. It is needless to say that various changes can be made thereto without the scope not departing from the gist thereof.

What is claimed is:
1. A semiconductor device comprising:
(a) an active cell which causes a load current to flow therethrough;
(b) a sense cell which detects a magnitude of the load current flowing through the active cell; and
(c) an inactive cell which separates the active cell and the sense cell from each other,
wherein each of the active cell, the sense cell and the inactive cell includes:
(d1) a first semiconductor region of a first conduction type formed over a first surface of a semiconductor substrate corresponding to the first conduction type;
(d2) a second semiconductor region of a second conduction type corresponding to a conduction type opposite to the first conduction type, said second semiconductor region being formed over the first semiconductor region;

(d3) a trench which penetrates the second semiconductor region to reach the first semiconductor region and is formed so as not to reach the semiconductor substrate;
(d4) a first insulating film formed in parts of a bottom face of the trench and a side surface thereof;
(d5) a dummy gate electrode formed inside the trench via the first insulating film;
(d6) a second insulating film formed so as to cover an upper portion of the dummy gate electrode;
(d7) a gate electrode provided over the second insulating film and formed inside the trench;
(d8) a gate insulating film formed between the side surface of the trench and the gate electrode; and
(d9) a drain region comprising the semiconductor substrate corresponding to the first conduction type, and
wherein (d10) each of the active cell and the sense cell further has a source region formed in alignment with the trench and comprising a semiconductor region of the first conduction type formed over the second semiconductor region, whereas the inactive cell does not include the source region,
wherein the dummy gate electrode and the gate electrode are electrically coupled to each other,
wherein the trench with the dummy gate electrode and the gate electrode embedded therein is formed in plural form so as to be arranged in a first direction of the semiconductor substrate, and
wherein the respective trenches are formed so as to extend in a second direction orthogonal to the first direction,
wherein first trenches of the respective trenches which extend in the second direction through an active cell forming area formed with the active cell, a sense cell forming area formed with the sense cell and an inactive cell forming area formed with the inactive cell, exist,
wherein gate electrodes embedded in the first trenches extending in the second direction through the active cell forming area, the sense cell forming area and the inactive cell forming area function as a gate electrode of the active cell in the active cell forming area, function as a gate electrode of the sense cell in the sense cell forming area, and function as a gate electrode of the inactive cell in the inactive cell forming area, respectively, and
wherein the first trenches adjacent to one another are coupled by blocking trenches extending in the first direction.

2. The semiconductor device according to claim 1, wherein the blocking trenches are formed in the inactive cell forming area and the sense cell forming area.

3. The semiconductor device according to claim 2, wherein the blocking trenches are formed so as to differ in forming position for every said first trenches adjacent to each other.

4. The semiconductor device according to claim 2, wherein the blocking trenches extend in alignment in the first direction so as to intersect with the first trenches extending in the second direction side by side in the first direction.

5. The semiconductor device according to claim 2, wherein the blocking trenches have the same structure as the first trenches.

6. A semiconductor device comprising:
(a) an active cell which causes a load current to flow therethrough;
(b) a sense cell which detects a magnitude of the load current flowing through the active cell; and
(c) an inactive cell which separates the active cell and the sense cell from each other,
wherein each of the active cell, the sense cell and the inactive cell includes:

(d1) a first semiconductor region of a first conduction type formed over a first surface of a semiconductor substrate corresponding to the first conduction type;
(d2) a second semiconductor region of a second conduction type corresponding to a conduction type opposite to the first conduction type, said second semiconductor region being formed over the first semiconductor region;
(d3) a trench which penetrates the second semiconductor region to reach the first semiconductor region and is formed so as not to reach the semiconductor substrate;
(d4) a first insulating film formed in parts of a bottom face of the trench and a side surface thereof;
(d5) a dummy gate electrode formed inside the trench via the first insulating film;
(d6) a second insulating film formed so as to cover an upper portion of the dummy gate electrode;
(d7) a gate electrode provided over the second insulating film and formed inside the trench;
(d8) a gate insulating film formed between the side surface of the trench and the gate electrode; and
(d9) a drain region comprising the semiconductor substrate corresponding to the first conduction type, and
wherein (d10) each of the active cell and the sense cell further has a source region formed in alignment with the trench and comprising a semiconductor region of the first conduction type formed over the second semiconductor region, whereas the inactive cell does not include the source region,
wherein an active cell forming area formed with the active cell, a sense cell forming area formed with the sense cell, and an inactive cell forming area formed with the inactive cell exist in the semiconductor substrate,
wherein the sense cell forming area is formed in a region in which its periphery is surrounded by the active cell forming area, and
wherein the inactive cell forming area is formed between the sense cell forming area and the active cell forming area,
further including a source pad electrically coupled to the source region of the active cell, and a sense pad electrically coupled to the source region of the sense cell,
wherein electrical coupling between the source region of the active cell and the source pad is performed by a plug coupled to the source region of the active cell from an interlayer insulating film formed over the active cell, and a first wiring coupled to the plug and formed over the interlayer insulating film, and
wherein electrical coupling between the source region of the sense cell and the sense pad is performed by a plug coupled to the source region of the sense cell from the interlayer insulating film formed over the sense cell, and a second wiring coupled to the plug and formed in a layer above the first wiring.

7. The semiconductor device according to claim 6,
wherein an active cell forming area formed with the active cell, a sense cell forming area formed with the sense cell, and an inactive cell forming area formed with the inactive cell exist in the semiconductor substrate,
wherein the sense cell forming area has a region in which at least part thereof is not surrounded by the active cell forming area, and
wherein the inactive cell forming area is formed between the sense cell forming area and the active cell forming area.

8. The semiconductor device according to claim 7, further including a source pad electrically coupled to the source region of the active cell, and a sense pad electrically coupled to the source region of the sense cell,
- wherein electrical coupling between the source region of the active cell and the source pad is performed by a plug coupled to the source region of the active cell from an interlayer insulating film formed over the active cell, and a first wiring coupled to the plug and formed over the interlayer insulating film,
- wherein electrical coupling between the source region of the sense cell and the sense pad is performed by a plug coupled to the source region of the sense cell from the interlayer insulating film formed over the sense cell, and a third wiring of the same layer as the first wiring coupled to the plug, and
- wherein the third wiring is drawn from a region unsurrounded by the active cell forming area and coupled to the sense pad.

9. A semiconductor device comprising:
(a) an active cell which causes a load current to flow therethrough;
(b) a sense cell which detects a magnitude of the load current flowing through the active cell; and
(c) an inactive cell which separates the active cell and the sense cell from each other,
wherein each of the active cell, the sense cell and the inactive cell includes:
(d1) a first semiconductor region of a first conduction type formed over a first surface of a semiconductor substrate corresponding to the first conduction type;
(d2) a second semiconductor region of a second conduction type corresponding to a conduction type opposite to the first conduction type, said second semiconductor region being formed over the first semiconductor region;
(d3) a trench which penetrates the second semiconductor region to reach the first semiconductor region and is formed so as not to reach the semiconductor substrate;
(d4) a first insulating film formed in parts of a bottom face of the trench and a side surface thereof;
(d5) a dummy gate electrode formed inside the trench via the first insulating film;
(d6) a second insulating film formed so as to cover an upper portion of the dummy gate electrode;
(d7) a gate electrode provided over the second insulating film and formed inside the trench;
(d8) a gate insulating film formed between the side surface of the trench and the gate electrode; and
(d9) a drain region comprising the semiconductor substrate corresponding to the first conduction type, and
wherein (d10) each of the active cell and the sense cell further has a source region formed in alignment with the trench and comprising a semiconductor region of the first conduction type formed over the second semiconductor region, whereas the inactive cell does not include the source region,
wherein an electric field relaxation layer is formed between the active cell forming area formed with the active cell and the inactive cell forming area formed with the inactive cell.

10. The semiconductor device according to claim 9, wherein the electric field relaxation layer is formed of a fourth semiconductor region of the second conduction type.

* * * * *